United States Patent [19]

Coppola et al.

[11] Patent Number: 4,509,128

[45] Date of Patent: Apr. 2, 1985

[54] SOLID-STATE ELECTRICAL-POWER DEMAND REGISTER AND METHOD

[75] Inventors: Richard G. Coppola, Marietta; George H. Stephens, Tucker, both of Ga.

[73] Assignee: Sangamo Weston, Inc., Norcross, Ga.

[21] Appl. No.: 369,058

[22] Filed: Apr. 16, 1982

[51] Int. Cl.³ .................. G06F 11/10; G06F 15/46
[52] U.S. Cl. ............................ 364/483; 371/39; 364/464
[58] Field of Search ............... 364/483, 464; 324/103 R, 116; 377/20, 19, 26; 371/39, 40

[56] References Cited

U.S. PATENT DOCUMENTS

| 4,047,024 | 9/1977 | Henderson | 520/231 |
|---|---|---|---|
| 4,050,020 | 9/1977 | Germer et al. | 324/116 |
| 4,077,061 | 2/1978 | Johnston et al. | 364/483 |
| 4,080,568 | 3/1978 | Funk | 324/142 |
| 4,081,746 | 3/1978 | Snyder et al. | 324/116 |
| 4,106,095 | 8/1978 | Yarbrough | 364/464 |
| 4,119,948 | 10/1978 | Ward et al. | 340/151 |
| 4,120,031 | 10/1978 | Kincheloe et al. | 364/464 |
| 4,124,839 | 11/1978 | Cohen | 340/151 |
| 4,156,867 | 5/1979 | Bench et al. | 371/39 |
| 4,162,530 | 7/1979 | Kusui et al. | 364/464 |
| 4,166,975 | 9/1979 | Germer et al. | 324/116 |
| 4,179,654 | 12/1979 | Germer | 324/116 |
| 4,197,582 | 4/1980 | Johnston et al. | 364/483 |
| 4,199,717 | 4/1980 | Germer et al. | 324/116 |
| 4,218,737 | 8/1980 | Buscher et al. | 364/493 |
| 4,224,671 | 9/1980 | Sugiyama et al. | 364/483 |
| 4,229,795 | 10/1980 | Vieweg et al. | 364/483 |
| 4,233,590 | 11/1980 | Gilkeson et al. | 340/870.40 |
| 4,250,552 | 2/1981 | Elms | 364/483 |
| 4,253,151 | 2/1981 | Bouve | 364/483 |
| 4,261,037 | 4/1981 | Hicks | 364/464 |
| 4,276,647 | 6/1981 | Thacker | 371/40 |
| 4,282,576 | 8/1981 | Elms et al. | 364/483 |
| 4,283,772 | 8/1981 | Johnston | 364/900 |
| 4,291,375 | 9/1981 | Wolf | 364/200 |
| 4,291,376 | 9/1981 | McCahill | 364/200 |
| 4,298,839 | 11/1981 | Johnston | 324/157 |
| 4,301,508 | 11/1981 | Anderson et al. | 364/483 |
| 4,317,175 | 2/1982 | Sterling et al. | 364/464 |
| 4,336,612 | 6/1982 | Inoue et al. | 371/39 |
| 4,393,502 | 7/1983 | Tanaka et al. | 371/40 |

FOREIGN PATENT DOCUMENTS 2613112  9/1981  Fed. Rep. of Germany .

OTHER PUBLICATIONS

Product Presentation, Duncan Electric Company, EEI-AEIC, Galleria Plaza, Houston, Texas, Sep. 21-23, 1981.

Primary Examiner—Edward J. Wise
Attorney, Agent, or Firm—Dale Gaudier

[57] ABSTRACT

A solid-state demand register is described for determining the maximum electrical-power demand made on an electric utility by a load. The register, which employs a microprocessor, provides noncumulative, cumulative, and continuous-cumulative electrical-power demand measurement capabilities. The microprocessor operating under a control program stored in a read-only memory, employs computing constants and generates computed results. A nonvolatile read/write memory, which stores the computing constants and computing results, is of the type that retains stored data even when deenergized. These constants and results can be visually displayed by an optoelectronic display. Error detection and correction of data are performed by the programmed microprocessor by means of an eight-bit Hamming code. The register further includes pulse generators for generating pulses indicative of the electrical-power demand and the end of a demand-monitoring time interval, and includes a controller for inhibiting the optoelectronic display when the ambient light adjacent the controller falls below a preselected threshold level.

69 Claims, 15 Drawing Figures

| FIG. 4A |
| FIG. 4B |

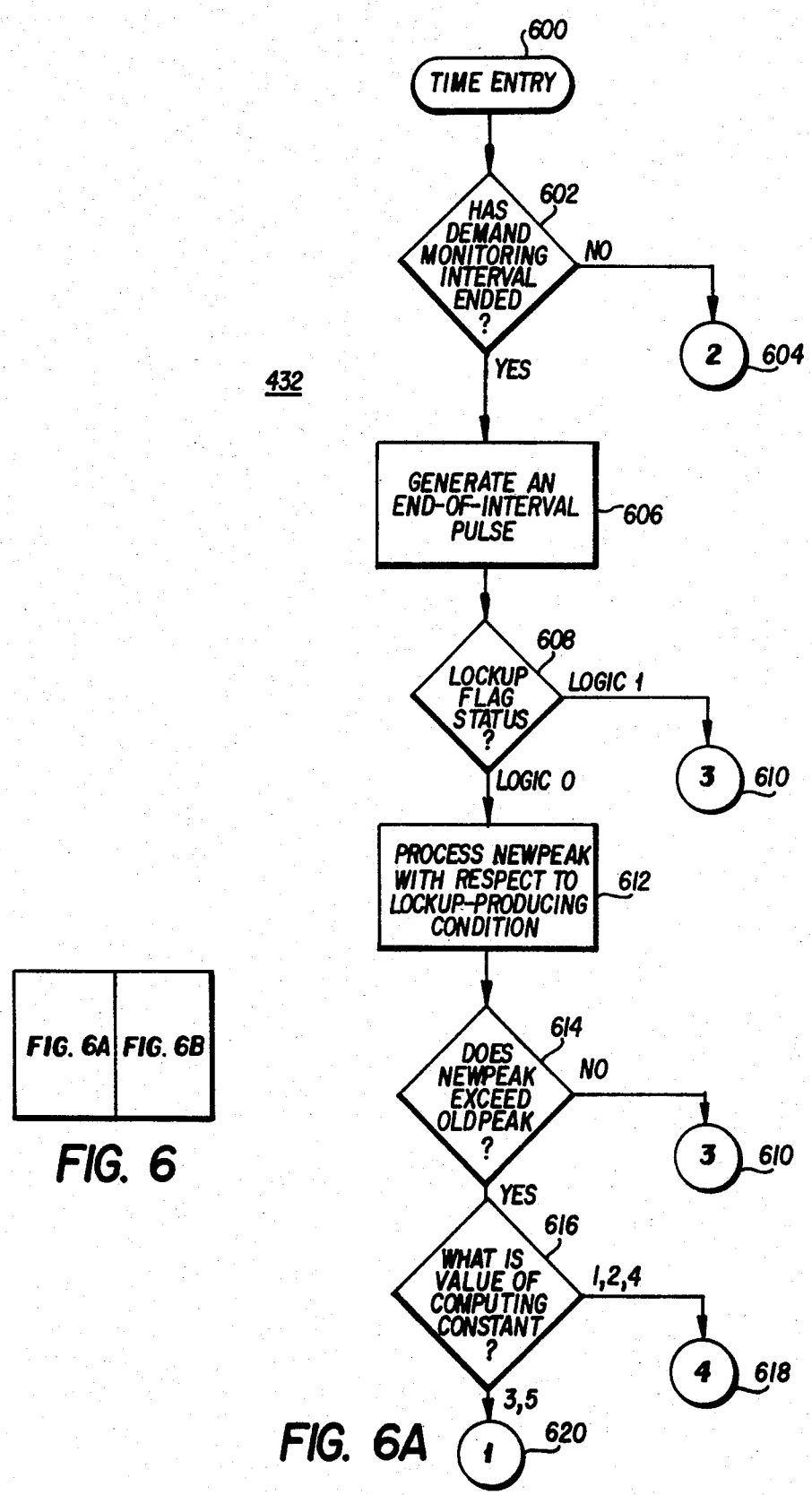

SOLID-STATE ELECTRICAL-POWER DEMAND REGISTER AND METHOD

BACKGROUND OF THE INVENTION

1. Field of the Invention

The present invention relates generally to electrical-power demand registers and methods. More particularly, the present invention is directed to a solid-state electrical-power demand register and method employing a nonvolatile read/write memory which retains stored data even when deenergized, and also employing error detection and correction of data.

2. Description of the Related Art

Customer electrical loads draw electrical power from an electrical utility. For the utility to be capable of supplying electrical power to all its customers under worst-case conditions, the utility must be able to predict the peak power demand of each customer and have sufficient power-generating capacity to meet the worst-case peak demand. Failure to be able to meet the worst-case peak demand results in brownouts or even blackouts, which subject the utility and its customers to adverse consequences.

The larger the worst-case peak demand, the greater the peak power-generating capacity of the utility must be. If customers can reduce peak demands, the utility can concomitantly reduce reserve power-generating capacity. The reduced reserve capacity will ultimately be reflected in lower bills to the customers.

To foster customer reduction of peak demands, two types of metering arrangements or registers have developed to provide the customer and the utility with needed electrical power consumption information: the demand meter or register and the time-of-day energy consumption meter or register. Briefly, a demand register indicates the peak power demand by a customer within a preselected time measurement interval, irrespective of when the demand occurs. A time-of-day, energy-consumption register, on the other hand, measures electrical-power consumption during preselected periods which are characterized according to time of day, type of day (for example, weekday, weekend, or holiday), and season (for example, summer or winter).

Turning to the demand register, there are at least three types of measurement data that can be provided: noncumulative; cumulative; and, continuous-cumulative. A noncumulative or block-interval demand register measures, stores and displays the largest electrical-power demand incurred during a measurement interval within a billing period. At the end of each billing period, the stored value is reset to zero by the meter reader or billing apparatus.

A cumulative demand register measures and stores the largest electrical-power demand incurred during a current billing period (that is, the same value measured by a noncumulative demand register). It also measures, stores and displays the running sum of the largest demands incurred during each previous billing period. At the end of the billing period, the stored value corresponding to the largest electrical-power demand for the billing period just ended is added to the running sum and is then reset to zero.

During a current billing period, continuous-cumulative demand register measures and stores as a first stored value each successive electrical-power demand which is larger than a previously largest demand that was incurred since the beginning of this billing period. Each time a higher peak is detected, the first stored value is updated with the even larger demand value, and a second stored value is increased accordingly. This second stored value corresponds to a running sum of the largest electrical-power demands incurred during previous billing periods and the largest electrical-power demand incurred up to the present time of the current billing period. Only this second stored value is normally displayed. At the end of each billing period, the first stored value is reset to zero.

Until recently, demand registers have been mechanical. Such apparatus have a register coupled to and driven by eddy-current induction motors of the type found in conventional electrical-energy usage (kilowatt-hour) meters commonly employed by utilities for billing purposes. In fact, it is not uncommon for a mechanical electrical-energy usage register (either of the time-of-day type or otherwise) also to include a mechanical demand register.

Mechanical demand registers exhibit several disadvantages. The mechanical demand register places an increased mechanical load on the eddy-current induction motor. In addition, because demand is typically measured over a fixed time interval (typically from ten to thirty minutes) means must be included to actuate the mechanical demand register for the demand-monitoring interval. This means complicates the design of the overall meter.

With the advent of solid-state electronics, electronic demand registers have been developed. These circuits are often small enough to fit inside the housing of a standard kilowatt-hour meter. Such solid-state demand registers calculate peak power demand on the basis of signals which define a demand-monitoring interval and which describe the consumption of electrical energy during the demand-monitoring intervals. Microprocessors have been employed in some solid-state demand registers.

State-of-the-art time-of-day registers also employ microprocessors. Unlike demand registers, which do not require their timing pulses to be generated in accordance with the actual time of day, a time-of-day energy-consumption register must include a backup battery so that its clock will not be turned off when electrical power to be register is cut off due to a power outage, customer tampering or the like.

In microprocessor-based, time-of-day and demand registers of recent design, random-access memories (RAMs) have been employed. A backup battery is required to energize the random access memory during a voltage dip on or failure of the alternating-current to prevent loss of data stored in such a memory.

The use of such a backup battery results in several technical deficiencies. Including a battery in a register increases its complexity, cost and maintenance requirements. Should the battery malfunction and a power mains failure or severe voltage dip occur, the data stored in the memory will be lost. Furthermore, batteries have limited life and thus require periodic replacement. In addition, the environments in which many registers are used put extreme temperature or humidity stress or both on the batteries.

These requirements point to the necessity of including some provision for ensuring and maintaining the integrity of stored computing constants and computed results. While certain demand registers of recent design employ simple data error-detection techniques such as the use of checksums, more effective error detection is required. Furthermore, these registers have not included data error-correction techniques. The lack of error-correction capability means that such registers must be removed from use and either replaced or put back in proper working condition.

SUMMARY OF THE INVENTION

The present invention overcomes the problems associated with prior art demand registers and time-of-day meters by providing a solid state demand register for measuring electrical-power demand of a customer load connected to power mains and method of operation which requires no battery back-up and includes techniques for error detection and correction, and further provides for storing and visually displaying noncumulative, cumulative, or continuous-cumulative demand. Dual-mode (for example, noncumulative and cumulative or noncumulative and continuous-cumulative) operation is also provided.

The present invention is microprocessor-based and operates in accordance with programs stored in an internal read-only memory. Computing constants and computed results (collectively denominated data) are stored in a nonvolatile memory external to the microprocessor that retains the stored data even when deenergized. A preferred form for the nonvolatile memory is an electrically alterable, read-only memory, for example, a metal-nitride-oxide-silicon memory.

The microprocessor insures the authenticity of the computing constants and computed results by utilizing error-detection and error-correction coding such as a Hamming code having, for example, eight bits.

Pulses indicative of electrical-energy usage are provided to the microprocessor by optically sensing rotation of the main disk or an auxiliary disk of an eddy-current motor. Error due to jitter in the rotation of the disk is eliminated through the use of a pair of optical sources and detectors in conjunction with a comparator circuit exhibiting hysteresis.

Timing pulses derived from the power-mains frequency are provided to the microprocessor, which accumulates them to define a series of consecutive demand-monitoring intervals. The microprocessor, in accordance with the stored program, processes pulses indicative of electrical-energy consumption generated during each demand-monitoring interval to calculate a demand-monitoring interval value for each interval. The demand-monitoring interval values are utilized by the present invention when functioning in each of its possible operating modes.

The microprocessor, under stored program control, generates output pulses proportional to the electrical-power demand and an output pulse indicative of the end of a demand-monitoring interval.

A register programmer allows five computing constants to be inputted to effect the following changes in operation of the present invention: constant 1—the number of pulses to be generated by the pulse initiator when an incremental amount of electrical energy has been consumed; constant 2—the length of the demand-monitoring interval; constant 3—a disk constant which defines how many watt-hours constitute the incremental amount of consumed electrical energy (for example, one meter disk revolution); constant 4—the operating mode (noncumulative; cumulative; continuous-cumulative; noncumulative and cumulative; or noncumulative and continuous-cumulative); and constant 5—decimal-point positions.

Should mains power be lost or a severe voltage dip occur, a power-loss/reacquisition level generator will present a level change to the microprocessor which orders the termination of the demand-monitoring interval in progress. When normal voltage levels are restored, the power-loss/reacquisition level generator will present another level change to the microprocessor which orders the commencement of a new demand-monitoring interval.

A switch is also provided to present a reset pulse to the microprocessor which signifies that a current billing period has ended. Upon receipt of this reset pulse, the microprocessor will perform such data-processing steps as are consistent with the operating mode of the demand register.

When the microprocessor, in implementing the error-detection and error-correction code, detects an error in the computing constants or computed results or both that cannot be corrected with full (i.e., 100%) certainty, this determination is visually displayed and the present invention automatically switches to a standby mode of operation. Error-flag-clear terminals provide the capability to clear an error indication or flag indicative of the detected, uncorrectable error. This error indication or flag is stored in the nonvolatile read/write memory.

The computing constants and computed results are displayed visually on a conventional display, which can be a four-digit, seven-segment, light-emitting-diode display. Two additional light-emitting diodes are provided to indicate the selected one of the five possible demand-monitoring modes of operation. Because only one display is provided, computed results are provided sequentially if the present invention is in a dual mode of operation. All of the elements of the display are lighted during a portion of each complete display sequence to provide a visual indication that all elements are operative. A display controller inhibits the visual display when the ambient light level adjacent to the present invention falls below a preselected threshold value. This function prevents the present invention from attracting unwanted attention during periods of darkness.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which:

FIG. 3 shows diagrammatically the relationship of FIGS. 3A and 3B;

FIG. 6 shows diagrammatically the relationship of FIGS. 6A and 6B;

FIGS. 6A and 6B are a flow chart of TIME subroutine 432;

DETAILED DESCRIPTION OF THE PREFERRED EMBODIMENT

Figure 1:
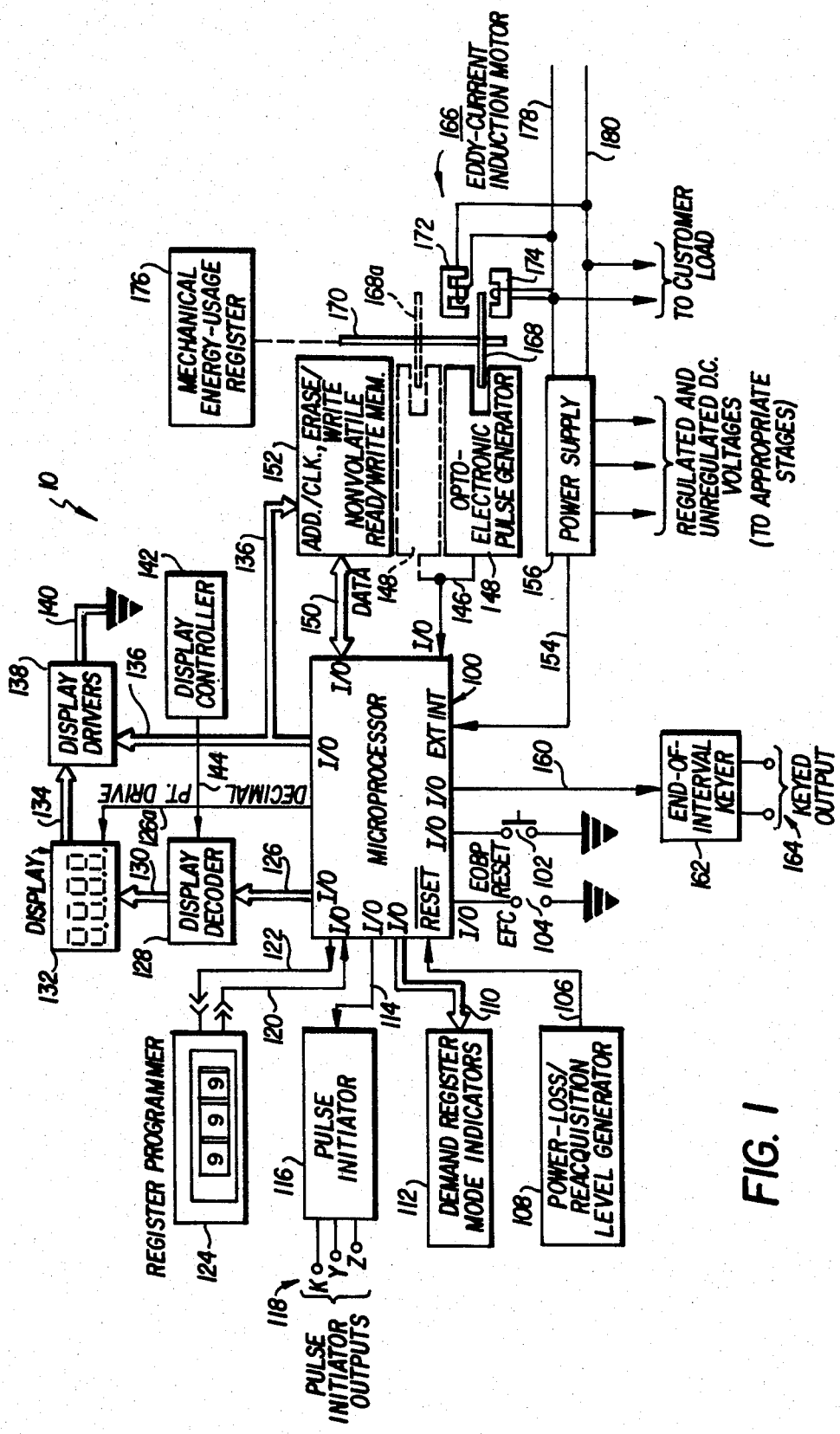
FIG. 1 is a functional block diagram of a preferred embodiment of the present invention.

The preferred embodiment of the solid-state demand register of the present invention is shown in functional block-diagram form in FIG. 1. The present invention, designated generally by reference numeral 10, is based around a microprocessor 100, which is of conventional design and preferably is a Fairchild F3870PL single-chip microcomputer made by Fairchild Camera & Instrument Corporation, Mountain View, Calif., and described in a publication entitled "F3870 Single-Chip Microcomputer-Fairchild Microcomputer Family". It should be noted that other types of microprocessors can be employed in the present invention.

Microprocessor 100 in the preferred form is an eight-bit, metal-oxide-semiconductor processor which can execute an instruction set of more than 70 commands, has 2,048 bytes of read-only memory, 64 bytes of scratchpad random-access memory, a programmable binary timer, four eight-bit, input/output ports, and an internal clock.

Microprocessor 100 and a nonvolatile read/write memory 152 together comprise a circuit which defines a series of consecutive demand-monitoring intervals, calculates or computes the electrical-power demand incurred during each demand-monitoring interval, and stores computing constants and computed results. Nonvolatile read/write memory 152 is nonvolatile in the true sense of the word—that is, it retains the data stored in it even if energizing electrical power or potential is removed from the memory's power-supply terminals (that is, when it is deenergized). Nonvolatile read/write memory 152 is preferably a model 2055 512-bit (64×8), metal nitride-oxide-silicon, electrically alterable, read-only memory, manufactured by the NCR Corporation, of Dayton, Ohio, and described in a data sheet published by that company and entitled "NCR 2055 512 BIT (64×8) WORD ALTERABLE ROM". Stored data may be read from this device a minimum of $10^{11}$ times without having to be refreshed, and data storage is nonvolatile for more than 10 years. Although this device is intended for use as a read-mostly memory, data can be erased and rewritten as many as $10^4$ times. It should be noted that other suitable nonvolatile memories (not requiring backup potential to retain storage) can be employed in the present invention.

Microprocessor 100 and nonvolatile read/write memory 152 communicate via a bidirectional data bus 150. Data flow between microprocessor 100 and bidirectional data bus 150 via an input/output port of microprocessor 100.

Address, clock and erase/write-command signals flow from another input/output port of microprocessor 100 to nonvolatile read/write memory 152 via a set of signal lines 136. (Four of the terminals of this input/output port and of signal lines 136 also present signals to display drivers 136, as is described below.) As mentioned above, and as discussed in greater detail below, microprocessor 100 has four eight-bit, input/output ports with eight terminals each (one terminal for each bit). One of these input/output ports is used for data transfer between microprocessor 100 and nonvolatile read/write memory 152, and only for that purpose. The other ports are employed to perform more than one purpose, and the different data terminals of a particular port are in many cases used to present or accept signals that are unrelated to those at the remaining terminals of that port. The choice of using a particular port or data terminal of a port to present or accept a particular signal or signals is arbitrary.

Also connected to I/O port terminals of microprocessor 100 are end-of-billing-period (EOBP) reset switch 102 and a pair of error-flag-clear (EFC) terminals 104. Switch 102 provides a means of generating an end-of-billing-period pulse which alerts microprocessor 100 that a billing period has ended. Although switch 102 is shown as a manually operated, normally open, momentary-contact pushbutton switch, other switching devices or circuits can be used to generate this pulse.

Error-flag-clear terminals 104 provide a means of clearing an error indication or flag which is set in nonvolatile read/write memory 152 when a data-processing error has occurred and has been detected. When an error has been detected the error flag may be cleared by placing a jumper wire on terminal 104 while the register is unpowered. The register is then powered up and the jumper removed prior to installation and commencement of operation of solid-state demand register 10.

Connected to an external-reset ($\overline{\text{RESET}}$) terminal of microprocessor 100 via a signal line 106 is a power-loss/reacquisition level generator 108. Power-loss/reacquisition level generator 108 generates a low level when the voltage across a pair of alternating current mains conductors 178 and 180 decreases to a preselected level. This power-loss level is applied to the external-reset terminal of microprocessor 100 via signal line 106 and instructs the microprocessor that a voltage dip or power failure is occurring. Upon receipt of the power-loss level, microprocessor 100 terminates the demand-monitoring interval in progress. After the voltage across mains conductors 178 and 180 has returned to an acceptable level, power-loss/reacquisition level generator 108 generates a power-reacquisition level which instructs microprocessor 100 to initiate a new demand-monitoring interval. Power-loss/reacquisition level generator 108 therefore ensures that valid electrical-power demand information is computed despite the occurrence of transients across the power mains.

As discussed above, solid-state demand register 10 can function in one of several operating modes (noncumulative, cumulative, continuous-cumulative, noncumulative and cumulative, or noncumulative and continuous-cumulative). A pair of demand-register mode indicators 112 provide a visual indication of whether solid-state demand register 10 is operating in the noncumulative or a cumulative mode or in both the noncumulative and the cumulative mode. Demand-register mode indicators 112 receive driving signals from terminals of an input/output port of microprocessor 100 via a pair of signal lines 110. Demand-register mode indicators 112 are circuits that employ conventional light-emitting diodes driven by silicon switching transistors.

Solid-state demand registers 10 also includes a pulse initiator 116. When microprocessor 110 determines that the consumption of a programmably alterable preselected incremental amount of electrical energy from the alternating current mains has occurred, it sends a signal to pulse initiator 116 via a signal line 114. These pulses appear at a set of pulse-initiator outputs 118, which employ the KYZ format employed by the United States electric-utility-meter industry. These pulses can be applied to a data recorder or similar device connected to pulse-initiator outputs 118. Data formats other than KYZ can be employed.

There are five computing constants which the circuit comprising microprocessor 100 and nonvolatile read/write memory 152 employ. These are: constant 1—the number of pulses to be generated by pulse initiator 116 when an incremental amount of electrical energy has been consumed (from 0.1 to 10 pulses per increment, for example one meter disk revolution); constant 2—the length of the demand interval (for example, from 1 to 99 minutes); constant 3—a disk constant which defines how many watt-hours (from 0.1 to 99.9 watt-hours, for example) constitute the incremental amount of consumed electrical energy, normally defined as one meter disk revolution; constant 4—demand-register operating mode or modes (1=noncumulative; 2=cumulative; 3=continuous-cumulative; 4=noncumulative and cumulative; or 5=noncumulative and continuous-cumulative); and constant 5—decimal-point positions.

These computing constants are programmed or selected by means of a register programmer 124, which can be brought into programmable communication with input/output port terminals of microprocessor 100 via a pair of signal lines 120 and 122. Register programmer 124 in a preferred embodiment comprises three binary-coded-decimal thumbwheel switches and a parallel-in serial-out shift register. Microprocessor 100 provides clocking pulses to the parallel-in serial-out shift register of register programmer 124 via signal line 122. When the shift register receives clocking pulses, it converts three-digit, parallel, binary-coded-decimal data generated by the thumbwheel switches into serial form. The serial data are then transferred to an input/output port terminal of microprocessor 100 via signal line 120. Microprocessor 100 then converts these computing constants back into parallel binary-coded-decimal form and presents them to the data inputs of nonvolatile/read-write memory 152 via bidirectional data bus 150 for storage in a designated data-storage location. It should be observed that other data formats can be employed by register programmer 124.

Computing constants and computed results can be displayed visually on a four-digit, seven-segment, common-cathode, multiplexed LED display 132. Data appearing at terminals of another input/output port of microprocessor 100 are presented to a display decoder 128 via a set of signal lines 126. The data bits which flow from microprocessor 100 to display decoder 128 via the set of signal lines 126 are in binary-coded-decimal (BCD) form. Display decoder 128, which is preferably a type CD4511 CMOS BCD-to-seven-segment decoder IC, made by the Solid-State Division of the RCA Corporation, Somerville, N.J., converts the data bits into a form compatible with display 132.

The cathodes of the segments of each of four digits in display 132 are tied together and are connected to each of a set of display drivers 138 via another set of signal lines 134. Each signal line of the set 134 is connected to the collector of the appropriate one of display drivers 138, which are silicon Darlington transistors. The emitters of these Darlington transistors are connected to ground via another set of signal lines 140. The bases of these Darlington transistors receive drive signals generated within microprocessor 100 and presented to input/output-port terminals of microprocessor 100 via another set of signal lines 136. These are digit-enable signals which allow display drivers 138 to activate appropriate digits of display 132 at appropriate times.

Darlington transistors, which are preferably model MPSA14 devices made by the Motorola Corporation of Phoenix, Ariz., are used because the input/output port which provides them with base drive has limited current-sourcing capability. The large current gain of such Darlington transistors considerably reduces the amount of base drive required for adequate current flow through the segments of display 132. A display controller 142 generates a control signal which is provided to display decoder 128 via another signal line 144. Display controller 142, which is preferably a model UNL3330Y component made by the Sprague Electric Company of Waltham, Mass., a photosensitive device which inhibits display decoder 128 from providing seven-segment-compatible signals to the anodes of the segments of display 132 via a set of signal lines 130 when ambient light levels are below a preselected threshold value. Display controller 142 therefore inhibits display 132 from glowing in the dark. This inhibition function minimizes the possibility that solid-state demand register 10 will attract unwanted attention during periods of darkness. Should it be desired to actuate display 132 when ambient light levels are below the preselected threshold value, the output of a suitable source of light (such as that of an energized flashlight) can be directed to irradiate display controller 142.

An optoelectronic pulse generator 148 acts in concert with an eddy-current induction motor 166 to generate pulses at a rate proportional to the consumption of electrical energy from power mains conductors 178 and 180. The pulses generated by optoelectronic pulse generator 148 and eddy-current induction motor 166 are presented via a signal line 146 to an input/output port terminal of microprocessor 100.

Figure 3B:
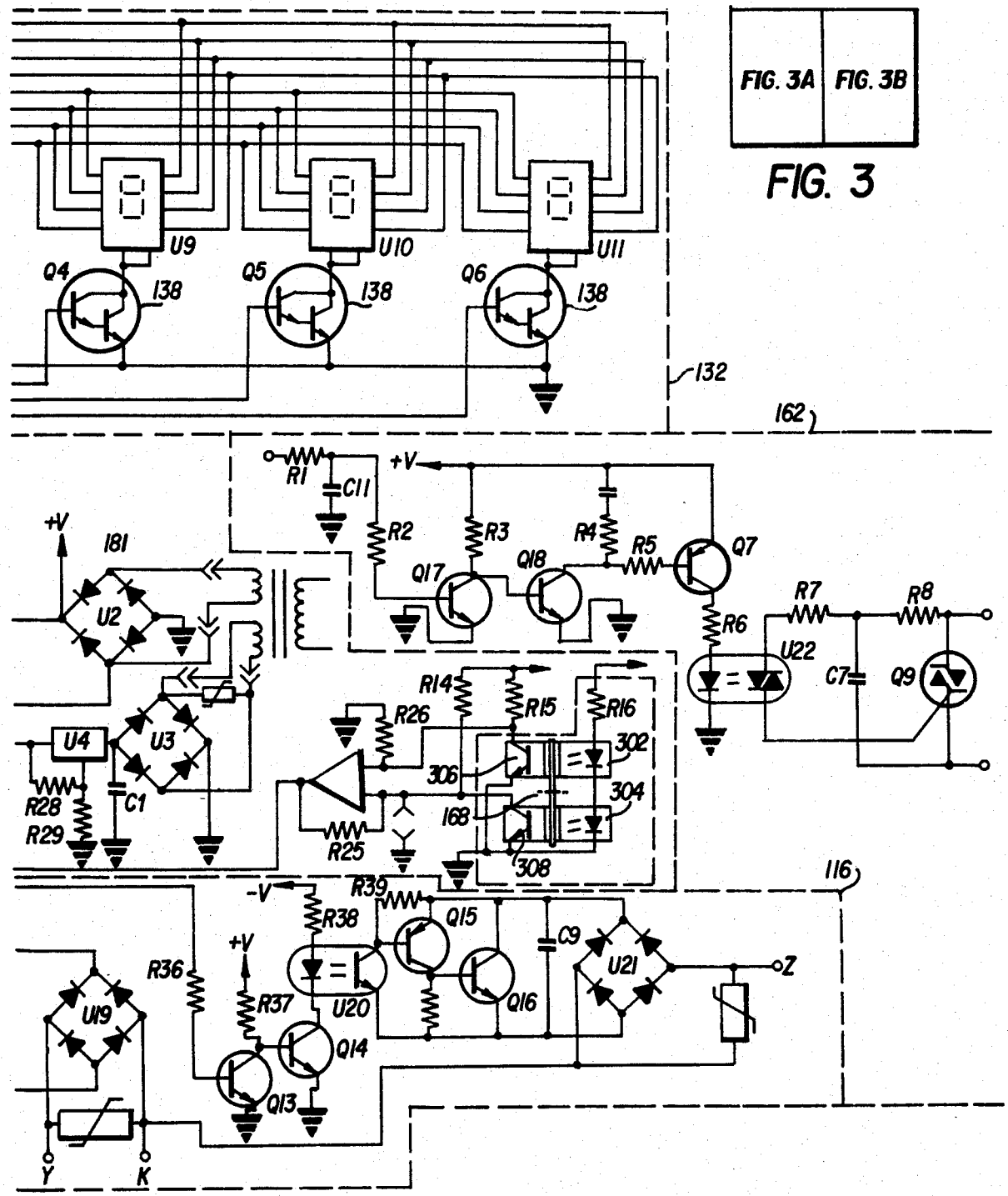
FIGS. 3A and 3B are a schematic block diagram of the preferred embodiment shown in FIG. 1.
Figure 3A:
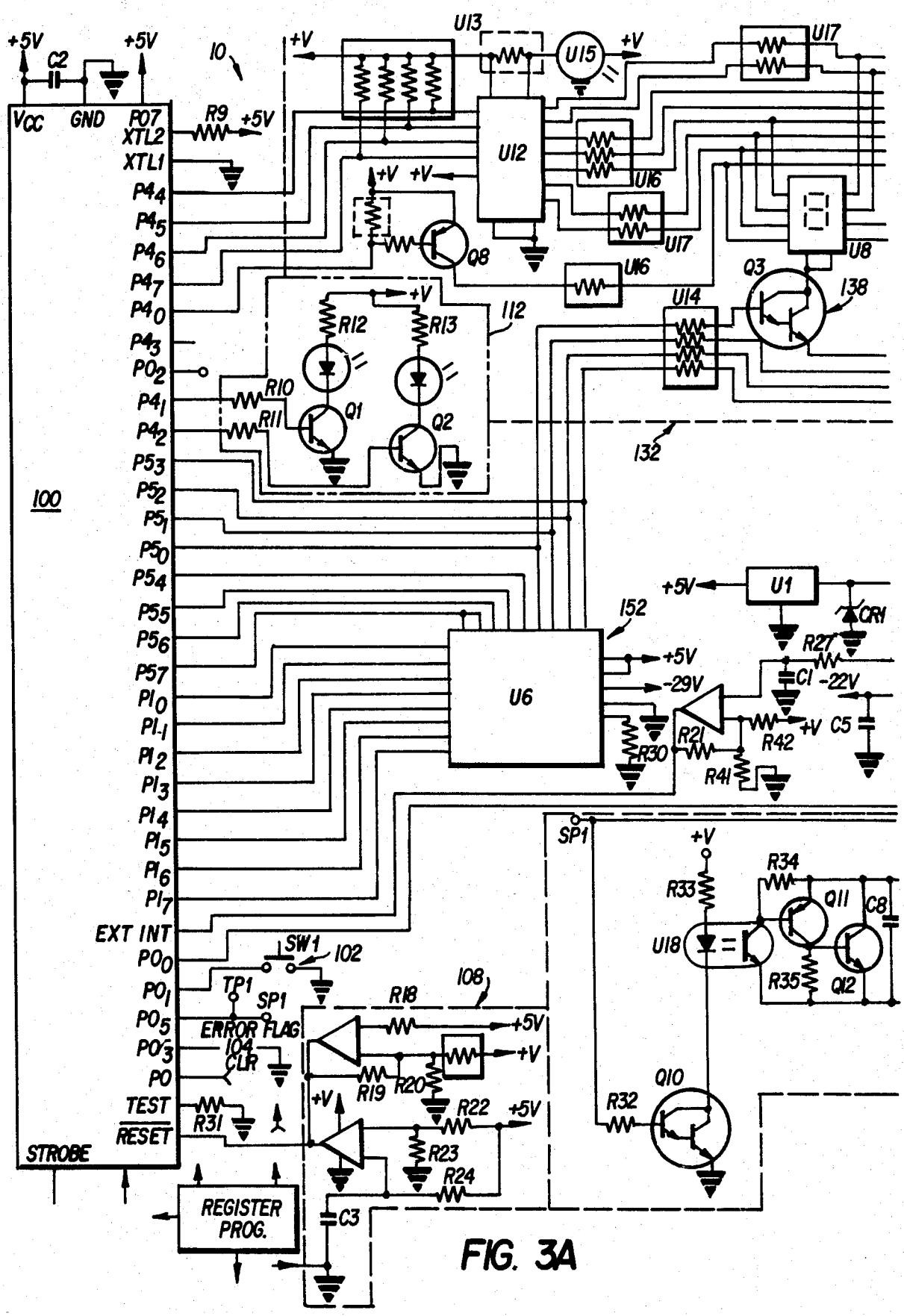

With reference to FIGS. 1 and 3, eddy-current induction motor 166 comprises an eddy-current disk 168, a shaft 170 to which eddy-current disk 168 is attached, a field winding 172 connected across power mains conductors 178 and 180, and an eddy-current winding 174 placed in series with one of the mains conductors (in this case, conductor 178). Field winding 172 sets up a magnetic field in the vicinity of eddy-current disk 168 which is substantially proportional to the voltage across power mains conductors 178 and 180. Eddy-current winding 174 generates a magnetic field which sets up an eddy current in eddy-current disk 168 when current flows through mains conductors 178 and 180 and the customer's loads. An auxiliary disk 168a (shown in outline in FIG. 1) may also be mounted on shaft 170.

The amplitude of the induced eddy current depends on the amount of current drawn by the customers's load. An eddy current in eddy-current disk 168 sets up a magnetic field which interacts with that produced by field winding 172 to cause rotation of eddy-current disk 168 at a rotational velocity proportional to the amount of electrical energy being consumed by the customer's load.

Eddy-current disk 168 or auxiliary disk 168a have one or more holes or openings (not shown in detail). These openings make it possible for optoelectronic pulse generator 148 to generate pulses at a rate proportional to the consumption of electrical energy without being in mechanical contact with eddy-current disk 168 or auxiliary disk 168a. Optoelectronic pulse generator 148 includes two light emitters 302 and 304 (which can be, for example, light-emitting diodes of conventional design) mounted adjacent to each other and near one face of disk 168 or 168a. Optoelectronic pulse generator 148 also includes a pair of photodetectors 306 and 308 (which can be phototransistors, photodiodes, or similar photosensitive devices of conventional design) mounted adjacent to each other and near the opposite face of eddy-current disk 168 or 168a.

The pairs of light emitters 302 and 304 and photodetectors 306 and 308 are aligned with the disk so that the photodetectors 306 and 308 are alternately shadowed by disk 168 or 168a and irradiated by output of the light emitters 302 and 304. Photodetectors 306 and 308 are irradiated by the output of light emitters 302 and 304 when an opening (not shown) of disk 168 or 168a occupies the space between the oppositely mounted pairs of light emitters and photodetectors. Photodetectors 306 and 308 are shadowed when the space between them and light emitters 302 and 304 is occupied by a solid region of disk 168 or 168a.

Optoelectronic pulse generator 148 further includes a switching circuit 148 driven by photodetectors 306 and 308. Switching circuit 148 generates an output pulse each time an opening in disk 168 or 168a enters and exits the region between the light emitters 302 and 304 and photodetectors 306 and 308. Photodetectors 306 and 308 and switching circuit 148 function in such a manner that the generation of output pulses due to "jitter" of eddy-current disk 168 is suppressed. "Jitter" is a phenomenon which can occur when eddy-current disk 168 oscillates about one point in its rotation. These oscillations would otherwise be mistaken for the rotational passage of a number of openings of disk 168 or 168a during relatively rapid rotation of eddy-current disk 168. The pulses generated by the switching circuit in optoelectronic pulse generator 148 are accumulated and are processed by microprocessor 100 to derive values of electrical-power demand.

Referring again to FIG. 1, various stages of solid-state demand register 10 require regulated or unregulated direct current voltages of particular amplitudes and polarities. These voltage requirements are satisfied by a power supply 156, which derives regulated and unregulated direct current voltages from the voltage across alternating current voltage mains conductors 178 and 180. The direct current voltages are provided to the appropriate stages at a number of outputs 158.

Power supply 156 also generates a train of pulses which are derived from the alternating current signal flowing in mains conductors 178 and 180. This pulse train has a repetition rate related to the alternating current mains frequency and is used for timing purposes by microprocessor 100. The pulse train is applied to an external-interrupt input of microprocessor 100 via a signal line 154. These pulses function as interrupts which direct the microprocessor to enter and perform an interrupt subroutine which is described in greater detail below.

An end-of-interval keyer 162 generates an end-of-interval pulse when each demand-monitoring interval ends. End-of-interval keyer 162 generates the end-of-interval pulse when it receives a pulse from another input/output port terminal of microprocessor 100 via another signal line 160. The end-of-interval pulse appears across keyed output terminals 164.

Solid-state demand register 10 can also include a mechanical energy-usage register 176, which totalizes and displays visually the amount of electrical energy (for example, in kilowatt-hours) consumed by the customer load. Mechanical energy-usage register 176 is driven by a shaft 170 to which it is coupled (shown by dashed lines). As stated above, shaft 170 is attached to and supports eddy-current disk 168 and auxiliary disk 168a. Eddy-current disk 168, auxiliary disk 168a and shaft 170 thus rotate together. In this manner, shaft 170 provides the torque required to drive mechanical energy-usage register 176.

The architecture of microprocessor 100 is now discussed with reference to FIG. 2. While microprocessors are well known, highlights of some significant stages and features of microprocessor 100 are now discussed.

The heart of microprocessor 100 is an arithmetic logic unit (ALU) 200. Arithmetic logic unit 200 performs the arithmetic operations of binary addition, decimal adjustment, add with carry, and decrement, as well as the logic operations of AND, OR, 1's complement and shift left and right. A general-purpose accumulator and status register 204 receives inputs for arithmetic logic unit 200 and stores in its accumulator section the results of operations performed by arithmetic logic unit 200. Arithmetic logic unit 200 and accumulator and status register 204 communicate via a bidirectional processor data bus 202, which is the main data bus of microprocessor 100, and a unidirectional data bus 206. Microprocessor 100 also includes a scratchpad 212, which is a 64-word, eight-bit, general-purpose random-access memory. Associated with scratchpad 212 is an indirect scratchpad address register 208, which can hold two octal digits. As stated above, read-only memory 220 stores the operating program of microprocessor 100, whose operation is described in greater detail with respect to FIGS. 4–11. Read-only memory 220 can be programmed with up to 2,048 eight-bit words. Read-only memory 220 is addressed via an adder/incrementer 214, a bus 216, a set of read-only memory address registers 218, and bidirectional processor data bus 202.

Microprocessor 100 also includes a set of four input/output ports 242 (input/output port 0), 244 (input/output port 1), 246 (input/output port 4), and 248 (input/output port 5). Each of these is an eight-bit bidirectional data port through which data can flow into and out of microprocessor 100. Each port has eight data lines which can be used individually as either transistor-transistor-logic-compatible inputs or as latched outputs. An output instruction causes the contents of accumulator 204 to be latched into the addressed port 242, 244, 246 or 248. An input instruction causes the transfer of the contents of the port to the accumulator section of accumulator and status register 204. Ports 242, 244, 246, and 248 communicate with the other stages of microprocessor 100 via bidirectional processor data bus 202.

A timer 228 is an eight-bit, binary down counter which is software programmable to operate as an interval timer, a pulse-width measurer, or an event counter. Timer 228 can pass interrupt pulses applied to a external-interrupt input of an interrupt pulse-width prescale logic stage 232. When an external-interrupt pulse is applied to microprocessor 100, it will be acknowledged and processed at the completion of the first non-privileged instruction if an interrupt-control bit of the status register-section accumulator and status register 204 is set. If the interrupt control bit is not set, the interrupt request will continue until either the interrupt-control bit is set and microprocessor 100 acknowledges the interrupt or until the interrupt request is cleared.

An instruction register 236 stores program steps retrieved from read-only memory 220. Instruction register 236 can be reset by a pulse applied to an external-reset ($\overline{\text{RESET}}$) input of a control/test/clock/power-on logic stage 240. Stage 240 contains a clock having a pair of terminals $XTL_1$ and $XTL_2$. The clock will oscillate in one of several modes, depending on the connections to terminals $XTL_1$ and $XTL_2$.

A quartz crystal can be connected across these terminals to make the clock oscillate at the frequency determined by the crystal. Alternatively, an inductor or a tuned, parallel inductor/capacitor tuned circuit can be connected across these terminals. In this case, the clock oscillates at the resonant frequency of the inductor and the intrinsic input capacitance of the clock or the resonant frequency of the parallel inductor/capacitor network comprising the inductor, the intrinsic capacitance, and the capacitance of the external capacitor. Another possibility is to leave terminal $XTL_1$ open and to drive terminal $XTL_2$ with pulses from an external clock source. In this case, the effective clock frequency is that of the external source.

Finally, terminal $XTL_1$ can be grounded and terminal $XTL_2$ can be connected to a resistor or a resistor/capacitor network. In this last case, the clock frequency will be determined by the time constant of the resistor/capacitor network formed by the intrinsic capacitance and either the value of the external resistor or the values of the components of the external resistor/capacitor network. The external resistor approach is employed in solid-state demand register 10. In this application, the clock frequency will be approximately 3 MegaHertz and need not be closely controlled.

The circuit of a preferred embodiment of solid-state demand register 10 is now described with reference to FIG. 3.

The actual pin numbers and functional labels ($\overline{\text{RESET}}$, EXT INT, et cetera) of the various terminals of microprocessor 100 and the other integrated circuits in solid-state demand register 10 are shown. These can be related, for example, to the input/output ports and the various other inputs of microprocessor 100 shown in FIGS. 1 and 2. The data terminals of input/output ports P0, P1, P4 and P5 are given by pin number and according to the following convention: the significance of the bit corresponding to each data terminal of an input/output port is noted in subscript after the name of the port. For illustration, $P0_0$ denotes the least significant-bit data terminal of input/ouput port P0, and $P0_7$ denotes the most-significant-bit data terminal of that port. As stated above, microprocessor 100 forms with nonvolatile read/write memory 152 a circuit which defines a series of consecutive demand-monitoring intervals and which calculates the electrical-power demand incurred during each such interval. The eight data lines of memory 152 (D0–D7) are connected to input/output port P1 of microprocessor 100. Address and clock signals and read/write/erase commands for memory 152 are provided by input/output port P5 of microprocessor 100.

Switch 102 (SW1) is the end-of-billing-period reset switch. When switch 102 is closed, a negative-going, end-of-billing-period pulse is provided to data terminal 1 of input/ouput port P0. In addition, error-flag-clear terminals 104 are connected to data terminal 3 of input/ouput port P0 and to ground. Terminals 104 allow the present invention to be reactivated after an uncorrectable error in a computing constant or a computed result has occurred.

Power-loss/reacquisition level generator 108 contained within a dashed-line box comprises two voltage comparators U5A and U5B and associated passive components. Comparators U5A and U5B are connected to an external-reset ($\overline{\text{RESET}}$, pin 39) input of microprocessor 100. Comparator U5A monitors the difference in voltages between the positive unregulated output and the +5-volt regulated output of power supply 156.

Comparator U5B monitors the difference in the voltages developed across a voltage divider and a resistor/capacitor integrator, both of which are driven by the +5-volt regulated output of power supply 156. The operation of comparators U5A and U5B is discussed in greater detail below.

The demand-register mode indicators 112 (shown within a dashed-line box) comprise two conventional light-emitting-diodes CR2 and CR3. Transistors Q1 and Q2 function as switchable current sinks for CR2 and CR3, respectively. Transistor Q1 receives base drive via a resistor R10 from data terminal 1 of input/output port P4. When data terminal $P4_1$ is high, transistor Q1 conducts and light-emitting diode CR2 glows to indicate that display 132 of solid-state demand register 10 is operating in either the cumulative or continuous-cumulative mode. Transistor Q2 receives base drive via a resistor R11 from data terminal 2 of input/output port P4. When data terminal $P4_2$ is high, transistor Q2 conducts and light-emitting diode CR3 glows to indicate that display 132 of solid-state demand register 10 is operating in the noncumulative mode. Resistors R12 and R13 function as current limiters for light-emitting diodes CR2 and CR3, respectively.

Pulse initiator 116 (shown in dashed-line box) receives a triggering pulse generated by microprocessor 100 and presented to data terminal 5 of input/output port P0. When data terminal $P0_5$ is at logic 1, Darlington transistor Q10 and switching transistor Q13 conduct. The light-emitting diode in optoisolator U18 glows and causes the phototransistor within optoisolator U18 to conduct. This conductor causes transistor Q11 to turn on and provide base drive for power transistor Q12. Power transistor Q12 can then sink current for an external circuit connected to terminals Y and K. Modular bridge rectifier U19 allows transistor Q12 to see the proper polarity between collector and emitter, regardless of the polarity of the voltage impressed across terminals Y and K. A transient suppressor SP2 is connected across terminals Y and K to protect modular bridge rectifier U19, power transistor Q12, switching transistor Q11, and the phototransistor in optoisolator U18 from overvoltages.

Because switching transistor Q13 is conductng at the same time as Darlington transistor Q10, switching transistor Q14 is cut off. The light-emitting diode in optoisolator U20 is darkened and the phototransistor in U20 is cut off. Consequently, switching transistor Q15 is cut off, as is power transistor Q16. The external circuit connected between terminals Z and K is not energized, because no current can flow through modular bridge rectifier U21 and power transistor Q16. The Z and K output terminals are protected against voltage transients by another transient suppressor SP3.

Thus, when the load connected between terminals Y and K is energized, the one connected between terminals Z and K is not. When data line $P0_5$ is at logic 0, pulse initiator 116 changes states, energizing the circuit connected between terminals Z and K and deenergizing the circuit connected between terminals Y and K. Microprocessor 100 is programmed to toggle data line P0$_5$ at a rate of, for example, from 0.1 pulse to 10.0 pulses per revolution of eddy-current disk 168.

Register programmer 124 has four plug pins P2-1, P2-2, P2-3 and P2-4. These plug pins mate with jack conductors J2-1 through J2-4. Jack conductor J2-1 provides a circuit-ground connection for register programmer 124. Jack conductor J2-2 provides a connection to the +5-volt regulated output of power supply 156. Jack conductor J2-3 provides to register programmer 124 clocking pulses which are generated by microprocessor 100 and presented at data line P0$_6$. These pulses are applied to register programmer 124 to cause its internal shift register to shift out in serial form binary-coded-decimal data for application to data terminal P0$_4$ via plug P2-4 and jack conductor J2-4. As discussed above, register programmer 124 allows the five computing constants to be programmed into nonvolatile read/write memory 152. Serial-to-parallel conversion of each binary-coded-decimal digit of the computing constants is performed by microprocessor 100 prior to application to the data lines of nonvolatile read/write memory 152.

Values of computing constants and computed results can be displayed on a four-digit, common-cathode, seven-segment multiplexed light-emitting diode display 132, which is made up of display units U8, U9, U10 and U11. Values to be displayed visually are presented in binary-coded-decimal form to binary-coded-to-decimal, seven-segment decoder 128 via data lines P4$_4$–P4$_7$. Because of the construction of data lines P4$_4$–P4$_7$, pull-up resistors U13 are required. The seven output lines of decoder 128 are connected to the anodes of appropriate segments of display digits U8–U11 via current-limiting resistors U16 and U17. The decimal-point anodes of display units U8–U11 receive current via switching transistor Q8 and current-limiting resistor U16(7-8). Transistor Q8 receives base drive via resistor R17 when input/ouput port terminal P4$_0$ is at logic 0. Resistor U13(1–8) provides a means for turning transistor Q8 off when P4$_0$ is at logic 1.

Photosensitive-integrated-circuit display controller 142 of conventional design inhibits decoder 128 from supplying logic-1 voltage levels to the anodes of display digits U8–U11 when ambient-light levels are below a preselected threshold value. Display controller 142 does so by controlling the voltage applied to a blanking (B$_1$) input of decoder 128. The common cathodes of each display digit U8–U11 are tied to the collectors of a set of four Darlington transistors Q3–Q6, which correspond to display drivers 138 shown in FIG. 1. These Darlington transistors receive base drive from data terminals P5$_0$–P5$_3$ of microprocessor 100. Note that these data terminals are multiplexed. They also provide the lower four address bits for nonvolatile read/write memory 152. Display drivers 138 (Darlington transistors Q3–Q6) receive base drive via resistors U14. Darlington transistors are employed as display drivers 138 because their high current gain keeps small the amount of current which the lower four data lines of input/output port P5 must source. The current which flows through appropriate segments of each display digit U8–U11 flows through the corresponding display-driver transistor to ground.

When the unregulated positive voltage decreases to a threshold determined by the action of the voltage divider comprising U13(1–5)/R20 and the operating characteristics of comparator U5A, the output of U5A goes to logic 0. To prevent normal fluctuations in the unregulated positive voltage (such as those which occur when optoelectronic display circuit 132 is activated), hysteresis is provided by resistor R19. When the output of U5A goes logic 0, it pulls the external reset ($\overline{RESET}$) terminal of microprocessor 100 low. This low level instructs the microprocessor to terminate the demand-monitoring interval in progress.

When the voltage difference between the positive unregulated voltage and the +5-volt output of power supply 158 returns to an acceptable level, the output of comparator U5A switches states. However, the $\overline{RESET}$ input of microprocessor 100 does not return to logic 1 immediately, due to the time delay introduced by comparator U5B and its associated passive components. The inverting input of comparator U5B receives +5-volts regulated via the voltage divider R22/R23. The noninverting input of comparator U5B, however, receives voltage from the +5-volt regulated line via resistor/capacitor integrator R24/C3. The output of comparator U5B does not go to its high state until capacitor C3 has charged up to a voltage slightly greater than that furnished to the noninverting input of comparator U5B by voltage divider R22/R23. When capacitor C3 has charged sufficiently, the $\overline{RESET}$ input of microprocessor 100 returns to logic 1, and the next demand-monitoring interval can begin.

As discussed briefly with respect to FIG. 1, optoelectronic pulse generator 148 includes a pair of light-emitting diodes 302 and 304, which are connected in series between ground and current-limiting resistor R16. Light-emitting diodes 302 and 304 are mounted adjacent to each other and near one face of disk 168 or 168a. Mounted near the opposite face of disk 168 or 168a are a pair of phototransistors 306 and 308. The emitters of phototransistors 306 and 308 are grounded, while their collectors are connected to the +5-volt line via resistors R15 and R14, respectively. The collector of phototransistor 306 is also connected to resistor R26 and to the inverting input of comparator U5C. The collector of phototransistor 308 is connected to the noninverting input of comparator U5C.

Disk 168 or 168a has, for example, 10 openings in it (not shown). The pairs of light-emitting diodes 302 and 304 and of phototransistors 306 and 308 are mounted with respect to disk 168 or 168a so that the light from diodes 302 and 304 can reach phototransistors 306 and 308 when the space between the light-emitting diodes and the phototransistors is occupied by one of the openings provided in disk 168 or 168a. When the space between the light-emitting diodes and the phototransistors is occupied by a solid portion of disk 168 or 168a, no light from the diodes can reach the phototransistors. When a phototransistor 306 or 308 is illuminated, it conducts, and a ground-voltage level is applied to the input of comparator U5C to which its collector is connected. When the phototransistor is shadowed by a solid portion of disk 168 or 168a, a high-voltage level is applied to the input of comparator U5C to which its collector is connected.

Resistor R25 is connected between the output and noninverting input of comparator U5C to introduce a large amount of hysteresis. Because of this hysteresis, comparator U5C functions more like an analog set/reset flip-flop than a comparator. The flip-flop behavior of U5C and the positioning of the pairs of light-emitting diodes 302 and 304 and phototransistors 306 and 308 contribute to ensure that only valid electrical-energy consumption pulses are generated. Jitter of eddy-current disk 168 does not cause a pulse to appear at the output of comparator U5C. The valid pulses generated by comparator U5C are applied to data line $P0_0$ of microprocessor 100.

Power supply 156 shown in another dashed-line box provides unregulated and regulated positive and regulated negative voltages to appropriate stages of solid-state demand register 10. Power supply 156, in terms of providing regulated and unregulated voltages, is of conventional design and thus is not described in detail.

Power supply 156 also derives from the alternating-current mains 178 and 180 a train of pulses having a frequency related to the frequency of the mains as follows. The alternating current voltage appearing across the 8.4-volt secondary transformer T1 is captured by the diode 181 of modular bridge rectifier U2 whose anode is connected to the lower end of the 8.4-volt secondary and whose cathode is connected to the unregulated positive supply. The half-wave rectified signal which appears across diode 181 is applied to the inverting input of comparator U5D via resistor/capacitor integrator R27/C1. The noninverting input of comparator U5D receives a portion of the regulated positive voltage developed across capacitor C6 via voltage divider R42/R41. Hysteresis is introduced into comparator U5D by resistor R21. Because of this hysteresis, comparator U5D functions as a Schmitt trigger. The output of comparator U5D is high until the half-wave rectified, direct-current waveform attains a sufficiently high amplitude. The output of comparator U5D thereupon switches to its low state, where it remains until the voltage across capacitor C1 drops to a level low enough to overcome the hysteresis introduced by resistor R21. This hysteresis prevents comparator U5D from operating erratically and provides immunity from line transients. The train of pulses which appears at the output of comparator U5D is applied to the external-interrupt (EXT INT) input of microprocessor 100. Each time a pulse is applied to the external-interrupt input, microprocessor 100 enters a timekeeping subroutine discussed below with reference to FIG. 10.

As discussed above, end-of-interval keyer 162 (shown in a dashed line box) generates an end-of-interval pulse when each demand-monitoring interval terminates. At the end of each interval, a narrow pulse appears at data line 2 of input/output port P0 of microprocessor 100. This pulse, which, for example, is negative-going and 400 microseconds in duration, is stretched by resistor/capacitor integrator R5/C10. The initial negative-going pulse causes transistor Q17 to cut off. Base current then flows to switching transistor Q18 via resistor R3. Transistor Q18 then effectively grounds the junction of resistors R4 and R5, allowing base current to flow through switching transistor Q7. Transistor Q7's conduction time is stretched after transistor Q18 cuts off again because of the effect of resistor/capacitor network R4/R5/C10. When transistor Q7 is conducting, it sources current to the light-emitting diode in optoisolator U22 via current-limiting resistor R6.

When current flows through the light-emitting diode in optoisolator U22, the light-emitting diode irradiates the photosensitive bilateral trigger diode also contained in optoisolator U22. Note that optoisolators containing other types of light emitters and photosensitive components can be used as optoisolator U22. When the photosensitive, bilateral trigger diode is irradiated, gate current can flow though triac Q9 if an alternating current voltage is impressed across keyed output terminals 164 (main terminals T1 and T2 of triac Q9). Thus, a load connected in series between one side of an alternating current voltage source and one of the keyed output terminals 164 will be energized during the time that transistor Q7 is conducting.

Nonvolatile read/write memory 152 stores five computing constants, as discussed above. Computing constant 1 is a two-digit binary-coded-decimal number describing the number of pulses generated by pulse initiator 116 for each revolution of eddy-current disk 168. For example, if the value of this constant is 00, ten pulses appear at the KYZ outputs 118 of pulse initiator 116 for each revolution of eddy-current disk 168. For values of this constant between 01 and 99, the number of pulses generated per revolution of eddy-current disk 168 equals the decimal number described by the two digits with a decimal point inserted between them (0.1–9.9).

Computing constant 2 describes the length of the demand interval using two binary-coded decimal digits. The length of the demand interval can be programmed within the range of, for example, 1–99 minutes.

Computing constant 3 is a three-decade, binary-coded-decimal number describing a disk constant associated with eddy-current disk 168. Each revolution of disk 168 corresponds to the consumption of an incremental amount of electrical energy in watt-hours. The value of the disk content loaded into nonvolatile memory 152 can be, for example, within the range of from 0.1 to 99.9 watt-hours per revolution.

Computing constant 4 stored in nonvolatile read/write memory 152 is a single-decade, binary-coded-decimal number having a value of from 1–5. If the value of this computing constant is 1, solid-state demand register 10 functions only in the noncumulative or block-interval mode. If the value is 2, solid-state demand register 10 functions only in the cumulative mode. If the value is 3, solid-state demand register functions only in the continuous-cumulative mode. If the value is 4, solid-state demand register 10 functions in both the noncumulative and cumulative modes. Finally, if the value of this constant is 5, solid-state demand register 10 functions in the noncumulative and continuous-cumulative modes. With respect to constants 4 and 5, display 132 alternately displays the electrical-power demand values calculated for each operating mode.

The fifth constant determines the position of the decimal point of display 132 which is actuated. This constant is a two-decade, binary-coded-decimal number having, for example, a value in the range of from 00 through 44. The most-significant digit determines the position of the actuated decimal point of display 132 when solid-state demand register 10 is operating in the noncumulative mode. The least significant digit describes the position of the actuated decimal point of display 132 when solid-state demand register 10 is operating in either the cumulative or continuous-cumulative mode. If a digit is 4, the decimal point of display 132 will be floating in the corresponding operating mode. If the value is from 0 to 3, the decimal point will be fixed at one of the four possible positions of display 132. A value of 3 means that the decimal point is fixed after the least significant digit. If the value is 2, the decimal point is fixed between the next-to-least significant digit and the least significant digit. If the value is 1, the decimal point is fixed between the next-to-most significant digit and the next-to-least significant digit. If the value of this constant is 0, the decimal point is fixed between the most significant digit and the next-to-most significant digit of display 132. If the decimal point is fixed at one of these positions, solid-state demand register 10 will not adjust to meet overflow conditions. Rather, it will lock up at the specified maximum value, that is, 9.99, 99.99, 999.9 or 9999 kilowatts for block interval demand. The register will roll-over for cumulative and continuous-cumulative operation.

Register programmer 124 includes a three-position switch which permits generation of the following three commands: (1) display the current constant value (for example, constant 1); (2) display the next constant value (for example, constant 2); and (3) load the value set by means of the thumbwheel switches into the location of nonvolatile read/write memory 152 reserved for the current constant, and then display the value of the next constant. Constant 1 is optional, but constants 2–5 are mandatory if solid-state demand register 10 is to operate correctly. If solid-state demand register 10 is operating in the cumulative or continuous-cumulative mode, programming of any of constants 2–5 will cause the cumulative or continuous-cumulative demand value stored in nonvolatile read/write memory 152 to be reset to zero. Programming of constant 1 will not affect the stored cumulative or continuous-cumulative value.

Display 132 is cycled between displaying data and performing a display test in which all display segments are energized and 8's are displayed. All decimal points of display 132 as well as the two light-emitting diodes of demand register mode indicators 112 are energized. Display 132 will display data for a period of six seconds. This is followed by a two-second "off" time, then a display test for six seconds, and then another two seconds of "off" time. This cycle repeats itself as long as power is received from alternating-current mains 178 and 180. In the case of a combination (noncumulative and cumulative or noncumulative and continuous-cumulative) register, the data corresponding to the second mode of operation is displayed after the first two-second off time, but before the display test.

The routines according to which the present invention functions are now described. An example of a software program for implementing the various operating and error detecting and correcting routines described below is given at the end of the specification.

Figures 4, 4A:
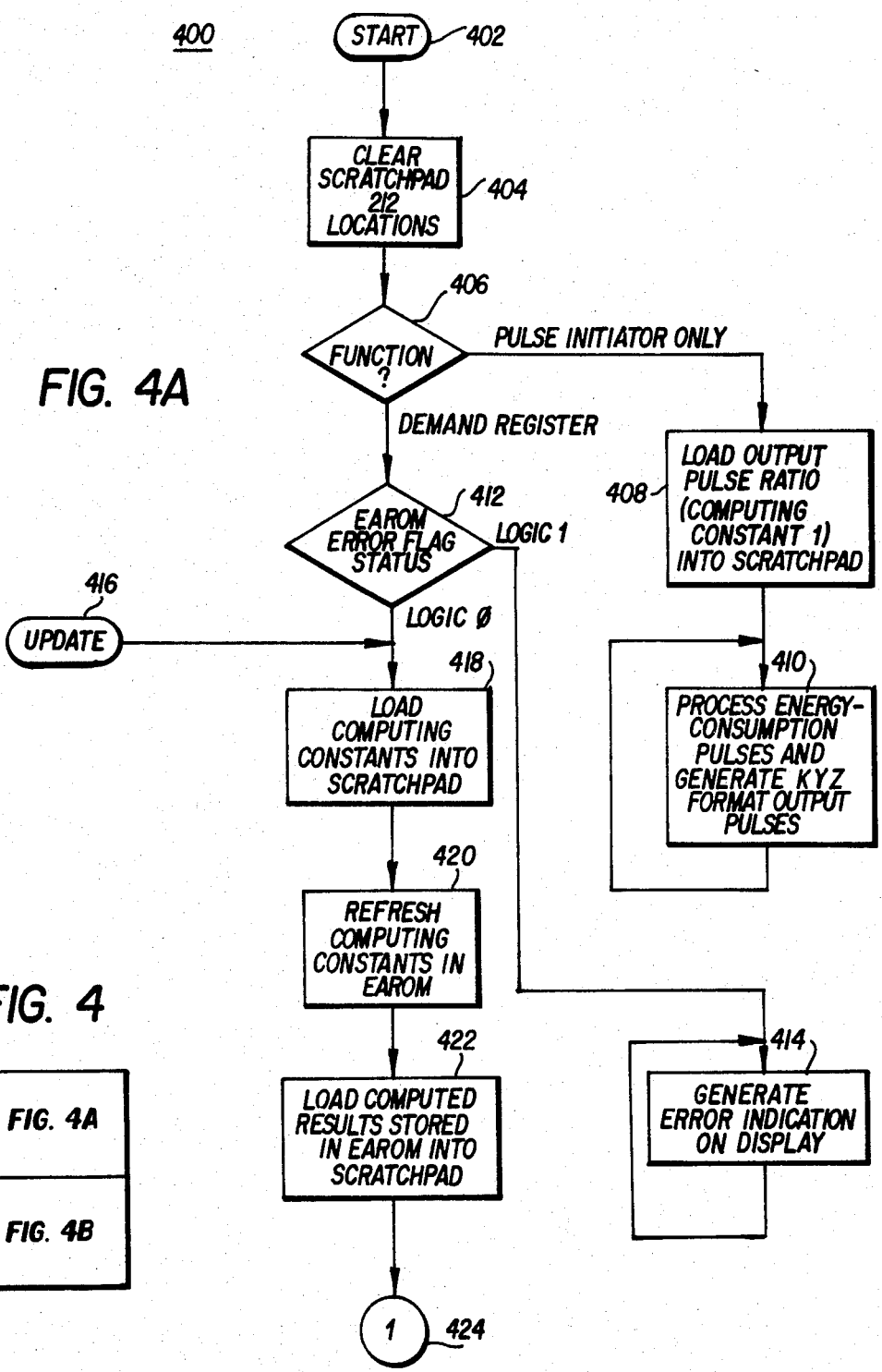
FIG. 4 shows diagrammatically the relationship of FIGS. 4A and 4B.
FIGS. 4A and 4B are a flow chart of main routine 400.
Figure 4B:
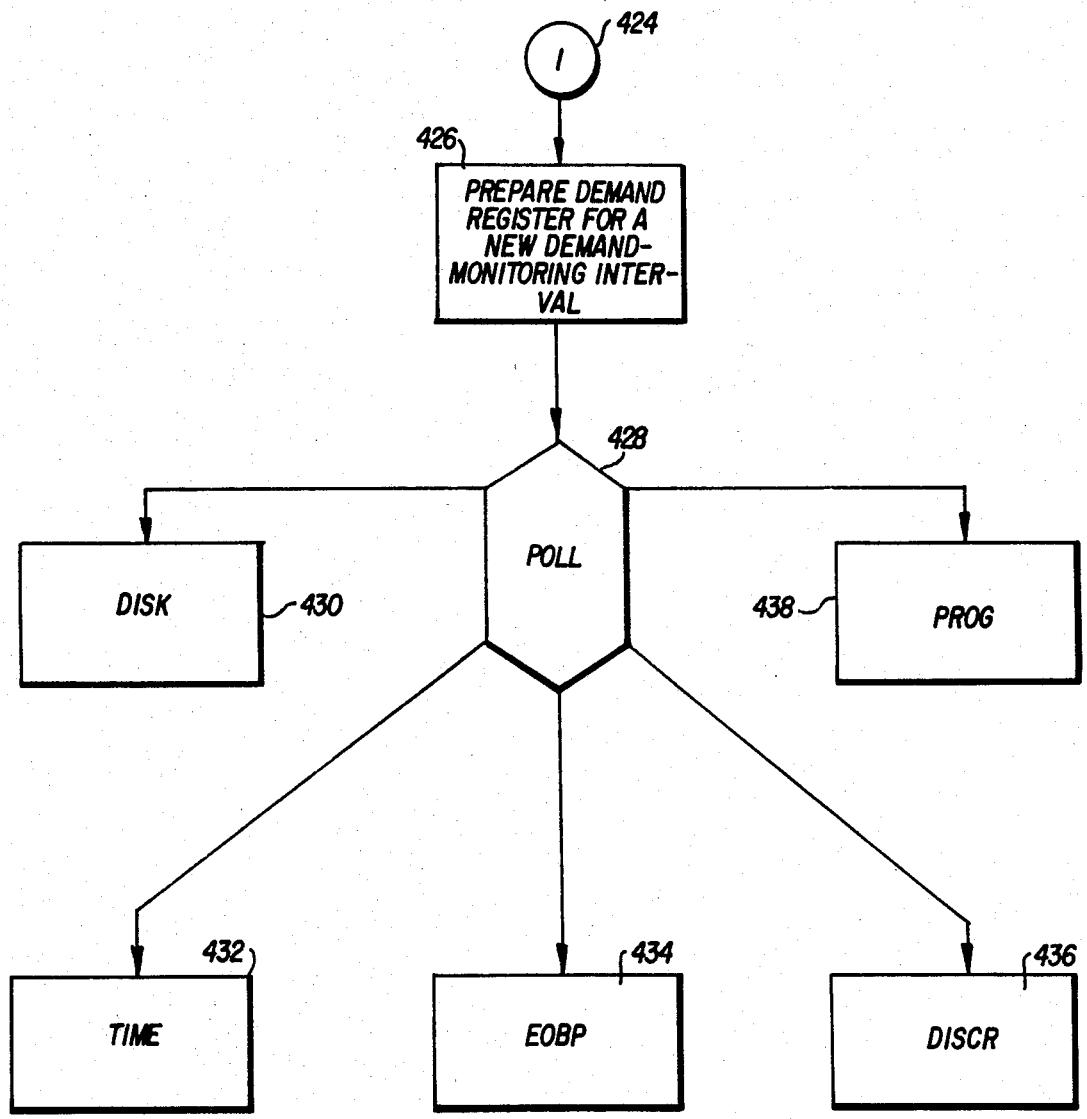

The main routine 400 of the operating program, which is stored in the read-only memory of microprocessor 100, is shown in flow chart form in FIG. 4, which comprises FIGS. 4A and 4B. Main routine 400 starts with an entry step 402, as shown in FIG. 4A. Next, scratchpad random-access memory 212 is cleared during operation step 404. After the scratchpad locations have been cleared in accordance with operation step 404, a decision is made at step 406 as to the function which solid-state demand register 10 is to perform.

There are two possible functions: solid-state demand register 10 can be dedicated only to generate a programmed number of pulses for each revolution of eddy-current disk 168; or register 10 can function as a true demand-register (which can also include provisions for generating a programmed number of pulses for each revolution of eddy-current disk 168). Decision step 406 checks the logic level present at data terminal 7 of input/output port P0. If this terminal of input/output port P0 is at logic 1, solid-state demand register 10 functions as a demand register. If this terminal is at logic 0, however, solid-state demand register 10 functions only as a pulse initiator and performs no demand-register operations.

If solid-state demand register 10 is to act only as a pulse initiator, nonvolatile read/write memory 152 is not required. In this case, the only constant which microprocessor 100 requires is constant 1 (pulse ratio), whose value can be fixed by means of wire jumpers connected between the appropriate data terminals of input/output port P1 and either +5 volts or ground.

If a pulse-initiator-only decision is made, constant 1 is loaded into scratchpad 212 by an operation step 408. Main routine 400 then proceeds to an operation step 410. During step 410, the energy-consumption pulses generated by optoelectronic pulse generator 148 prompt microprocessor 100 to generate and present to data terminal 5 of input/output port P0 the appropriate number of pulses for each pulse presented to data terminal 0 of input/ouput port P0 by optoelectronic pulse generator 148. Main routine 400 continues to loop through operation step 410 as long as solid-state demand register 10 is programmed to function only as a pulse initiator.

In generating pulses, microprocessor 100 determines what logic level is present at data terminal of input/output port P0. If, for example, this data terminal is at logic 1 and one pulse is to be generated, microprocessor 100 forces this line to logic 0. If line 5 of port P0 is at logic 0, and a pulse is to be generated, however, microprocessor 100 forces this line to logic 1. If yet another pulse is to be generated, microprocessor 100 toggles line 5 of input/output port P0 to its alternate state.

Referring again to FIG. 4, if terminal 7 of input/output port P0 is conected to +5 volts, decision step 406 determines that solid-state demand register 10 is to function as a true demand register. Accordingly, main routine 400 proceeds to a decision step 412, in which the status is checked of an error indication or flag stored in a designated location of nonvolatile read/write memory 152.

If this flag is at logic 1, a storage location in nonvolatile read/write memory 152 contains erroneous, uncorrectable data. In this case, an operation step 414 is performed, where an error indication (for example, flashing decimal points but darkened digits) is generated by display 132.

Main routine 400 loops back to operation step 414 so that the error indication is displayed continuously and no further data-processing steps are performed. This mode of operation continues until the register 10 is removed from service and the error flag is cleared by means of error-flag-clear terminals 104, as discussed above.

If the error flag is at logic 1, all of the data stored in nonvolatile read/write memory 152 are valid and the main routine 400 proceeds to an operation step 418. In operation step 418, the computing constants stored in nonvolatile read/write memory 152 are loaded into appropriate locations of scratchpad 212.

Next, an operation step 420 is performed to refresh the computing constants stored in nonvolatile read/write memory 152. Two designated locations of nonvolatile read/write memory 152 are associated with each stored computing constant or computed result. For purposes of the following discussion only, these locations can be designated location A and location B. Associated with locations A and B is a pointer flag which signifies which location is stored with currently valid data. Suppose that location A contains currently valid data for a particular computing constant. The flag then points to location A. To refresh these data, the data are written into location B. When valid data have been written into location B, the flag is changed to point to location B. This procedure, which is also followed when data stored in nonvolatile read/write memory 152 are to be changed, has been set up to ensure that valid data are stored in and are retrievable from nonvolatile read/write memory 152 even if a power failure occurs during a data-refresh or data-change cycle. The likelihood of loss of valid data to such an event is therefore minimized.

Accordingly, operation step 420 involves retrieving the computing-constants data stored in the memory locations denoted by the valid-data flags, writing these data into the appropriate alternate memory locations, and changing the status of the location-pointing, valid-data flags.

Main routine 400 then proceeds to an operation step 422 in which the noncumulative and cumulative electrical-power demand values stored in the appropriate locations of nonvolatile read/write memory 152 are loaded into scratchpad 212. When these values have been loaded, display 132 is updated with the computed-result data stored in scratchpad 212.

Thus, if solid-state demand register 10 is functioning in the cumulative mode, the computed cumulative electrical-power demand value stored in scratchpad 212 is displayed, but the noncumulative electrical-power demand value also stored in scratchpad 212 is not displayed. In contrast, if solid-state demand register 10 is functioning in the noncumulative and either the cumulative or the continuous-cumulative mode, the two values are alternately displayed by display 132.

Main loop 400 then proceeds via continuation label 424 to an operation step 426, as shown in FIG. 4B, in which solid-state demand register 10 is prepared for a new demand-monitoring interval. This preparation involves resetting to zero the current electrical-power demand value stored in scratchpad 212 and loading into scratchpad 212 data describing the lengths of the next demand-monitoring interval. Also, any flags in microprocessor 100 which require cleaning are cleared at this time.

Main routine 400 then proceeds to polling sequence 428, through which a DISK subroutine 430, a TIME subroutine 432, a DISCR or display-control subroutine 436, a EOBP or end-of-billing-period subroutine 434, and a PROG or programmer subroutine 438 are sequentially performed. Each of these subroutines are now considered in detail.

Figure 5:
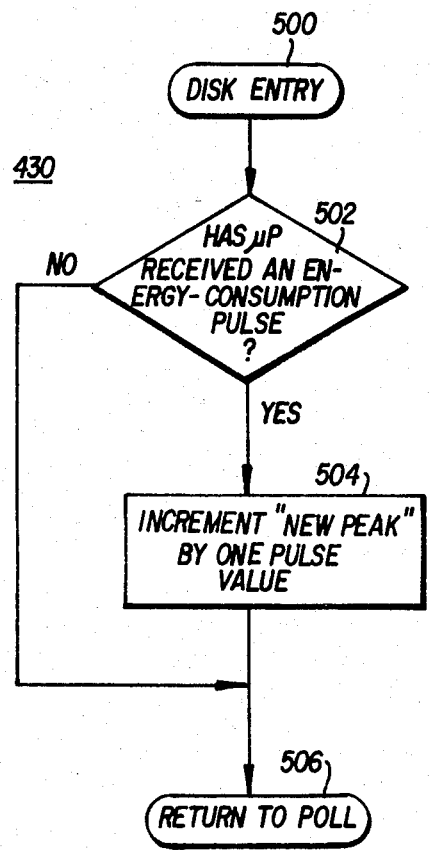
FIG. 5 is a flow chart of DISK subroutine 430.

FIG. 5 is a flow chart of the DISK subroutine 430 of main routine 400, as shown in flow-chart form in FIG. 5.

Briefly, DISK subroutine 430 increments the value of the power demand made during the current monitoring interval only if a pulse(s) has been received from the optoelectronic pulse generator 148 since the last time DISK subroutine 430 was passed through. DISK subroutine commences with an entry stage step 500. Next, a decision is made at a step 502 as to whether microprocessor 100 has received an energy-consumption pulse since the last time decision step 502 was executed. If no new energy-consumption pulse has been received, DISK subroutine 430 proceeds to a return-to-poll exit step 506, and the next subroutine of polling sequence 428 (see FIG. 4B) is entered.

If a new pulse has been received, however, the value of a variable NEWPEAK, which is stored in scratchpad 212, is incremented by a value related to one pulse received from optoelectronic pulse generator 148. NEWPEAK is a variable which describes the electrical-power demand being calculated during the current demand-monitoring interval. NEWPEAK is incremented in value by an amount in kilowatts equal to the incremental amount of power consumption signified by generation of one energy-usage pulse by optoelectronic pulse generator 148. NEWPEAK is calculated by multiplying the pulse by a demand constant $K_d$ (which has dimensions of kilowatts per pulse). $K_d$ is related to a pulse-energy constant $K_e$ (which has dimensions of watt-hours per pulse) which is equivalent to computing constant 3 stored in nonvolatile read/write memory 152. Constant $K_d$ can be calculated in accordance with the following equation:

$$K_d(kW/pulse) = [6 \times K_e(W\text{-}h/pulse)]/[T_D(h) \times 1000(W/kW)], \quad (1)$$

where $T_d$ is the length of the demand-monitoring interval in minutes. The incremental amount of power added to NEWPEAK is derived by multiplying the pulse received from optoelectronic pulse generator 148 by the constant $K_d$. After NEWPEAK has been so incremented during operation step 504, DISK subroutine is exited via exit step 506. Then, the next subroutine of polling sequence 428 is entered (see FIG. 4B).

Figure 6B:
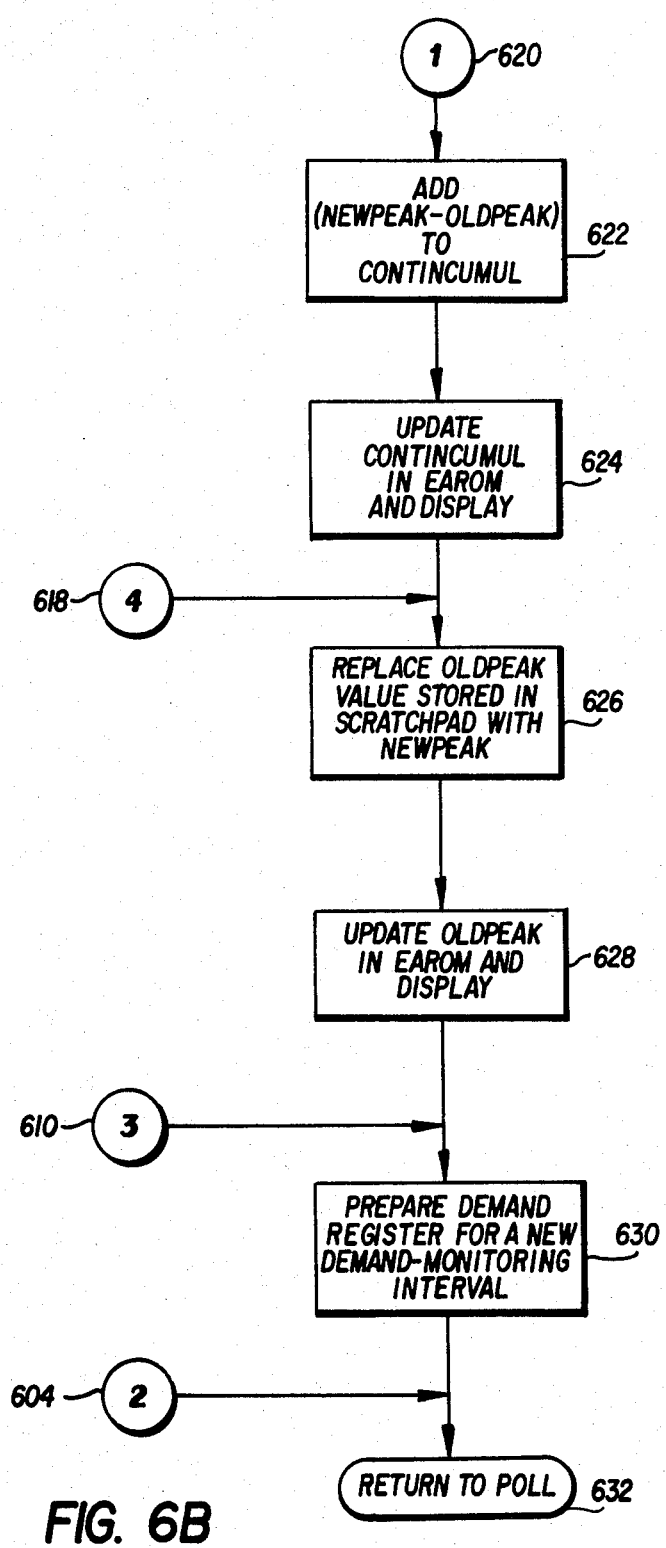

TIME subroutine 432 is shown in flow-chart form in FIGS. 6A and 6B. Briefly, TIME subroutine 432 causes a pulse to be generated if the demand monitoring interval is over, prepares register 10 for a new interval if the interval is over, and depending on the mode of register 10, it may update the NEWPEAK, OLDPEAK or CONTINCUMUL values. OLDPEAK is the highest electrical-power demand calculated since the last end-of-billing period pulse was generated and is stored in nonvolatile read/write memory 152. CONTINCUMUL is the continuous-cumulative demand value and is stored in nonvolatile read/write memory 52. CONTINCUMUL is the sum of the OLDPEAK values stored in nonvolatile read/write memory at the generation of each previous end-of-billing-period pulse and of the highest electrical-power demand calculated since the generation of the last end-of-billing-period pulse.

TIME subroutine 432 beings with an entry step 600. It then proceeds to a decision step 602, which determines whether the current demand-monitoring interval has just ended. If the interval is still in progress, the subroutine proceeds via continuation label 604 to an exit step 632 (FIG. 6B), by which it returns to polling sequence 428 (FIG. 4B).

If the demand-monitoring interval has just ended, however, an operation step 606 is performed. Here, microprocessor 100 is instructed to generate an end-of-interval pulse which appears at data terminal 2 of input/output port P0. Then, a decision step 608 is performed. Decision step 608 determines the status of a lockup flag in microprocessor 100. This lockup flag will have a value of logic 1 if computing constant 5 determines a fixed position for the decimal point of display 132 and if OLDPEAK exceeds the capacity of the fixed-decimal-point capabilities of display 132. If the lockup flag is at logic 1, the TIME subroutine 432 jumps to an operation step 630, which prepares demand register 10 for the next demand-monitoring interval. No further demand-calculating operations are performed, and then TIME subroutine 432 proceeds to a return-to-poll exit step 532, by which it enters the next subroutine of polling sequence 428 (see FIG. 4B).

If the lockup flag is at logic 0, however, an operation step 612 is performed. Here, NEWPEAK (now the demand calculated during the interval which just ended) is compared with the display capacity of display 132 to determine if that capacity has been exceeded by the newly calculated electrical-power demand. The lockup flag is set to logic 0 if the calculated electrical-power demand has not exceeded the capacity of display 132. Note that if computing constant 5 has a value which allows the decimal point to float, the lockup flag will never be set to logic 1.

After operation step 612 is performed, a decision is made at a step 614 as to whether the value of NEWPEAK exceeds that of OLDPEAK. If it does not, TIME subroutine 432 jumps via label 610 to operation step 630, in which the demand register is prepared for a new demand-monitoring interval, as discussed above.

If the value of NEWPEAK does exceed that of OLDPEAK, a decision step 616 is made to determine the value of computing constant 4, and thus the operating mode of solid-state demand register 10. If solid-state demand register 10 is functioning in the noncumulative or the cumulative mode or in both the noncumulative and cumulative modes, TIME subroutine 432 proceeds via continuation label 618 to an operation step 626. On the other hand, if solid-state demand register 10 is functioning in the continuous-cumulative mode or in both the noncumulative and continuous-cumulative modes, TIME subroutine 432 proceeds via continuation label 620 to an operation step 622. If TIME subroutine 432 jumps to operation step 626, the value of OLDPEAK as stored in scratchpad 212 is set equal to that of NEWPEAK (also stored in scratchpad 212). Then, in an operation step 628, the updated value of OLDPEAK is written into the appropriate location of nonvolatile read/write memory 152, and the associated pointing flag is changed to indicate that the valid OLDPEAK value is stored in the location of nonvolatile read/write memory 152 into which it has just been written. Also, in operation step 628, the value of OLDPEAK as displayed by display 132 is updated. After operation step 628, an operation step 630 is performed to prepare the demand register for the next demand-monitoring interval. Then, TIME subroutine 432 is exited via an exit step 632 and a return is made to polling sequence 428 (FIG. 4B).

If solid-state demand register 10 is operating in the continuous-cumulative mode or both the noncumulative and continuous-cumulative modes, the arithmetic operations described by operation step 622 are performed. Specifically, the value of OLDPEAK is subtracted from that of NEWPEAK, and the difference obtained is added to CONTINCUMUL, one of the computed results loaded into scratchpad 212 from nonvolatile read/write memory 152 in an operation step 422.

Note that CONTINCUMUL is the continuous-cumulative, electrical-power demand value: it is the summation of the highest electrical-power demand incurred during each of the prior billing periods, as well as of the highest electrical-power demand incurred since the beginning of the latest billing period. When the value of CONTINCUMUL stored in scratchpad 212 has been so increased, an operation step 624 is performed. The increased value of CONTINCUMUL is written into the appropriate location of nonvolatile read/write memory 152 and is provided to display 132 via input/output port P4 of microprocessor 100.

Next, operation step 626 is performed, in which the value of OLDPEAK stored in scratchpad 212 is replaced with that of NEWPEAK. When this is accomplished, the updated value of OLDPEAK is written into the appropriate location of nonvolatile read/write memory 152 and is provided to display 132 via input/output port P4 by means of operation step 628. Then, solid-state demand register 10 is prepared for a new demand-monitoring interval, as was done in operation 426 (see FIG. 4B). TIME subroutine 432 is then exited by means of step 632, and a return is made to polling sequence 428 (FIG. 4B).

Figure 7:
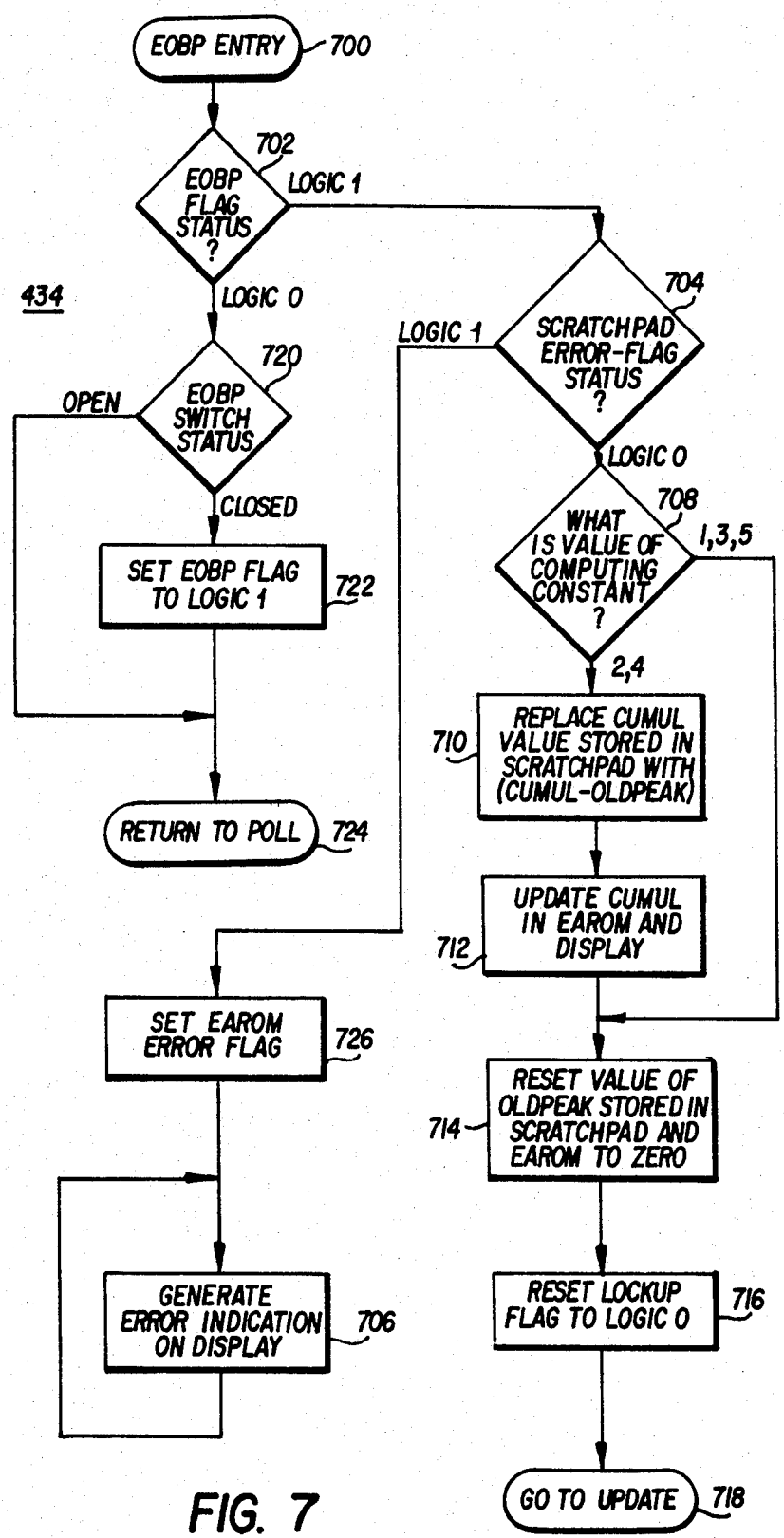
FIG. 7 is a flow chart of EOBP subroutine 434.

The EOBP or end-of-billing-period subroutine 434 is shown in flow chart form in FIG. 7. Briefly, EOBP subroutine 434 performs processing and housekeeping which should be performed at the end of a billing period.

EOBP subroutine 434 begins with an entry step 700. After step 700, a decision is made at a step 702 as to whether an EOBP flag within microprocessor 100 is at logic 1 or logic 0. If the EOBP flag is at logic 1, an end-of-billing-period pulse has been generated and decision is made at a step 704. In step 704, the status of an error flag stored in scratchpad 212 is checked. This flag is at logic 1 if data stored in scratchpad 212 have been detected to be erroneous. If the scratchpad error flag is logic 1, an operation step 726 is performed which sets the EAROM error flag location to a logic 1. Operation step 706 is then performed to generate a flashing error indication on display 132.

If the scratchpad error flag is at logic 0, however, a decision at a step 708 is made to determine the value of computing constant 4 (which determines the operating mode of solid-state demand register 10). If the value of computing constant 4 is 1, 3 or 5, the EOBP subroutine 434 jumps to an operation step 714, in which the value of OLDPEAK stored in scratchpad 212 and nonvolatile read/write memory 152 is reset to zero. Then the lockup flag in microprocessor 100 is reset to zero. (Note that this flag is at logic 0 unless the largest computed electrical-power demand exceeds the capacity of display 132.) Next, EOBP subroutine 434 is exited at a step 718 and main subroutine 400 is reentered via update label 416 (FIG. 4A).

If the value of computing constant 4 is 2 or 4, an operation step 710 is performed after decision step 708 has been made. In this step, the value of CUMUL that is stored in scratchpad 212 is replaced with the sum of CUMUL and OLDPEAK. CUMUL, the tally of the summed peak electrical-power demands for each billing period, is generated when solid-state demand register 10 is operating in the cumulative mode or both the noncumulative and cumulative modes.

After CUMUL has been updated in scratchpad 212, the updated value is written into the appropriate location of nonvolatile read/write memory 152 and is presented to display 132 via input/output port 4 by means of an operation step 712. Then, steps 714, 716 and 718, which were discussed previously, are performed.

If the EOBP flag is at logic 0, decision step 720 is made as to whether EOBP reset switch 102 is open or closed. If the switch is open (not being depressed), the subroutine is exited via step 724 and a return is made to polling sequence 428. If the switch is closed (currently being depressed while decision step 720 is being made), the EOBP flag is set in operation step 722, and then the subroutine is exited through exit step 724.

Figure 8:
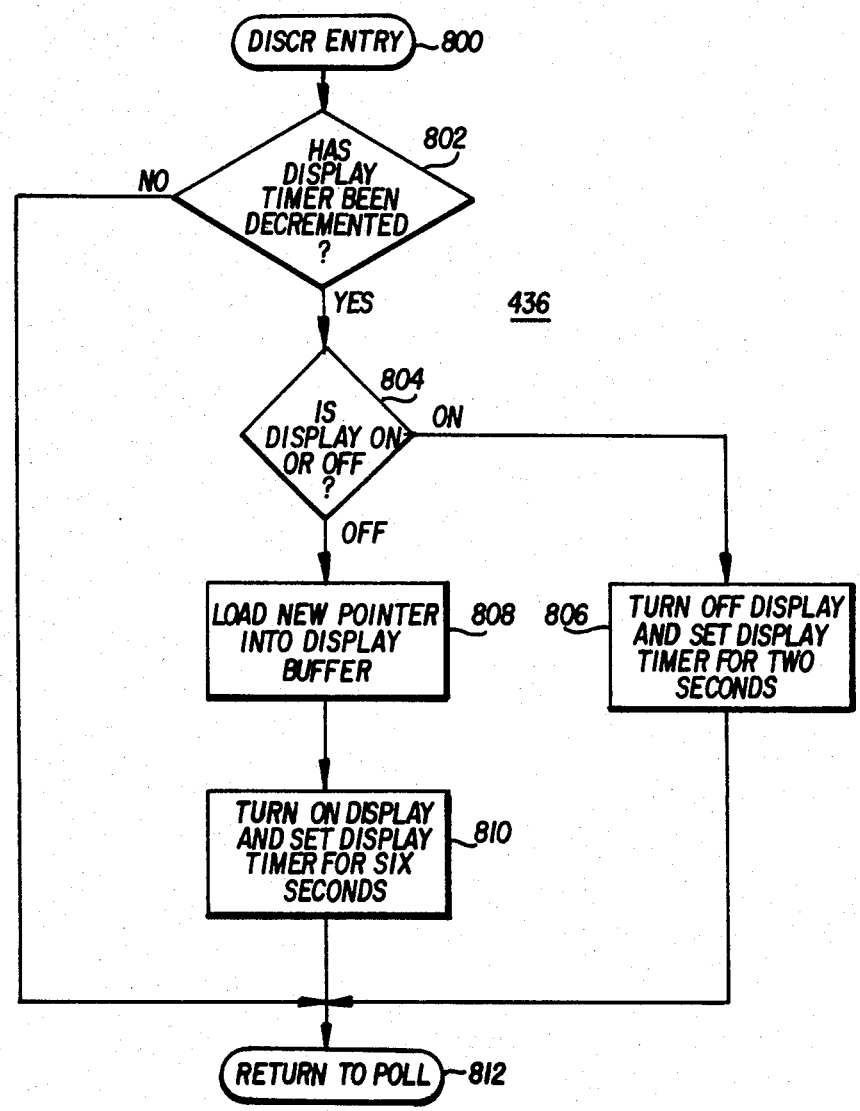
FIG. 8 is a flow chart of DISCR subroutine 436.

The DISCR or disk-control subroutine 436 is shown in flow-chart form in FIG. 8. Briefly, DISCR subroutine 436 controls the sequential activation and deactivation of display 132.

DISCR subroutine 436 is entered via an entry step 800. Next, a decision is made at a step 802 as to whether a display timer in microprocessor 100 has been decremented to zero by the train of pulses from power supply 156 applied to the external-interrupt input of microprocessor 100. If the display timer has not been decremented to zero, DISCR subroutine 436 is exited via an exit step 812 and a return is made to polling sequence 428 (see FIG. 4B). If the display timer has been decremented to zero, a decision is made at a step 804 as to whether display 132 is on or off (activated or deactivated).

If display 132 is on, an operation step 806 is performed to darken the display and to load into the display timer in microprocessor 100 data bits corresponding to a time period of two seconds. When operation step 806 is completed, the subroutine is exited via a step 812 and a return is made to polling sequence 428.

If the display is off at the time that decision step 804 is made, an operation step 808 is performed. Here, a display buffer in microprocessor 100 is loaded with a pointer which directs microprocessor 100 to present to input/output port P4 data bits describing the computer result which should be displayed. For example, if computing constant 5 is 1, the display buffer will be loaded with a pointer which directs the display of noncumulative power-demand data. If computing constant 5 is 4 or 5, solid-state demand register 10 has two operating modes. In this case, the display buffer is alternately loaded with a pointer directing the display first of noncumulative power-demand data and then of either cumulative or continuous-cumulative power-demand data.

The display buffer is also loaded at appropriate times with a pointer directing the presentation of display-test data to input/output port P4. After the display buffer has been loaded with the appropriate pointer, an operation step 810 is performed to turn on the display and load into the display timer data bits corresponding to a time period of six seconds. Then, the subroutine is exited via a step 812 and a return is made to polling sequence 428.

DISCR subroutine 436 sets out the following pattern of activation and deactivation of display 132. In a single-mode demand register, the appropriate computed demand is displayed for six seconds. Then display 132 is darkened for two seconds.

Next, a display test is performed in which all display segments and decimal points are lit for six seconds. This is followed by another two-second dark interval, and then the cycle repeats itself. In the case of a dual-mode register, noncumulative data is displayed for six seconds. The display is then darkened for two seconds. Next, either cumulative or continuous-cumulative demand data (whichever is appropriate) is displayed for six seconds and then display 132 is darkened for two seconds. Then, a six-second display test is performed, followed by a two-second dark interval. This cycle then repeats itself.

Figure 9:
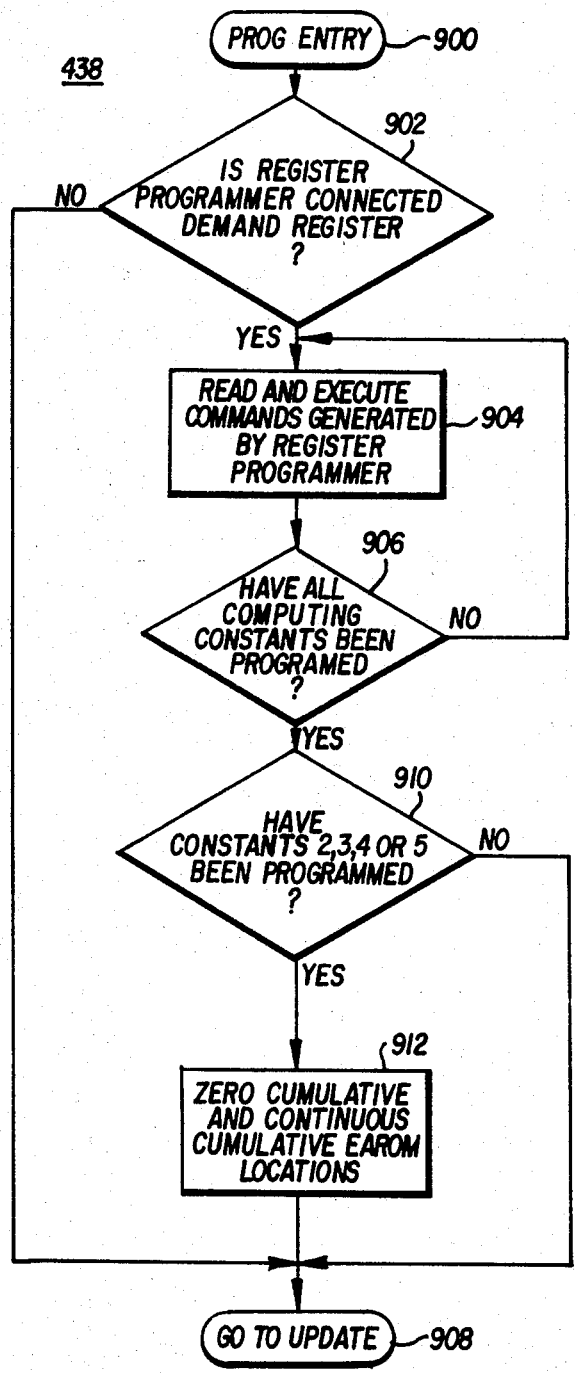
FIG. 9 is a flow chart of PROG subroutine 438.

The PROG or programmer subroutine 438 is shown in flow chart form in FIG. 9. In brief, PROG subroutine 438 determines whether register programmer 124 is connected to solid-state demand register 10 and, if it is, oversees the reading, loading, or altering the computing constants stored in nonvolatile read/write memory 152.

PROG subroutine 438 is entered via an entry step 900. Next, a decision step 902 is made to determine whether register programmer 124 is connected to the appropriate data lines of input/output port P0. If register programmer 124 is not connected, PROG subroutine is exited via step 908 and a return to main routine 400 via an update label 416 (see FIG. 4A) so that the stored data can be loaded into scratchpad 212 and refreshed in nonvolatile read/write memory 152. If register programmer 124 is connected to terminals 4 and 6 of input/output port P0, an operation step 904 is performed. Here, the commands generated by register programmer 124 are read and executed. These commands were discussed above. Briefly, they allow either the display or alteration and display of the computing constants currently stored in nonvolatile read/write memory 152.

When these commands have been read and executed, PROG subroutine 438 proceeds to a decision step 906, which determines whether all of the necessary computing constants have stored values. If one or more of the necessary computing constants has no stored value, PROG subroutine 438 loops back to operation step 904 so that the deficiency can be remedied. When all necessary computing constants have been programmed, PROG subroutine 438 proceeds to decision block 910. If any of the constants 2–5 have been programmed then PROG subroutine 438 proceeds to perform operation step 912. Here the cumulative and continuous-cumulative EAROM storage locations are set to zero. PROG subroutine 438 is then exited via a step 908 and a return is made to main routine 400 via an input label 416 (see FIG. 4A) so that the stored data can be loaded into scratchpad 212 and refreshed in nonvolatile read/write memory 152.

Figure 10:
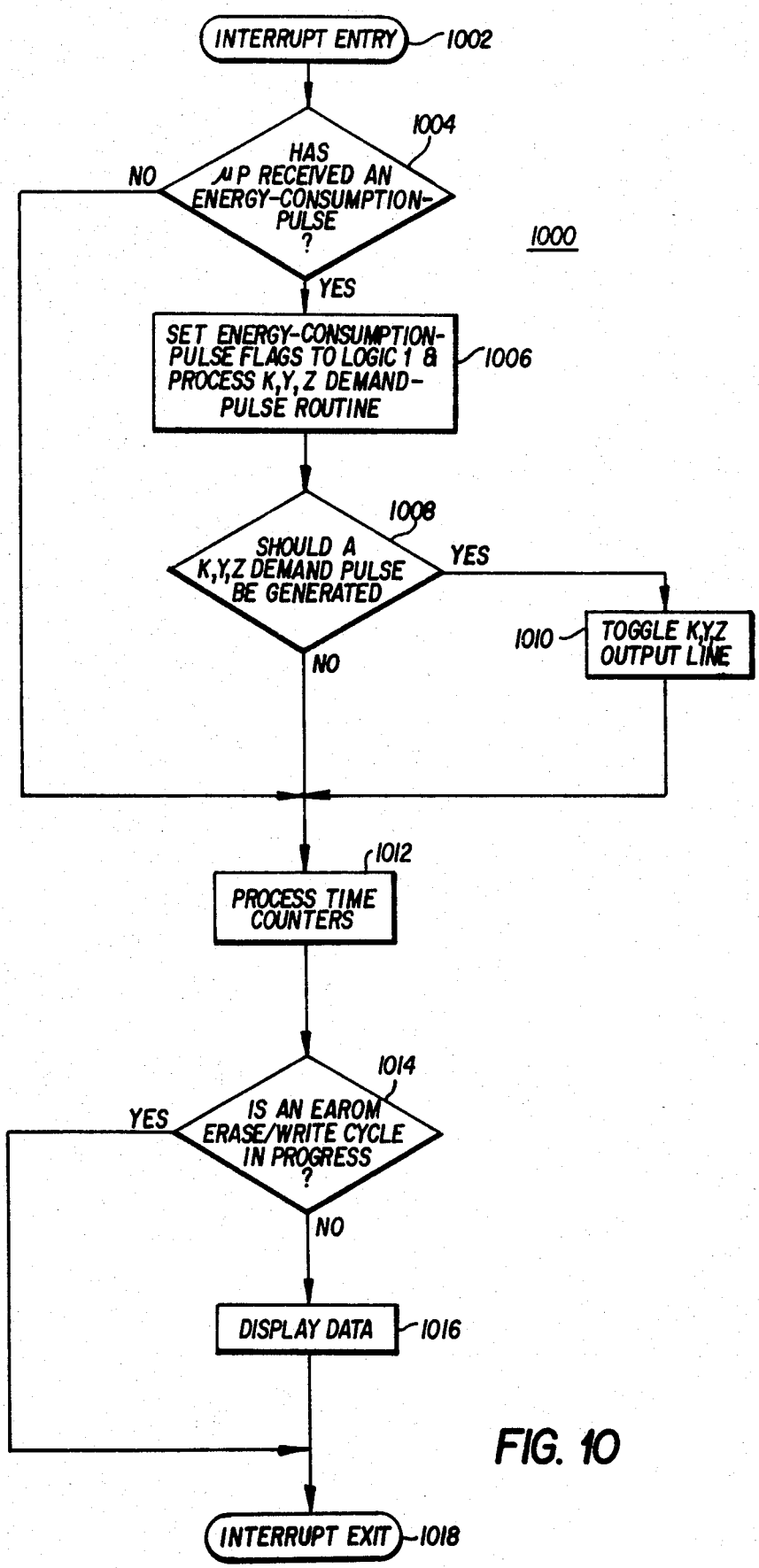
FIG. 10 is a flow chart of timekeeping interrupt subroutine 1000.

Timekeeping interrupt subroutine 1000 is shown in flow chart form in FIG. 10. Briefly, interrupt subroutine 1000 oversees the generation of demand pulses by pulse initiator 116, the measurement of time by counters internal to microprocessor 100, and the multiplexing of display 132.

Figure 2:
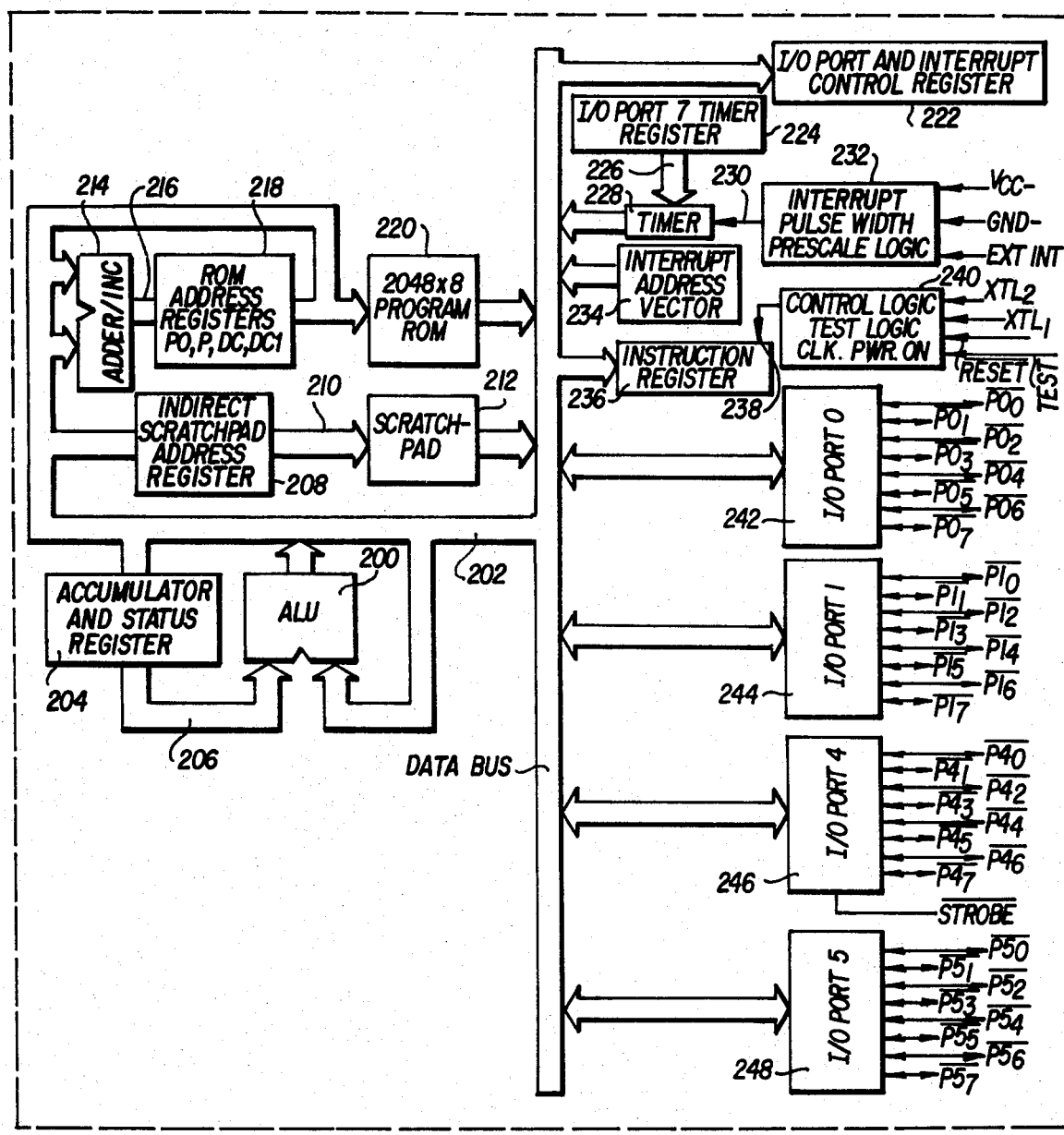
FIG. 2 is a functional block diagram of a preferred embodiment of microprocessor 100.

Interrupt subroutine 1000 is entered via an entry step 1002 each time an alternating current mains-derived interrupt pulse is applied to the external-interrupt input of microprocessor 100 in accordance with the interrupt logic discussed in connection with microprocessor 100 as illustrated in FIG. 2. Next, a decision step 1004 determines whether optoelectronic pulse generator 148 has applied an energy-consumption pulse to data terminal 0 of input/output port P0. If no energy-consumption pulse has been applied, the subroutine jumps to an operation step 1012, in which the time counters internal to microprocessor 100 are clocked to reflect the fact that a time interval equal to one period of the alternating current mains waveform (16.7 milliseconds) has elapsed.

After the time counters have been so processed, a decision step 1014 is made as to whether data are being erased from or written into nonvolatile read/write memory 152. If an erase/write cycle is in progress, the interrupt is exited via a step 1018. When interrupt subroutine 1000 is exited, the next appropriate step of main routine 400 or the subroutine in progress when the interrupt pulse was received is performed. If an erase/write cycle is not in progress, an operation step 1016 is performed so that data is presented to display 132. Because operation step 1016 is within interrupt subroutine 1000, display 132 is multiplexed at a flicker-free 60 Hertz rate. After step 1016 is performed, the interrupt subroutine is exited via step 1018 and the next appropriate step in main routine 400 or the appropriate other subroutine is performed.

If decision step 1004 determines that an energy-consumption pulse has been applied to terminal 0 of input/output port P0, operation step 1006 is performed. This involves setting energy-consumption-pulse flags in microprocessor 100 to logic 1 and processing a routine governing the generation of electrical-power demand pulses in KYZ format. These pulses appear at the KYZ outputs of pulse initiator 116. In this routine, the value of computing constant 1 is evaluated and KYZ output pulses are generated.

After these pulses are generated, a decision 1008 is made. If the number of KYZ pulses equals the value of computing constant 1, a YES decision is reached and the subroutine proceeds to operation step 1010. Should an additional KYZ pulse be needed to equal the value of computing constant 1, a NO decision is made and an operation step 1012 is performed to toggle data terminal 5 of input/output port P0 one more time. When this data line is toggled, the subroutine proceeds to operation 1012.

Decision step 1014 is included because, as noted earlier, data terminals 0–3 of input/output port P5 provides both digit-enable signals for display drivers 138 as well as the lower four address bits of nonvolatile read/write memory 152. If an erase/write cycle is in progress, display 132 is not activated. Display 132 is only activated when an erase/write cycle is not in progress.

Figure 11:
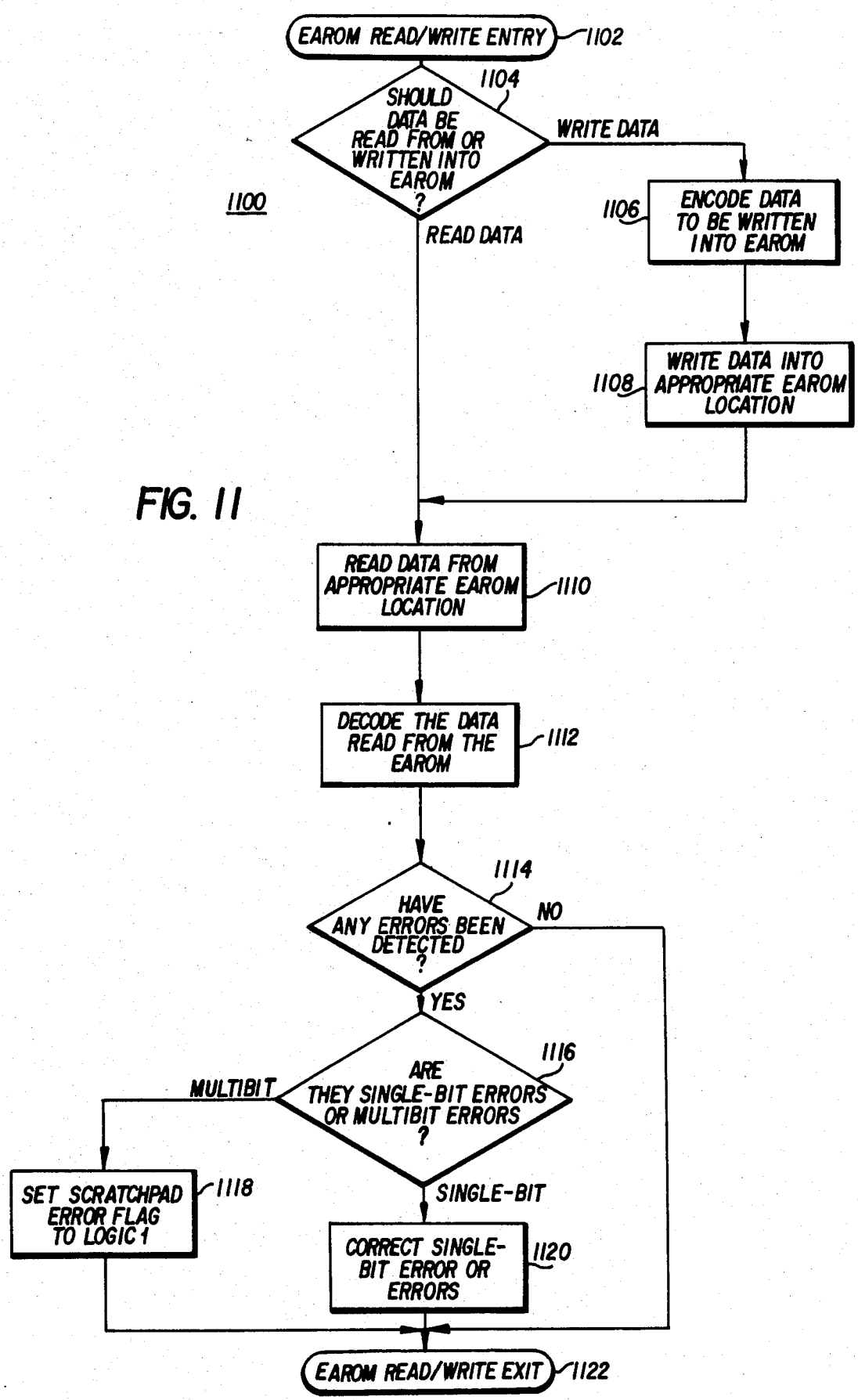
FIG. 11 is a flow chart of error-detecting and error-correcting subroutine 1100.

Subroutine 1100, which is followed when data is to be read from or written into nonvolatile read/write memory 152, is shown in flow-chart form in FIG. 11. Briefly, subroutine 1100 sets forth the procedure followed when data are to be written into or read from nonvolatile read/write memory 152. It should be noted that, to write data into a location of nonvolatile read/write memory 152, that location must first be erased. It takes, for example, 50 milliseconds to erase a location of nonvolatile read/write memory 152, and another 50 milliseconds then to write data into that memory location. Erase and write times are derived from timekeeping interrupt subroutine 1000.

Subroutine 1100 is entered via an entry step 1102. Subroutine 1100 then proceeds to a decision step 1104, in which it is determined whether data are to be read from or written into nonvolatile read/write memory 152. If data are to be written, an operation step 1106 is performed to encode the data to be written into the eight-bit, Hamming-code format employed for error-detection and error-correction purposes.

Hamming codes are means of detecting and correcting data-bit errors. A Hamming code is generated by calculating a parity bit for certain combinations of data bits. The code bits are appended to the data bits and are stored in a memory device. When the memory device is read, new code bits are generated from the data bits that have been read, and the new code bits are compared to the code bits read from the memory device. The result of this comparison determines the action to be taken on the data bits.

In the present invention, an expanded eight-bit Hamming code has been developed and employed. The eight-bit Hamming code can detect and correct particular errors. Specifically, it can detect and correct all single-bit errors. It can also detect all double-bit errors and most multiple-bit errors. It cannot correct double-bit or multibit errors.

Code bits are calculated based on the parity of selected data bits. In the present invention, for example, the four most significant bits of a given data word are the code bits. The four least significant bits are the data bits. The word format is as follows: C3-C2-C1-C0-D3-D2-D1-D0, where CN is a code bit and DN is a data bit. The data bits involved in parity calculation are as follows:

C0 is an odd-parity bit for the combination D2-D1-D0;

C1 is an odd-parity bit for the combination D3-D2-D0;

C2 is an odd-parity bit for the combination D3-D2-D1; and

C3 is an odd-parity bit for the combination D3-D1-D0.

In the present invention, parity-bit calculation is performed by consulting a table to determine the parity bit appropriate for a given grouping of data bits.

After the data have been so encoded, they are written into the appropriate location of nonvolatile read/write memory 152 by an operating step 1108. After operation step 1108 is performed, or if it is determined in decision step 1104 that data are not to be written into nonvolatile read/write memory 152; an operation step 1110 is performed. Here, the data are read from the appropriate location of nonvolatile read/write memory 152.

In the case where data are being written into nonvolatile read/write memory 152, this and the following steps constitute a read-after-write and validity-verification sequence. The data that were just written into nonvolatile read/write memory 152 will be read and evaluated to see if the proper data have been written into that location of nonvolatile read/write memory 152. This makes possible the detection of multibit errors that would not be detected by the Hamming code.

After the data have been read from the appropriate location of nonvolatile read/write memory 152 in operation step 1110, the read data are then decoded using the Hamming-code technique in an operation step 1112. When operation step 1112 has been completed, a decision step 1114 is made as to whether any errors have been detected. In the case of a write operation, the Hamming code bits of the data received from the appropriate location of nonvolatile read/write memory 152 are determined. Then, the Hamming code bits of the corresponding data stored in scratchpad 212 are determined. The two sets of code bits are then compared. If they are identical, no bit errors have been introduced by the writing of the data into the appropriate location of nonvolatile read/write memory 152.

If decision step 1114 determines that no errors have been detected, subroutine 1100 is exited via an exit step 1122. If, however, decision step 1114 determines that an error or errors have been detected, a decision step 1116 is made. Decision step 1116 determines whether the detected error or errors are of the single-bit or multibit type.

If the detected error or errors are of the multibit type, it or they cannot be corrected. Accordingly, an operation step 1118 is performed. Operation step 1118 sets the error flag stored in scratchpad memory 212 to logic 1 to signal that the nonvolatile read/write memory 152 contains uncorrected or uncorrectable erroneous data.

After operation step 1118 is performed, the routine is exited via exit step 1112. If, however, decision step 1116 determines that a single-bit error or errors have been detected, an operation step 1120 is performed to correct the single-bit error or errors. When operation step 1120 is completed, the routine is exited via exit step 1122.

Numerous modifications and variations of the present invention are possible in light of the above teachings. It is therefore to be understood that within the scope of the appended claims, the invention may be practiced otherwise than as specifically described herein.

SOFTWARE LISTINGS

```
;
;
;
;
; COPYRIGHT © 1981 SANGAMO WESTON, INC.  ALL RIGHTS RESERVED.
;
; THIS PROGRAM WAS ASSEMBLED ON A TELETRONIX MODEL 8002 DEVELOPMENT
; SYSTEM USING A 3870 PROCESSOR AND ASSEMBLER VERSION 3.3.
;
;
;
NAME      INIT
          SECTION  INIT,ABSOLUTE
GLOBAL    ENCODE,WRITE,READ,DECODE,EOM4,RDVAL,START,UPDATE
GLOBAL    ADDR2
          ;
;
;         THIS ROUTINE SERVES TO INITIALIZE THE PROCESSOR TO A KNOWN
;UPON POWER UP.  THIS ROUTINE ALSO DETERMINES WHETHER THE CIRCUIT
;BOARD THE PROCESSOR IS INSTALLED ON IS A DEMAND REGISTER OR AN
;SPI.  IF IT IS AN SPI BOARD THEN THE PULSE RATIO IS LOADED AND THE
;PROCESSOR LOOPS INDEFINITELY.  THIS ROUTINE ALSO CHECKS FOR THE ERROR
;LOCKUP CONDITION.  SHOULD IT BE PRESENT THEN THE REGISTER IS LOCKED
;UP.  A MEANS OF CLEARING THE ERROR LOCKUP FLAG IS ALSO PROVIDED BY
;THIS ROUTINE.
;
                 ;
                 ORG      C000H
60       START   LISU     ZERO     ;CLEAR RAM.
6F               LISL     SEVEN
70               CLR
5D       INT3    LR       I,A
8FFE             BR7      INT3
61               LISU     ONE
5D       INT4    LR       I,A
8FFE             BR7      INT4
64               LISU     BUFF3
5D       INT6    LR       I,A
8FFE             BR7      INT6
65               LISU     BUFF4
.5D      INT7    LR       I,A
8FFE             BR7      INT7
66               LISU     BUFF5
5D       INT5    LR       I,A
8FFE             BR7      INT5
71               LIS      01H
B6               OUTS     6
70               CLR               ;LOAD ZERO.
5B               LR       R11,A    ;CLEAR DATA REGISTER.
B0               OUTS     0        ;CLEAR PORT.
A0               INS      0        ;READ PORT.
50               LR       R0,A     ;STORE FOR LATER USE.
2080             LI       80H      ;LOAD SPI ONLY DEVICE MASK.
F0               NS       R0       ;MASK IN SPI ONLY SELECT BIT.
70               CLR               ;LOAD ZERO.
840A             BZ       INT2     ;NOT AN SPI ONLY DEVICE.
B1               OUTS     1        ;CLEAR INPUT PORT.
A1               INS      1        ;READ PULSE RATIO.
```

```
65              LISU    BUFF4    ;LOAD POINTER TO METER 3 BUFFER AREA.
6C              LISL    FOUR     ;POINTER POINTS TO PULSE RATIO STORAGE.
5C              LR      S,A      ;STORE IN BUFFER.
1B              EI               ;ENABLE INTERRUPTS.
4D      INT8    LR      A,I      ;LOAD A VALUE TO BE STORED IN THE
90FE            BR      INT8     ;LOOP INDEFINITELY.
78      INT2    LIS     08H      ;LOAD FLAG CLEAR MASK.
F0              NS      R0       ;MASK IN FLAG CLEAR INPUT BIT.
202F            LI      ERRFLG   ;LOAD ADDRESS OF ERROR FLAG.
5A              LR      R10,A    ;STORE FOR LATER USE.
8407            BZ      INT1     ;IF ZERO THEN ERROR FLAG CLEAR INPUT
2803AC          PI      ENCODE   ;ENCODE FLAG.
280752          PI      WRITE    ;WRITE FLAG INTO EAROM.
2806B5  INT1    PI      READ     ;READ ERROR FLAG.
280280          PI      DECODE   ;DECODE DATA READ.
7F              LIS     0FH      ;LOAD ERROR FLAG MASK.
FB              NS      R11      ;MASK IN ERROR FLAG.
8404            BZ      INT9     ;IF ZERO THEN FLAG NOT SET.
29054F          JMP     EOM4     ;FLAG IS SET.  LOCK UP REGISTER.
50      INT9    LR      R0,A     ;LOAD ZERO INTO PORT BUFFER.
290131          JMP     UPDATE   ;REFRESH AND LOAD ALL CONSTANTS AND
        ;
        ;
                NAME    ADD
        SECTION ADD
        ;
        ;
        ;      THIS ROUTINE IS A GENERAL PURPOSE TWO BYTE DECIMAL ADDITION
        ;DATA IS ACCESSED THROUGH POINTERS SET UP PRIOR TO CALLING THIS
        ;RAM ASSIGNMENTS ARE:
        ;       71 : CARRY IN, CARRY OUT VALUE;
        ;       72 : SECOND OPERAND AND DESTINATION POINTER;
        ;       73 : FIRST OPERAND POINTER.
        ;
        ;
69              LISL    ONE      ;POINTER POINTS TO ISAR STORAGE.
4D              LR      A,I      ;LOAD CARRY IN VALUE.
5A              LR      R10,A    ;STORE TEMPORARILY.
4D              LR      A,I      ;LOAD POINTER TO RESULT STORAGE
5B              LR      R11,A    ;STORE FOR FUTURE USE.
4D              LR      A,I      ;LOAD POINTER TO FIRST OPERAND.
0B              LR      IS,A     ;TRANSFER POINTER TO ISAR.
4C              LR      A,S      ;LOAD OPERAND.
2466            AI      66H      ;PREPARE FOR DECIMAL ADDITION.
DA              ASD     R10      ;ADD IN CARRY IN VALUE.
5A              LR      R10,A    ;STORE TEMPORARILY.
4B              LR      A,R11    ;LOAD POINTER TO SECOND OPERAND.
0B              LR      IS,A     ;TRANSFER POINTER TO ISAR.
70              CLR              ;LOAD ZERO.
9202            BNC     ADD1     ;NO CARRY OUT.
71              LIS     01H      ;LOAD CARRY OUT VALUE.
5B      ADD1    LR      R11,A    ;STORE FOR NEXT ITERATION.
4C              LR      A,S      ;LOAD SECOND OPERAND.
2466            AI      66H      ;PREPARE FOR DECIMAL ADDITION.
DA              ASD     R10      ;ADD IN EARLIER TEMPORARY RESULTS.
5C              LR      S,A      ;STORE RESULT IN BUFFER.
9203            BNC     ADD2     ;NO CARRY OUT.
71              LIS     01H      ;LOAD CARRY OUT VALUE.
5B              LR      R11,A    ;STORE FOR NEXT ITERATION.
67      ADD2    LISU    BUFF6    ;LOAD POINTER TO GENERAL PURPOSE BUFFER
69              LISL    ONE      ;POINTER POINTS TO CARRY IN LOCATION.
4B              LR      A,R11    ;RETRIEVE CARRY OUT.
5D              LR      I,A      ;STORE IN CARRY IN BUFFER LOCATION.
1C              POP              ;RETURN.
        ;
        ;
```

```
NAME    DECSEG
SECTION DECSEG
;
;
;       THIS ROUTINE UPDATES THE DISPLAY SEGMENT BUFFER.  A BUFFER
;TWO WORDS CONTAINING PACKED DECIMAL DIGITS, AND ONE WORD CONTAINING
;THE DECIMAL POINT POSITION ARE PASSED TO THIS ROUTINE WHICH UNPACKS
;THE DECIMAL DIGITS, LOCATES THE DECIMAL POINT IN RELATION TO THE
;FOUR DIGITS JUST UNPACKED, AND PLACES THE INFORMATION IN THE
;DISPLAY SEGMENT BUFFER.
;
;
02              LR      A,QU    ;RESTORE SELECTED ISAR VALUE.
0B              LR      IS,A    ;ISAR RESTORED.
03              LR      A,QL    ;LOAD MSW.
21F0            NI      0F0H    ;MASK IN FIRST DIGIT.
1F              INC             ;TURN OFF DECIMAL POINT.
5D              LR      I,A     ;STORE IN BUFFER.
03              LR      A,QL    ;LOAD MSW.
15              SL      4       ;MASK IN SECOND DIGIT.
1F              INC             ;TURN OFF DECIMAL POINT.
5D              LR      I,A     ;STORE IN BUFFER.
4A              LR      A,R10   ;LOAD LSW.
21F0            NI      0F0H    ;MASK IN THIRD DIGIT.
1F              INC             ;TURN OFF DECIMAL POINT.
5D              LR      I,A     ;STORE IN BUFFER.
4A              LR      A,R10   ;LOAD LSW.
15              SL      4       ;MASK IN FOURTH DIGIT.
1F              INC             ;TURN OFF DECIMAL POINT.
5D              LR      I,A     ;STORE IN BUFFER.
02              LR      A,QU    ;LOAD SELECTED ISAR VALUE.
213C            NI      3CH     ;MASK OUT DIGIT SELECT BITS.
EB              XS      R11     ;MASK IN DECIMAL POINT SELECT
0B              LR      IS,A    ;LOAD ISAR.
71              LIS     01H     ;LOAD DECIMAL POINT CODE.
EC              XS      S       ;SET DECIMAL POINT.
5C              LR      S,A     ;SAVE SEGMENT AND DECIMAL POINT CODE.
1C              POP             ;RETURN.
;
;
NAME    ERROR
SECTION ERROR
;
;
;       THIS ROUTINE SETS THE APPROPRIATE ERROR FLAG WHEN AN ERROR
;DETECTED BY THE HAMMING CODE ROUTINE, * DECODE *.  TWO FLAGS MAY
;BE SET, ONE FOR A MULTIBIT DATA ERROR, AND THE SECOND FOR A MULTIBIT
;FLAG ERROR.
;
;
0A              LR      A,IS    ;SAVE ISAR VALUE.
66              LISU    BUFF5   ;LOAD POINTER TO GENERAL PURPOSE BUFFER
6B              LISL    THREE   ;POINTER POINTS TO ISAR STORAGE.
5C              LR      S,A     ;STORE ISAR.
48              LR      A,R8    ;LOAD FLAG BIT REGISTER.
2110            NI      10H     ;MASK IN FLAG BIT.
8407            BZ      ERR2    ;FLAG SET.  DO NOT GENERATE AN ERROR.
48              LR      A,R8    ;LOAD WRITE BEFORE READ BIT.
2208            OI      08H     ;SET ERROR BIT.
58              LR      R8,A    ;STORE BIT.
9005            BR      ERR1    ;RETURN.
6A      ERR2    LISL    TWO     ;POINTER POINTS TO ERROR BYTE.
20FF            LI      0FFH    ;LOAD FLAG VALUE.
5D              LR      I,A     ;STORE FLAG.
4C      ERR1    LR      A,S     ;LOAD PREVIOUS ISAR.
0B              LR      IS,A    ;RESTORE ISAR VALUE.
1C              POP             ;RETURN.
;
;
```

NAME INTRPT
SECTION INTRPT,ABSOLUTE
;
;
; THIS ROUTINE PROCESSES THE REAL TIME 60 HZ SIGNAL FROM THE
;LINE. DURING EACH 16.7 MSEC TIME SLOT, THE PULSE INPUT LINE
;IS POLLED AND THE DISPLAYS ARE SEQUENCED. DISPLAYS ARE SEQUENCED
;ONLY IF AN EAROM ERASE/WRITE CYCLE IS NOT IN PROGRESS. PULSE INPUT
;LINE IS POLLED IRREGARDLESS OF THE EAROM STATUS.
;
;

```
00A0                  ORG      00A0H       ;VECTOR ADDRESS FOR EXTERNAL INTERRUPTS.
06                    LR       QU,A        ;SAVE STATE OF ACCUMULATOR.
1E                    LR       J,W         ;SAVE STATE OF STATUS REGISTER.
0A                    LR       A,IS        ;SAVE STATE OF ISAR.
07                    LR       QL,A        ;STATE OF ISAR SAVED.
40                    LR       A,R0        ;LOAD CURRENT VALUE OF PORT 0.
B0                    OUTS     0           ;PORT CLEARED.
A0                    INS      0           ;READ PORT.
2101                  NI       01H         ;MASK IN DISK BIT.
48                    LR       A,R8        ;CHECK LEVEL BIT.
941C                  BNZ      INT8        ;NO INPUT YET.
2180                  NI       80H         ;MASK IN LEVEL BIT.
941B                  BNZ      INT7        ;BIT SET. NOT A NEW PULSE.
48                    LR       A,R8        ;SET UP LEVELL DETECT BIT.
2280                  OI       80H         ;LEVEL SET.
58                    LR       R8,A        ;STORE LEVEL.
65                    LISU     BUFF4       ;LOAD POINTER TO METER 3 BUFFER AREA.
6C                    LISL     FOUR        ;POINTER POINTS TO PULSE INCREMENT VALUE.
4D                    LR       A,I         ;LOAD INCREMENT VALUE.
19                    LNK                  ;CHECK FOR SPECIAL PULSE RATIO.
8407                  BZ       INT9        ;SPECIAL RATIO PRESENT.
2466                  AI       66H         ;PREPARE FOR DECIMAL ADDITION.
DC                    ASD      S           ;ADD IN PULSE ACCUMULATOR VALUE.
5C                    LR       S,A         ;STORE VALUE IN BUFFER.
920B                  BNC      INT7        ;NO CARRY OUT, NOT ZERO, THEREFORE NO
40       INT9         LR       A,R0        ;LOAD CURRENT VALUE OF PORT 0.
2320                  XI       20H         ;TOGGLE KYZ OUTPUT BIT.
50                    LR       R0,A        ;STORE VALUE OUTPUT.
B0                    OUTS     0           ;OUTPUT DATA.
9004                  BR       INT7        ;START INTRPT PROCESSING.
217F     INT8         NI       7FH         ;RESET LEVEL BIT.
58                    LR       R8,A        ;STORE LEVEL BIT.
34       INT7         DS       R4          ;DECREMENT EAROM ERASE/WRITE TIMER.
35                    DS       R5          ;DECREMENT 16.7 MSEC COUNTER.
9413                  BNZ      INT1        ;ONE SECOND HAS NOT ELAPSED YET.
203C                  LI       3CH         ;RELOAD 16.7 MSEC COUNTER.
55                    LR       R5,A        ;COUNTER LOADED.
33                    DS       R3          ;DECREMENT DISPLAY COUNTER.
36                    DS       R6          ;DECREMENT SECONDS COUNTER.
940C                  BNZ      INT1        ;SIXTY SECONDS HAS NOT ELAPSED YET.
203C                  LI       3CH         ;RELOAD SECONDS COUNTER.
56                    LR       R6,A        ;COUNTER LOADED.
2066                  LI       66H         ;LOAD DECIMAL PREPARATION VALUE.
C7                    AS       R7          ;ADD IN DECIMAL VALUE.
57                    LR       R7,A        ;STORE TEMPORARILY.
2099                  LI       99H         ;LOAD DECREMENT VALUE.
D7                    ASD      R7          ;ADD DECREMENT VALUE TO MINUTES TIMER.
57                    LR       R7,A        ;STORE RESULT FOR LATER USE.
41       INT1         LR       A,R1        ;CHECK FOR EAROM ERASE/WRITE MODE.
2140                  NI       40H         ;MASK OUT ALL BITS EXCEPT C1 DATA LINE.
9423                  BNZ      INT6        ;EAROM ERASE/WRITE IN PROGRESS. NO
43                    LR       A,R3        ;CHECK STATUS OF DISPLAY ON/OFF BIT.
2120                  NI       20H         ;MASK IN DISPLAY ON/OFF BIT.
841E                  BZ       INT6        ;IF ZERO LEAVE DISPLAY OFF.
42                    LR       A,R2        ;LOAD DISPLAY ISAR VALUE.
0B                    LR       IS,A        ;ISAR LOADED.
71                    LIS      01H         ;LOAD DIGIT SELECT REGISTER.
54                    LR       R4,A        ;FIRST DIGIT SELECT CODE READY.
```

```
41              LR     A,R1      ;LOAD CONTENTS OF PORT 5.
220F            OI     0FH       ;SET LOWER BITS TO ZERO.
51              LR     R1,A      ;STORE RESULT.
4D       INT3   LR     A,I       ;LOAD DIGIT DISPLAY CODE.
18              COM              ;COMPLEMENT DATA TO BE OUTPUTED.
B4              OUTS   4         ;OUTPUT DISPLAY CODE.
44              LR     A,R4      ;LOAD DIGIT SELECT WORD.
E1              XS     R1        ;PLACE DIGIT SELECCT CODE IN WITH
B5              OUTS   5         ;WRITE SELECTED DIGIT CODE.
2020            LI     20H       ;DISPLAY DIGIT ON TIME TIMER.
1F       INT4   INC              ;LOOP TOTAL: 9 CYCLES, NEXT DIGIT
92FE            BNC    INT4      ;1.38 USEC CLOCK, TIMING SET FOR 20
41       INT5   LR     A,R1      ;TURN OFF SELECTED DIGIT.
B5              OUTS   5         ;LED NOW OFF.
44              LR     A,R4      ;ADJUST DIGIT SELECT WORD.
13              SL     1         ;NEXT DIGIT.
54              LR     R4,A      ;STORE DIGIT SELECT WORD.
15              SL     4         ;ALL DIGITS SELECTED?
94EE            BNZ    INT3      ;NO.  REPEAT DIGIT DISPLAY CYCLE.
76              LIS    06H       ;TURN OFF DISCRETE LEDS.
B4              OUTS   4         ;DISCRETE LEDS OFF NOW.
03       INT6   LR     A,QL      ;RESTORE STATE PRIOR TO INTERRUPT
0B              LR     IS,A      ;RESTORE ISAR.
1D              LR     W,J       ;RESTORE STATUS.
02              LR     A,QU      ;RESTORE ACCUMULATOR.
1B              EI               ;ENABLE INTERRUPTS.
1C              POP              ;RETURN.
         ;
         ;
         ;
         NAME    BILL
         SECTION BILL
         GLOBAL  ZDEM,DM9,BLL10,WRVAL
         GLOBAL  UPDATE,RDVAL,WRVAL,ADDR1,ADDR2,LOADVL,UPDIS
         GLOBAL  POLL,UPD2,ONED
         ;
         ;
         ;      THIS ROUTINE PERFORMS THE END OF MONTH CALCULATIONS AND
         ;OF THE DEMAND METER.  PEAK READINGS AREA ZEROED, CONSTANTS UPDATED,
         ;AND THE METER IS PREPARED FOR THE NEXT MONTHS OPERATION.
         ;
         ;
71              LIS    01H       ;CHECK METERTYPE.
F8              NS     R8        ;MASK IN FIRST BIT.
940D            BNZ    BLL10     ;NOT A CUMULATIVE REGISTER.
67       BLL1   LISU   BUFF6     ;LOAD POINTER TO GENERAL PURPOSE BUFFER
69              LISL   ONE       ;POINTER POINTS TO CARRY IN STORAGE.
5D              LR     I,A       ;STORE IN BUFFER.
2028            LI     28H       ;LOAD SECOND OPERAND POINTER.
5D              LR     I,A       ;STORE IN BUFFER.
2020            LI     20H       ;LOAD FIRST OPERAND POINTER.
5D              LR     I,A       ;STORE IN BUFFER.
29035E          JMP    DM9       ;PROCESS CUMULATIVE INFORMATION.
66       BLL10  LISU   BUFF5     ;LOAD POINTER TO CONDITION BUFFER AREA.
68              LISL   ZERO      ;POINTER POINTS TO LOCK UP INDICATOR.
70              CLR              ;LOAD ZERO.
5D              LR     I,A       ;CLEAR LOCK UP INDICATOR.
4C              LR     A,S       ;LOAD VALUE OF DECIMAL POINT.
14              SR     4         ;MASK OUT CUMULATIVE DECIMAL POINT.
67              LISU   BUFF6     ;LOAD POINTER TO GENERAL PURPOSE BUFFER
5E              LR     D,A       ;STORE IN BUFFER.
70              CLR              ;LOAD ADDRESS OF DEMAND FLAG.
5D              LR     I,A       ;STORE IN BUFFER.
6A              LISL   TWO       ;POINTER POINTS TO FIRST DATA ITEM.
5D              LR     I,A       ;STORE IN BUFFER AREA.
5D              LR     I,A       ;STORE IN BUFFER AREA.
5D              LR     I,A       ;STORE IN BUFFER AREA.
5D              LR     I,A       ;STORE IN BUFFER AREA.
18              COM              ;LOAD END OF DATA INDICATOR.
```

```
5D                  LR      I,A         ;STORE IN BUFFER.
280795              PI      WRVAL       ;WRITE DATA TO EAROM.
         ;
         ;          END OF  * BILL *  .
         ;
         ;
         ;
         ;          THIS ROUTINE SERVES AS THE INITIAL LOADER OF THE REGISTER
         ;AND ALSO AS THE END OF MONTH UPDATE OF THE EAROM.  IT SHOULD
         ;BE NOTED THAT THE CONSTANTS ARE ALSO UPDATED WHICH EACH POWER UP.
         ;
         ;
2A0272      UPDATE  DCI     ADDR1       ;LOAD POINTER TO ADDRESS TABLE.
16                  LM                  ;LOAD ADDRESS OF PULSE FLAG.
5A                  LR      R10,A       ;STORE FOR RDVAL USE.
16                  LM                  ;LOAD NUMBER OF BYTES TO READ.
5B                  LR      R11,A       ;STORE FOR RDVAL USE.
28067B              PI      RDVAL       ;READ PULSE INCREMENTS FROM EAROM.
4D                  LR      A,I         ;LOAD FIRST DIGIT OF PULSE INCREMENT.
15                  SL      4           ;LEFT JUSTIFY.
EC                  XS      S           ;APPEND SECOND DIGIT OF PULSE INCREMENT.
65                  LISU    BUFF4       ;LOAD POINTER TO METER 3 BUFFER AREA.
6C                  LISL    FOUR        ;POINTER POINTS TO PULSE INCREMENT
5C                  LR      S,A         ;STORE PULSE INCREMENT VALUE IN BUFFER.
280795              PI      WRVAL       ;UPDATE PULSE INCREMENTS IN EAROM.
16          UPD2    LM                  ;LOAD INTERVAL VALUE FLAG ADDRESS.
5A                  LR      R10,A       ;STORE FOR RDVAL USE.
16                  LM                  ;LOAD NUMBER OF BYTES TO READ.
5B                  LR      R11,A       ;STORE FOR RDVAL USE.
28067B              PI      RDVAL       ;READ INTERVAL VALUE FROM EAROM.
4D                  LR      A,I         ;LOAD FIRST DIGIT OF INTERVAL VALUE.
15                  SL      4           ;LEFT JUSTIFY.
ED                  XS      I           ;APPEND SECOND DIGIT OF INTERVAL VALUE.
64                  LISU    BUFF3       ;LOAD POINTER TO METER 2 BUFFER AREA.
6E                  LISL    SIX         ;POINTER POINTS TO INTERVAL VALUE
5C                  LR      S,A         ;STORE VALUE IN BUFFER.
57                  LR      R7,A        ;STORE VALUE IN REGISTER FOR DIVIS USE.
280795              PI      WRVAL       ;UPDATE INTERVAL VALUE IN EAROM.
16                  LM                  ;LOAD KH VALUE FLAG ADDRESS.
5A                  LR      R10,A       ;STORE FOR RDVAL USE.
16                  LM                  ;LOAD NUMBER OF BYTES TO READ.
5B                  LR      R11,A       ;STORE FOR RDVAL USE.
28067B              PI      RDVAL       ;READ KH VALUE FROM EAROM.
6A                  LISL    TWO         ;POINTER POINTS TO LAST DIGIT.
4D                  LR      A,I         ;LOAD LAST DIGIT.
15                  SL      4           ;LEFT JUSTIFY.
EE                  XS      D           ;APPEND SECOND DIGIT.
5E                  LR      D,A         ;STORE IN BUFFER.
2C                  XDC                 ;SAVE CURRENT DATA COUNTER VALUE.
         INCLUDE "BUILDY;S/1"
         ;
         ;
         ;
         ;          THIS ROUTINE CALCULATES THE PULSE INCREMENT, THE VALUE FOR EACH
         ;PULSE RECEIVED FROM THE DISK, BY FIRST MULTIPLYING THE K SUB H
         ;VALUE BY 6, THEN DIVIDING THAT RESULT BY THE DEMAND INTERVAL
         ;LENGTH IN MINUTES.  THE ACTUAL EQUATION IMPLEMENTED HAS A
         ;DIVIDE BY 1000 OF THIS LAST RESULT, BUT THIS DIVISION HAS BEEN BUILT
         ;INTO THIS ROUTINE AND THE   * PACK *   ROUTINE.
         ;
         ;
6A                  LISL    TWO         ;POINTER POINTS TO FIRST LOCATION.
76                  LIS     06H         ;LOAD MULTIPLIER.
56                  LR      R6,A        ;STORE MULTIPLIER.
70                  CLR                 ;LOAD ZERO.
55                  LR      R5,A        ;ZERO ACCUMULATOR.
5B                  LR      R11,A       ;ZERO ACCUMULATOR.
45          MUL1    LR      A,R5        ;LOAD LOW ORDER OF ACCUMULATOR.
```

```
2A0736              DCI     ONED        ;LOAD POINTER TO SIX-SIX ONE SIX-SIX
2466                AI      66H         ;PREPARE FOR DECIMAL ADDITION.
DE                  ASD     D           ;ADD IN LOW ORDER OF MUTIPLICAND.
55                  LR      R5,A        ;STORE RESULT.
4B                  LR      A,R11       ;LOAD HIGH ORDER OF ACCUMULATOR.
9203                BNC     MUL2        ;NO CARRY OUT.
88                  AM                  ;PREPARE FOR DECIMAL ADDITION.
89                  AMD                 ;ADD IN CARRY.
88         MUL2     AM                  ;PREPARE FOR DECIMAL ADDITION.
DD                  ASD     I           ;ADD IN HIGH ORDER OF MULTIPLICAND.
5B                  LR      R11,A       ;STORE RESULT.
36                  DS      R6          ;DECREMENT MULTIPLIER.
94EE                BNZ     MUL1        ;NOT DONE YET.
63                  LISU    BUFF2       ;LOAD POINTER TO METER 3 BUFFER AREA.
68                  LISL    ZERO        ;POINTER POINTS TO FIRST LOCATION.
78                  LIS     08H         ;LOAD NUMBER OF SIGNIFICANT DIGITS
56                  LR      R6,A        ;STORE FOR USE LATER.
209A                LI      9AH         ;LOAD DECIMAL SUBTRACTION PRELOAD VALUE.
5A                  LR      R10,A       ;STORE FOR LATER USE.
70         DIV5     CLR                 ;LOAD ZERO.
5C                  LR      S,A         ;STORE IN BUFFER TO ZERO NEXT RESULT
47         DIV1     LR      A,R7        ;LOAD DIVISOR VAUE.
2A0736              DCI     ONED        ;LOAD POINTER TO DECIMAL VALUE ONE.
18                  COM                 ;START SUBTRACT OPERATION.
DA                  ASD     R10         ;ADD IN PRELOAD VALUE.
88                  AM                  ;PREPARE FOR DECIMAL ADDITION.
89                  AMD                 ;ADD IN ONE.
88                  AM                  ;PREPARE FOR DECIMAL ADDITION.
DB                  ASD     R11         ;ADD IN DIVIDEND.
54                  LR      R4,A        ;STORE TEMPORARILY.
8206                BC      DIV3        ;BRANCH ON CARRY.
70         DIV2     CLR                 ;CHECK UPPER DIGIT FOR ZERO.
E9                  XS      R9          ;MASK IN UPPER DIGIT.
840D                BZ      DIV4        ;ZERO.  BRANCH TO SHIFT ROUTINE.
39                  DS      R9          ;DECREMENT UPPER DIGIT.
44         DIV3     LR      A,R4        ;TRANSFER REMAINDER TO DIVIDEND.
5B                  LR      R11,A       ;STORE REMAINDER.
2A0736              DCI     ONED        ;LOAD POINTER TO DECIMAL VALUE ONE.
4C                  LR      A,S         ;LOAD QUOTIENT.
88                  AM                  ;PREPARE FOR DECIMAL ADDITION.
89                  AMD                 ;ADD IN ONE.
5C                  LR      S,A         ;STORE QUOTIENT.
90E4                BR      DIV1        ;NEXT ITERATION.
4B         DIV4     LR      A,R11       ;SHIFT DIVIDEND LEFT ONE DIGIT.
14                  SR      4           ;FIRST DIGIT.
59                  LR      R9,A        ;STORE FOR LATER USE.
4B                  LR      A,R11       ;FIRST AND SECOND DIGIT.
15                  SL      4           ;SECOND DIGIT.
5B                  LR      R11,A       ;STORE TEMPORARILY.
45                  LR      A,R5        ;THIRD AND FOURTH DIGIT.
14                  SR      4           ;THIRD DIGIT.
EB                  XS      R11         ;SECOND AND THIRD DIGIT.
5B                  LR      R11,A       ;STORE FOR LATER USE.
45                  LR      A,R5        ;THIRD AND FOURTH DIGIT.
15                  SL      4           ;FOURTH DIGIT.
55                  LR      R5,A        ;STORE FOR LATER USE.
36                  DS      R6          ;DECREMENT SIGINIFICANT DIGIT COUNTER.
4D                  LR      A,I         ;DUMMY LOAD TO INCREMENT ISAR.
94D1                BNZ     DIV5        ;NOT DONE YET.
;
;           END OF  * MULDV *  .
;
       INCLUDE "PACK;S/1"
;
;
```

; THIS ROUTINE COMPLETES THE CALCULATION OF THE PULSE INCREMENT
;VALUE BEGUN BY THE * MULDV * ROUTINE. THE FINAL VALUES
;ARE THEN PLACED IN THE ASSIGNED BUFFER LOCATIONS FOR USE BY
;THE * METER * ROUTINE.
;

```
63                  LISU    BUFF2       ;LOAD POINTER TO GENERAL PURPOSE BUFFER
68                  LISL    ZERO        ;POINTER POINTS TO FIRST LOCATION.
4D                  LR      A,I         ;LOAD FIRST DIGIT.
06                  LR      QU,A        ;STORE TEMPORARILY.
4D                  LR      A,I         ;LOAD SECOND DIGIT.
15                  SL      4           ;LEFT JUSTIFY.
ED                  XS      I           ;APPEND THIRD DIGIT.
07                  LR      QL,A        ;STORE TEMPORARILY.
4D                  LR      A,I         ;LOAD FOURTH DIGIT.
15                  SL      4           ;LEFT JUSTIFY.
ED                  XS      I           ;APPEND FIFTH DIGIT.
5A                  LR      R10,A       ;STORE TEMPORARILY.
4D                  LR      A,I         ;LOAD SIXTH DIGIT.
15                  SL      4           ;LEFT JUSTIFY.
16                  LM                  ;LOAD NUMBER OF BYTES TO READ.
5B                  LR      R11,A       ;STORE FOR RDVAL USE.
28067B              PI      RDVAL       ;READ DEMAND VALUE FROM EAROM.
2023                LI      23H         ;LOAD POINTER TO DESTINATION OF DEMAND
07                  LR      QL,A        ;STORE FOR LOADVL USE.
280486              PI      LOADVL      ;PUT DEMAND VALUE IN PROPER LOCATION.
2020                LI      20H         ;LOAD POINTER TO DEMAND VALUE DATA.
5A                  LR      R10,A       ;STORE FOR UPDIS USE.
12                  SR      1           ;LOAD POINTER TO DISPLAY BUFFER AREA.
07                  LR      QL,A        ;STORE FOR UPDIS USE.
280742              PI      UPDIS       ;FINISH LOADING DEMAND VALUE.
20F7                LI      0F7H        ;CLEAR FLAG ERROR INDICATOR.
F8                  NS      R8          ;INDICATOR CLEARED.
58                  LR      R8,A        ;STORE INDICATOR.
16                  LM                  ;LOAD CUMULATIVE VALUE FLAG ADDRESS.
5A                  LR      R10,A       ;STORE FOR RDVAL USE.
16                  LM                  ;LOAD NUMBER OF BYTES TO READ.
5B                  LR      R11,A       ;STORE FOR RDVAL USE.
28067B              PI      RDVAL       ;READ CUMULATIVE VALUE FROM EAROM.
202B                LI      2BH         ;LOAD POINTER TO DESTINATION OF
07                  LR      QL,A        ;STORE FOR LOADVL USE.
280486              PI      LOADVL      ;PUT CUMULATIVE VALUE IN PROPER LOCATION.
2028                LI      28H         ;LOAD PPOINTER TO CUMULATIVE VALUE DATA.
5A                  LR      R10,A       ;STORE FOR UPDIS USE.
12                  SR      1           ;LOAD POINTER TO DISPLAY BUFFER AREA.
07                  LR      QL,A        ;STORE FOR UPDIS USE.
280742              PI      UPDIS       ;FINISH LOADING CUMULATIVE VALUE.
20E7                LI      0E7H        ;LOAD FLAG ERROR ENABLE/DISABLE MASK.
F8                  NS      R8          ;DISABLE FLAG ERROR SCHEME.
58                  LR      R8,A        ;STORE VALUE FOR LATER USE.
;
;            END OF  * UPDATE *  .
;
INCLUDE ZDEM:S/1"
;
;
;       THIS ROUTINE PREPARES THE DEMAND REGISTER FOR THE NEXT DEMAND
;INTERVAL TO BE MEASURED.  ACCUMULATORE ARE CLEARED, TIMERS LOADED,
;DISPLAYS UPDATED, AND CONDITION FLAGS RESTORED.
;
;
64          ZDEM    LISU    BUFF3       ;LOAD ISAR WITH METER 2 BUFFER AREA
6C                  LISL    FOUR        ;POINTER POINTS TO LOWER TWO DIGITS OF
70                  CLR                 ;LOAD ZERO.
5D                  LR      I,A         ;ZERO LOWER TWO DIGITS OF DEMAND.
5D                  LR      I,A         ;ZERO UPPER TWO DIGITS OF DEMAND.
63                  LISU    BUFF2       ;LOAD ISAR WITH METER 1 BUFFER AREA
69                  LISL    ONE         ;POINTER POINTS TO ACCUMULATOR.
```

| | | | |
|---|---|---|---|
| 5D | ZDM2 LR | I,A | ;ZERO LOWER TWO DIGITS OF ACCUMULATOR. |
| FD | NS | I | ;DUMMY INSTRUCTION TO INCREMENT ISAR. |
| 8FFD | BR7 | ZDM2 | ;IF NOT SEVEN, THEN REPEAT ZEROING LOOP. |
| 5D | LR | I,A | ;STORE IN BUFFER. |
| 64 | LISU | BUFF3 | ;LOAD METER2 BUFFER POINTER. |
| 6E | LISL | SIX | ;POINTER POINTS TO MINUTES OF DEMAND |
| ED | XS | I | ;APPEND SEVENTH DIGIT. |
| 5B | LR | R11,A | ;STORE TEMPORARILY. |
| 68 | LISL | ZERO | ;POINTER POINTS TO FIRST LOCATION. |
| 4B | LR | A,R11 | ;RETRIEVE LSW. |
| 5C | LR | S,A | ;STORE IN BUFFER. |
| 6A | LISL | TWO | ;CHANGE POINTER. |
| 4A | LR | A,R10 | ;RETRIEVE NEXT SW. |
| 5C | LR | S,A | ;STORE IN BUFFER. |
| 6C | LISL | FOUR | ;CHANGE POINTER. |
| 03 | LR | A,QL | ;RETRIEVE NEXT SW. |
| 5C | LR | S,A | ;STORE IN BUFFER. |
| 6E | LISL | SIX | ;CHANGE POINTER. |
| 02 | LR | A,QU | ;RETRIEVE MSW. |
| 5C | LR | S,A | ;STORE IN BUFFER. |
| ; | | | |
| ; | END OF | * PACK * . | |
| ; | | | |
| 2C | XDC | | ;RESTORE PREVIOUS DATA COUNTER VALUE. |
| 67 | LISU | BUFF6 | ;LOAD POINTER TO GENERAL PURPOSE BUFFER. |
| 6A | LISL | TWO | ;POINTER POINTS TO SECOND DATA ITEM. |
| 4C | LR | A,S | ;LOAD SECOND DATA ITEM. |
| 14 | SR | 4 | ;UNPACK DATA ITEM. |
| 5D | LR | I,A | ;STORE IN BUFFER. |
| 280795 | PI | WRVAL | ;UPDATE KH VALUE IN EAROM. |
| 16 | LM | | ;LOAD METER TYPE VALUE FLAG ADDRESS. |
| 5A | LR | R10,A | ;STORE FOR RDVAL USE. |
| 16 | LM | | ;LOAD NUMBER OF BYTES TO READ. |
| 5B | LR | R11,A | ;STORE FOR RDVAL USE. |
| 28067B | PI | RDVAL | ;READ METER TYPE VALUE FROM EAROM. |
| 48 | LR | A,R8 | ;LOAD CONTENTS OF REGISTER. |
| 21F8 | NI | OF8H | ;MASK OUT METER TYPE SELECTION. |
| 58 | LR | R8,A | ;STORE TEMPORARILY. |
| 77 | LIS | 07H | ;LOAD METER TYPE MASK. |
| FC | NS | S | ;MASK IN METER TYPE VALUE. |
| E8 | XS | R8 | ;APPEND CONTENTS OF REGISTER. |
| 58 | LR | R8,A | ;STORE VALUE. |
| 280795 | PI | WRVAL | ;UPDATE METER TYPE VALUE IN EAROM. |
| 16 | LM | | ;LOAD DECIMAL POINT VALUE FLAG ADDRESS. |
| 5A | LR | R10,A | ;STORE FOR RDVAL USE. |
| 16 | LM | | ;LOAD NUMBER OF BYTES TO READ. |
| 5B | LR | R11,A | ;STORE FOR RDVAL USE. |
| 28067B | PI | RDVAL | ;READ DECIMAL POINT VALUE FROM EAROM. |
| 4D | LR | A,I | ;LOAD FORST DIGIT. |
| 15 | SL | 4 | ;LEFT JUSTIFY. |
| ED | XS | I | ;APPEND SECOND DIGIT. |
| 66 | LISU | BUFF5 | ;LOAD POINTER TO CONDITION BUFFER AREA. |
| 69 | LISL | ONE | ;POINTER POINTS TO DECIMAL POINT STORAGE. |
| 5C | LR | S,A | ;STORE IN BUFFER. |
| 280795 | PI | WRVAL | ;UPDATE DECIMAL POINT VALUE IN EAROM. |
| 48 | LR | A,R8 | ;LOAD FLAG ERROR ENABLE WORD. |
| 2210 | OI | 10H | ;ENABLE FLAG ERROR DETECTION. |
| 58 | LR | R8,A | ;STORE FLAG ERROR ENABLE WORD. |
| 16 | LM | | ;LOAD DEMAND VALUE FLAG ADDRESS. |
| 5A | LR | R10,A | ;STORE FOR RDVAL USE. |
| 1A | DI | | ;DISABLE INTERRUPTS. |
| 4C | LR | A,S | ;LOAD MINUTES OF DEMAND INTERVAL. |
| 57 | LR | R7,A | ;PLACE IN COUNTER. |
| 203C | LI | 3CH | ;LOAD SIXTY SECONDS AND 1/60 SECONDS |
| 56 | LR | R6,A | ;LOAD SECONDS COUNTER. |
| 55 | LR | R5,A | ;LOAD 1/60 SECONDS COUNTER. |
| 48 | LR | A,R8 | ;LOAD STATUS REGISTER. |
| 2120 | NI | 20H | ;MASK IN EOM BIT. |

```
840D              BZ    ZDM3      ;NOT SET. NOT AN EOM PROCESS COMPLETED.
76                LIS   06H       ;LOAD MASK TO CHECK METER TYPE.
F8                NS    R8        ;MASK IN METER TYPE SELECT BITS.
8409              BZ    ZDM3      ;IF NOT ZERO, THEN SET DISPLAY FOR
2014              LI    14H       ;LOAD POINTER TO CUMULATIVE DISPLAY
52                LR    R2,A      ;STORE IN DISPLAY DRIVER DATA POINTER
20BF              LI    0BFH      ;LOAD DISPLAY DRIVER CONTROL WORD.
53                LR    R3,A      ;STORE IN DISPLAY DRIVER CONTROL
9003              BR    ZDM4      ;FINISH RESETTING.
70        ZDM3    CLR             ;LOAD DISPLAY DRIVER CONTROL WORD.
53                LR    R3,A      ;STORE IN DISPLAY DRIVER CONTROL
48        ZDM4    LR    A,R8      ;RESET BILL (EOM) INDICATOR.
21DF              NI    0DFH      ;DONE.
58                LR    R8,A      ;STORE INDICATOR.
          ;
          ;       END OF *ZDEM*  .
          ;
          ;       THIS ROUTINE TURNS ON THE DISCRETE LEDS THAT INDICATE WHETHER
          ;AN INDICATING DEMAND OR A CUMULATIVE READING IS CURRENTLY BEING
          ;SHOWN ON THE DISPLAY.
          ;
          ;
62                LISU  BUFF1     ;LOAD POINTER TO DISPLAY BUFFER AREA.
68                LISL  ZERO      ;POINTER POINTS TO LAST LOCATION.
74                LIS   04H       ;LOAD COUNTER.
5B                LR    R11,A     ;COUNTER LOADED.
4C        LED1    LR    A,S       ;LOAD VALUE.
2204              OI    04H       ;TURN ON DEMAND LED.
5D                LR    I,A       ;STORE VALUE.
3B                DS    R11       ;DECREMENT COUNTER.
94FA              BNZ   LED1      ;NOT DONE YET.
74                LIS   04H       ;LOAD COUNTER.
5B                LR    R11,A     ;STORE COUNTER.
4C        LED2    LR    A,S       ;LOAD VALUE.
2202              OI    02H       ;TURN ON CUMULATIVE LED.
5D                LR    I,A       ;STORE VAUE.
3B                DS    R11       ;DECREMENT COUNTER.
94FA              BNZ   LED2      ;NOT DONE YET.
2904E1            JMP   POLL      ;RESTART DEMAND INTERVAL PROCESSING.
          ;
          ;       END OF *DSEL* .
          ;
          ;       THIS TABLE IS USED BY  *UPDATE*  AND  *PROG*  TO PROVIDE
          ;* RDVAL *  AND  * WRVAL *  ROUTINES WITH ADDRESSES OF DATA STORED
          ;IN THE EAROM.  THE TABLE ENTRIES FORMAT CONSISTS OF THE ADDRESS
          ;OF THE DATA ITEM POINTER FOLLOWED BY THE NUMBER OF SUCCEEDING BYTES
          ;TO READ.  TABLE ORDER IS: PULSE RATIO POINTER, INTERVAL LENGTH
          ;K SUB H VALUE POINTER, METER TYPE POINTER, DECIMAL POSITION POINTER,
          ;DEMAND VALUE POINTER, AND CUMULATIVE VALUE POINTER.
          ;
2202      ADDR1   BYTE  22H,02H
1D021603  ADDR2   BYTE  1DH,02H,16H,03H,27H,01H,2AH,02H,00H,05H,0BH,05H
27012A02
00050B05
          ;
          ;
          NAME    DECODE
          SECTION DECODE
          GLOBAL  TABLE,ENCODE,ERROR
          ;
          ;
          ;       THIS ROUTINE IS ONE-HALF OF THE CODE NECESSARY TO IMPLEMENT
          ;CODE ERROR DETECTION/CORRECTION SCHEME.  DATA READ FROM THE EAROM
          ;IS PASSED THROUGH THIS ROUTINE TO CHECK FOR ONE OF THREE CONDITIONS;
          ;1) NO ERRORS, 2) SINGLE BIT ERRORS, AND 3) MULTIPLE BIT ERRORS.  IF
          ;A SINGLE BIT ERROR OCCURS THEN IT IS CORRECTED.  IF A MULTIPLE BIT
          ;ERROR IS DETECTED IT IS FLAGGED FOR CORRECT HANDLING DURING  * EOM *
          ;PROCESSING.
```

```
08                   LR     K,P       ;SAVE RETURN ADDRESS.
4B                   LR     A,R11     ;TRANSFER DATA.
07                   LR     QL,A      ;DATA TRANSFERED.
2803AC               PI     ENCODE    ;CALCULATE CODE BITS.
4B                   LR     A,R11     ;LOAD CODE BITS AND DATA.
14                   SR     4         ;MASK OUT DATA BITS.
5B                   LR     R11,A     ;STORE TEMPORARILY.
03                   LR     A,QL      ;RETRIEVE ORIGINAL DATA READ FROM EAROM.
14                   SR     4         ;MASK OUT DATA BITS.
EB                   XS     R11       ;COMPARE CODE BITS.
8411                 BZ     DCD5      ;EQUAL.  NO DETECTED ERRORS.
2A02B3               DCI    FAULT     ;LOAD FAULT TABLE POINTER.
8E                   ADC              ;PREPARE FAULT ADDRESS.
16                   LM               ;FETCH FAULT RESPONSE CODE.
5B                   LR     R11,A     ;STORE RESPONSE CODE.
14                   SR     4         ;RIGHT JUSTIFY FAULT CODE.
12                   SR     1         ;CHECK FOR FIRST BIT SET.
8407                 BZ     DCD5      ;CODE BIT ERROR.  DATA CORRECT.
12                   SR     1         ;CHECK FOR SECOND BIT SET.
8409                 BZ     DCD4      ;DATA BIT ERROR.  CORRECT ERROR.
280088               PI     ERROR     ;INDICATE MULTIPLE BIT ERROR.
03          DCD5     LR     A,QL      ;RETRIEVE DATA.
210F        DCD6     NI     0FH       ;MASK OUT CODE BITS.
5B                   LR     R11,A     ;STORE DATA FOR RETURN.
0C                   PK               ;RETURN.
7F          DCD4     LIS    0FH       ;RETRIEVE RESPONSE CODE.
FB                   NS     R11       ;REMOVE FIRST PART OF CODE.
1F                   INC              ;PREPARE CODE FOR BIT OPERATIONS.
5B                   LR     R11,A     ;STORE CODE.
71                   LIS    01H       ;LOAD BIT MASK.
3B          DCD1     DS     R11       ;DECREMENT BIT COUNTER.
8404                 BZ     DCD2      ;PROPER BIT MASK ALIGNMENT?
13                   SL     1         ;ALIGN BIT MASK WITH NEXT BIT POSITION.
90FB                 BR     DCD1      ;CHECK ALIGNMENT.
5B          DCD2     LR     R11,A     ;STORE BIT MASK TEMPORARILY.
03                   LR     A,QL      ;RETRIEVE UNCORRECTED DATA.
EB                   XS     R11       ;BIT CORRECTED.
90ED                 BR     DCD6      ;DONE.  GET READY TO RETURN.
     ;
     ;         THIS TABLE CONTAINS FAULT CODES AND REPONSE CODES USED IN THE
     ;HAMMING CODE SCHEME.  SIXTEEN POSSIBLE FAULTS CAN BE GENERATED.
     ;ENTRIES ARE A 0,1,2, OR 4 IN THE HIGH ORDER FOUR BITS CORRESPONDING
     ;NO ERROR, A SINGLE BIT CODE BIT ERROR, A SINGLE BIT DATA BIT ERROR,
     ;A MULTIPLE BIT ERROR.  THE LOW ORDER FOUR BITS MARK THE LOCATION OF
     ;THE BAD BIT FOR ERRORS 1 AND 2.  ERRORS 0 AND 4 HAVE A ZERO IN THIS
     ;POSITION.
     ;
00101140    FAULT    BYTE   00H,10H,11H,40H,12H,40H,40H,22H,13H,40H,40H,20H,
12404022             40H,21H,23H,40H
13404020
40212340
     ;
     ;
     NAME    DEMND
     SECTION DEMND
     GLOBAL  WRLOAD,UPDIS,ZDEM,RFDIS,FIDPT
     GLOBAL  BLL10,DM9,WRVAL,SUBTCT,ADD,RF2
     ;
     ;
     ;         THIS ROUTINE PROCESSES THE END OF INTERVAL INFORMATION.  IF NO
     ;LOCKUP INDICATOR IS FOUND, THEN A COMPARISON OF THE CURRENT INTERVAL
     ;DEMAND WITH THE CURRENT PEAK DEMAND IS MADE TO DETERMINE IF A NEW
     ;VALUE HAS BEEN ESTABLISHED.  CURRENT PEAK VALUES AND CONTINUOUS
     ;CUMULATIVE VALUES WILL BE UPDATED IF SO PROGRAMMED ALSO.
     ;
     ;
     ;
1A                   DI               ;DISABLE INTERRUPTS.
66                   LISU   BUFF5     ;LOAD POINTER TO CONDITION BUFFER.
```

```
68              LISL    ZERO    ;POINTER POINTS TO LOCKUP INDICATOR.
4D              LR      A,I     ;LOAD LOCKIND VALUE.
13              SL      1       ;SET CPU FLAGS.
8404            BZ      DM32    ;NOT SET. PROCESS DEMAND INTERVAL
2903A9          JMP     DM23    ;SET.  RESTART DEMAND INTERVAL WITHOUT
4C      DM32    LR      A,S     ;LOAD VALUE OF DECIMAL POINT.
14              SR      4       ;MASK IN DEMAND DECIMAL POINT PROGRAMMED
5B              LR      R11,A   ;STORE FOR LATER USE.
63              LISU    BUFF2   ;LOAD POINTER TO METER 1 BUFFER AREA.
6D              LISL    FIVE    ;POINTER POINTS TO ACCUMULATOR NMSW.
4D              LR      A,I     ;LOAD DATA.
06              LR      QU,A    ;STORE FOR LATER USE.
6F              LISL    SEVEN   ;POINTER POINTS TO ACCUMULATOR MSW.
4D              LR      A,I     ;LOAD DATA.
04              LR      KU,A    ;STORE FOR LATER USE.
64              LISU    BUFF3   ;LOAD POINTER TO METER 2 BUFFER AREA.
6C              LISL    FOUR    ;POINTER POINTS TO DEMAND LSW.
4D              LR      A,I     ;LOAD DATA.
05              LR      KL,A    ;STORE FOR LATER USE.
4D              LR      A,I     ;LOAD DATA.
59              LR      R9,A    ;STORE FOR LATER USE.
70              CLR             ;LOAD ZERO.
07              LR      QL,A    ;STORE FOR FIDPT USE TO INDICATE A
2806E2          PI      RF2     ;PUT DATA IN BUFFER 6.
2803EA          PI      FIDPT   ;FIND DECIMAL POINT.
        INCLUDE "LOCKUP;S/1"
;
;
;
;       THIS ROUTINE DETERMINES IF AN OVERFLOW OF THE PROGRAMMED FULL
;SCALE VALUE ON DEMAND HAS BEEN EXCEEDED.  IF SO THE DEMAND
;VALUE IS SET TO ALL NINES AND NO MORE PULSES FROM THE DISK
;WILL BE ACKNOWLEDGED UNTIL AFTER END OF MONTH PROCESSING
;HAS BEEN STARTED AND COMPLETED.
;
;
66              LISU    BUFF5   ;LOAD POINTER TO METER 3 BUFFER AREA.
69              LISL    ONE     ;POINTER POINTS TO LOCKIND STORAGE.
4C              LR      A,S     ;LOAD SPECIFIED DECIMAL POINT.
14              SR      4       ;RIGHT JUSTIFY TO GET INDICATING
2504            CI      04H     ;CHECK FOR FLOATING POINT OPTION.
842F            BZ      DM35    ;FLOATING POINT OPTION SPECIFIED.
5A              LR      R10,A   ;STORE TEMPORARILY.
4B              LR      A,R11   ;LOAD ACTUAL DECIMAL POINT AS FOUND
18              COM             ;PREPARE FOR SUBTRACT OPERATION.
CA              AS      R10     ;ADD IN SPECIFIED DECIMAL POINT.
8229            BC      DM35    ;NO OVERFLOW.
2401            AI      01H     ;ADD IN ONE FOR PROPER RESULTS.
8225            BC      DM35    ;NO OVERFLOW.
68      LCK1    LISL    ZERO    ;POINTER POINTS TO LOCKIND STORAGE.
7F              LIS     0FH     ;LOAD LOCKIND VALUE.
5D              LR      I,A     ;STORE IN BUFFER.
4A              LR      A,R10   ;RETRIEVE SPECIFIED DECIMAL POINT.
1F              INC             ;ADD ONE.
5B              LR      R11,A   ;STORE FOR POSITIONING OPERATION.
63              LISU    BUFF2   ;LOAD POINTER TO METER 1 BUFFER AREA.
6D              LISL    FIVE    ;POINTER POINTS TO ACCUMULATOR NMSW.
2099            LI      99H     ;LOAD LOCK UP VALUE.
5D              LR      I,A     ;STORE IN BUFFER.
6F              LISL    SEVEN   ;POINTER POINTS TO ACCUMULATOR MSW.
5D              LR      I,A     ;STORE IN BUFFER.
64              LISU    BUFF3   ;LOAD POINTER TO METER 2 BUFFER AREA.
6C              LISL    FOUR    ;POINTER POINTS TO DEMAND LSW.
70              CLR             ;LOAD ZERO.
5D              LR      I,A     ;STORE IN BUFFER.
5E              LR      D,A     ;STORE IN BUFFER.
79      LCK2    LIS     09H     ;LOAD LOCK UP VALUE.
EC              XS      S       ;APPEND TO DEMAND LSW.
```

| | | | |
|---|---|---|---|
| 5D | LR | I,A | ;STORE IN BUFFER. |
| 3B | DS | R11 | ;DECREMENT POSITION INDICATOR. |
| 840D | BZ | DM35 | ;DONE. |
| 4E | LR | A,D | ;LOAD DEMAND MSW. |
| 15 | SL | 4 | ;LEFT JUSTIFY. |
| 5A | LR | R10,A | ;STORE TEMPORARILY. |
| 4D | LR | A,I | ;LOAD DEMAND LSW. |
| 14 | SR | 4 | ;RIGHT JUSTIFY. |
| EA | XS | R10 | ;APPEND DIGITS TOGETHER. |
| 5E | LR | D,A | ;STORE IN BUFFER. |
| 4C | LR | A,S | ;LOAD DEMAND LSW. |
| 15 | SL | 4 | ;LEFT JUSTIFY. |
| 5C | LR | S,A | ;STORE IN BUFFER. |
| 90EF | BR | LCK2 | ;NEXT ITERATION. |

;
; END OF * LOCKUP *
;

| | | | | |
|---|---|---|---|---|
| 67 | DM35 | LISU | BUFF6 | ;LOAD POINTER TO GENERAL PURPOSE BUFFER |
| 68 | | LISL | ZERO | ;POINTER POINTS TO PRELOAD STORAGE |
| 209A | | LI | 9AH | ;LOAD PRELOAD VALUE. |
| 5D | | LR | I,A | ;STORE IN BUFFER. |
| 201D | | LI | 1DH | ;LOAD POINTER TO SECOND OPERAND. |
| 5D | | LR | I,A | ;STORE IN BUFFER. |
| 2020 | | LI | 20H | ;LOAD POINTER TO FIRST OPERAND. |
| 5D | | LR | I,A | ;STORE IN BUFFER. |
| 203C | | LI | 3CH | ;LOAD POINTER TO RESULT STORAGE. |
| 5D | | LR | I,A | ;STORE IN BUFFER. |
| 28070B | | PI | SUBTCT | ;SUBTRACT LS BYTES. |
| 2021 | | LI | 21H | ;LOAD POINTER TO SECOND OPERAND. |
| 5E | | LR | D,A | ;STORE IN BUFFER. |
| 201F | | LI | 1FH | ;LOAD POINTER TO FIRST OPERAND. |
| 5E | | LR | D,A | ;STORE IN BUFFER. |
| 28070B | | PI | SUBTCT | ;SUBTRACT NLS BYTES. |
| 2022 | | LI | 22H | ;LOAD POINTER TO SECOND OPERAND. |
| 5E | | LR | D,A | ;STORE IN BUFFER. |
| 2024 | | LI | 24H | ;LOAD POINTER TO FIRST OPERAND. |
| 5E | | LR | D,A | ;STORE IN BUFFER. |
| 28070B | | PI | SUBTCT | ;SUBTRACT NMS BYTES. |
| 4C | | LR | A,S | ;LOAD SECOND OPERAND POINTER. |
| 1F | | INC | | ;CHANGE POINTER. |
| 5E | | LR | D,A | ;STORE IN BUFFER. |
| 4C | | LR | A,S | ;LOAD FIRST OPERAND POINTER. |
| 1F | | INC | | ;CHANGE POINTER. |
| 5E | | LR | D,A | ;STORE IN BUFFER. |
| 28070B | | PI | SUBTCT | ;SUBTRACT MS BYTES. |
| 68 | | LISL | ZERO | ;POINTER POINTS TO PRELOAD VALUE. |
| 71 | | LIS | 01H | ;LOAD MASK. |
| FC | | NS | S | ;MASK IN FIRST BIT OF PRELOAD. |
| 945E | | BNZ | DM23 | ;PEAK GREATER THAN DEMAND. |
| 77 | DM7 | LIS | 07H | ;CHECK METERTYPE. |
| F8 | | NS | R8 | ;MASK IN METERTYPE BITS. |
| 2503 | | CI | 03H | ;CONTINUOUS CUMULATIVE? |
| 8405 | | BZ | DM8 | ;PROCESS CONTINUOUS CUMULATIVE VALUES. |
| 2505 | | CI | 05H | ;DEMAND AND CONTINUOUS CUMULATIVE? |
| 9430 | | BNZ | DM17 | ;PROCESS CONTINUOUS CUMULATIVE VALUES. |
| 69 | DM8 | LISL | ONE | ;POINTER POINTS TO CARRY IN LOCATION. |
| 5D | | LR | I,A | ;STORE IN BUFFER. |
| 2028 | | LI | 28H | ;LOAD BASE POINTER TO CUMULATIVE VALUES. |
| 5D | | LR | I,A | ;STORE IN BUFFER. |
| 203C | | LI | 3CH | ;LOAD BASE POINTER TO SUBTRACT RESULT |
| 5E | | LR | D,A | ;STORE IN BUFFER. |
| 1A | DM9 | DI | | ;DISABLE INTERRUPTS. |
| 74 | | LIS | 04H | ;LOAD ITERATION COUNTER. |
| 54 | | LR | R4,A | ;STORE VALUE. |
| 28004A | DM40 | PI | ADD | ;ADD FIRST BYTES TOGETHER. |
| 4C | | LR | A,S | ;LOAD POINTER. |
| 1F | | INC | | ;CHANGE POINTER TO NEXT VALUE. |
| 5D | | LR | I,A | ;STORE POINTER IN BUFFER. |

```
4C                LR      A,S         ;LOAD POINTER.
1F                INC                 ;CHANGE POINTER TO NEXT VALUE.
5E                LR      D,A         ;STORE IN BUFFER.
34                DS      R4          ;DECREMENT ITERATION COUNTER.
94F5              BNZ     DM40        ;KEEP ON GOING IF NOT ZERO.
2014              LI      14H         ;LOAD DISPLAY BUFFER POINTER.
07                LR      QL,A        ;STORE FOR DECSEG USE.
13                SL      1           ;GENERATE POINTER TO DATA TO USE.
5A                LR      R10,A       ;STORE FOR UPDIS USE.
280742            PI      UPDIS       ;UPDATE CONTINUOUS CUMULATIVE READINGS.
7B                LIS     0BH         ;LOAD CUMULATIVE FLAG ADDRESS.
06                LR      QU,A        ;STORE ADDRESS FOR WRLOAD USE.
28077E            PI      WRLOAD      ;LOAD CONTINUOUS CUMULATIVE VALUES.
280795            PI      WRVAL       ;WRITE CONTINUOUS CUMULATIVE VALUES
48       DM24     LR      A,R8        ;CHECK EOM INDICATOR.
2120              NI      20H         ;FETCH INDICATOR.
8404              BZ      DM17        ;NO.  NO AN EOM PROCESS JUST FINISHED.
29011D            JMP     BLL10       ;YES.  COMPLETE THE EOM PROCESS.
63       DM17     LISU    BUFF2       ;LOAD METER1 BUFFER POINTER.
6D                LISL    FIVE        ;POINTER POINTS TO DEMAND NEXT LSD.
4D                LR      A,I         ;LOAD DEMAND NEXT LSD.
06                LR      QU,A        ;STORE TEMPORARILY.
6F                LISL    SEVEN       ;POINTER POINTS TO DEMAND NEXT LSD.
4D                LR      A,I         ;LOAD DEMAND NEXT LSD.
07                LR      QL,A        ;STORE TEMPORARILY.
64                LISU    BUFF3       ;LOAD METER2 BUFFER POINTER.
02                LR      A,QU        ;RETRIEVE DEMAND NEXT LSD.
5D                LR      I,A         ;STORE IN PEAK NEXT LSD.
03                LR      A,QL        ;RETRIEVE DEMAND NEXT LSD.
5D                LR      I,A         ;STORE IN PEAK NEXT LSD.
6C                LISL    FOUR        ;POINTER POINTS TO DEMAND NEXT LSD.
4D                LR      A,I         ;LOAD DEMAND NLSW.
6A                LISL    TWO         ;POINTER POINTS TO PEAK NLSW.
5D                LR      I,A         ;STORE IN PEAK NLSW.
6D                LISL    FIVE        ;POINTER POINTS TO DEMAND MSW.
4D                LR      A,I         ;LOAD DEMAND MSW.
6B                LISL    THREE       ;POINTER POINTS TO PEAK MSW.
5D                LR      I,A         ;STORE IN BUFFER.
2010              LI      10H         ;LOAD DISPLAY BUFFER POINTER.
07                LR      QL,A        ;STORE FOR DECSEG USE.
13                SL      1           ;GENERATE POINTER TO DATA TO USE.
5A                LR      R10,A       ;STORE FOR UPDIS USE.
280742            PI      UPDIS       ;UPDATE DEMAND READINGS.
70                CLR                 ;LOAD DEMAND FLAG ADDRESS.
06                LR      QU,A        ;STORE ADDRESS FOR WRLOAD USE.
28077E            PI      WRLOAD      ;LOAD DEMAND VALUES.
280795            PI      WRVAL       ;UPDATE DEMAND VALUES IN EAROM.
29022F   DM23     JMP     ZDEM        ;REINITIALIZE FOR NEXT DEMAND INTERVAL.
         ;
         ;
         NAME    ENCODE
         SECTION ENCODE
         GLOBAL  TABLE
         ;
         ;
         ;       THIS ROUTINE IS ONE-HALF OF THE CODE USED TO IMPLEMENT A
         ;CODE ERROR DETECTION/CORRECTION SCHEME.  THIS ROUTINE CALCULATES
         ;THE HAMMING CODE BITS, FOUR BITS, AND APPENDS THE CODE GENERATED
         ;TO THE FOUR DATA BITS.  THE DATA BITS ARE THE FOUR LOW ORDER BITS
         ;OF THE BYTE.
         ;
         ;
2A03DA            DCI     TABLE       ;LOAD ENCODE TABE POINTER.
7F                LIS     0FH         ;FETCH DATA.
FB                NS      R11         ;ZERO CODE BITS.
5B                LR      R11,A       ;SAVE FOR FUTURE USE.
2107              NI      07H         ;PREPARE FOR CODE GENERATION, CO.
8E                ADC                 ;CALCULATE ENCODE TABLE ADDRESS.
```

```
16              LM                      ;GET FIRST CHECK BIT, C0.
EB              XS       R11            ;APPEND TO DATA BITS.
5B              LR       R11,A          ;STORE.
2A03DA          DCI      TABLE          ;LOAD ENCODE TABLLE POINTER.
210D            NI       0DH            ;PREPARE FOR CODE GENERATION, C1.
8E              ADC                     ;CALCULATE ENCODE TABLE ADDRESS.
16              LM                      ;GET SECOND CHECK BIT, C1.
13              SL       1              ;PUT IN PROPER POSITION.
EB              XS       R11            ;APPEND TO DATA BITS.
5B              LR       R11,A          ;STORE.
2A03DA          DCI      TABLE          ;LOAD ENCODE TABLE POINTER.
210E            NI       0EH            ;PREPARE FOR CODE GENERATION, C2.
8E              ADC                     ;CALCULATE ENCODE TABLE ADDRESS.
16              LM                      ;GET THIRD CHECK BIT, C2.
13              SL       1              ;PUT IN PROPER POSITION.
13              SL       1              ;PUT IN PROPER POSITION.
EB              XS       R11            ;APPEND TO DATA BITS.
5B              LR       R11,A          ;STORE.
2A03DA          DCI      TABLE          ;LOAD ENCODE TABLE POINTER.
210B            NI       0BH            ;PREPARE FOR CODE GENERATION, C3.
8E              ADC                     ;CALCULATE ENCODE TABLE ADDRESS.
16              LM                      ;GET FOURTH CHECK BIT, C3.
13              SL       1              ;PUT IN PROPER POSITION.
13              SL       1              ;PUT IN PROPER POSITION.
13              SL       1              ;PUT IN PROPER POSITION.
EB              XS       R11            ;APPEND TO DATA BITS.
5B              LR       R11,A          ;STORE FINAL RESULLT.
1C              POP                     ;RETURN.
                ;
                ;     THIS TABLE IS A PARITY LOOK UP TABLE.  ONLY THE HIGH ORDER FOUR
                ;BITS OF EACH BYTE IN THE TABLE ARE USED.  THE TABLE IS AN ODD PARITY
                ;TABLE AND A LOW, A ZERO, INDICATES ODD PARITY.
                ;
10000010        TABLE BYTE  10H,00H,00H,10H,00H,10H,10H,00H,00H,10H,10H,00H,
00101000                    10H,00H,00H,10H
00101000
10000010
                ;
                ;
                NAME     FIDPT
                SECTION  FIDPT
                GLOBAL   SHFTLT
                ;
                ;
                ;     THIS ROUTINE LOCATES THE DECIMAL POINT RELATIVE TO THE DIGITS
                ;TO THE SPECIFIED LOCATION DEPENDING UPON WHETHER A FIXED OR FLOATING
                ;POINT FORMAT WAS PROGRAMMED.  OUTPUT OF THIS ROUTINE IS THE FOUR
                ;DIGITS TO BE DISPLAYED, IN PACKED DECIMAL FORM, AND THE LOCATION
                ;OF THE DECIMAL POINT.
                ;
                ;
08              LR       K,P            ;SAVE RETURN ADDRESS.
68              LISL     ZERO           ;POINTER POINTS TO BUFFER POINTER.
4D              LR       A,I            ;LOAD POINTER.
13              SL       1              ;SET CPU FLAGS.
841D            BZ       FIPT6          ;POINTER SET FOR LOCKUP USE OF FIDPT.
4C              LR       A,S            ;LOAD SPECIFIED DECIMAL POINT.
2504            CI       04H            ;CHECK FOR FLOATING POINT FORMAT.
8419            BZ       FIPT3          ;FLOATING POINT FORMAT SELECTED.
18              COM                     ;CHANGE DECIMAL POINT TO SHIFT COUNTER.
2103            NI       03H            ;MASK IN DESIRED BITS.
5B              LR       R11,A          ;STORE FOR COUNTER USE.
8408            BZ       FIPT2          ;DECIMAL POINT POSITION 3 SPECIFIED.
6A       FIPT1  LISL     TWO            ;POINTER POINTS TO FIRST DATA ITEM.
2806F4          PI       SHFTLT         ;SHIFT DATA GROUP ONE DIGIT LEFT.
3B              DS       R11            ;DECREMENT DECIMAL POINT COUNT.
94FA            BNZ      FIPT1          ;NOT FINISHED YET.
68       FIPT2  LISL     ZERO           ;POINTER POINTS TO DISPLAY BUFFER
4D              LR       A,I            ;LOAD DISPLAY BUFFER POINTER.
```

```
06                  LR      QU,A        ;STORE FOR DECSEG USE.
4D                  LR      A,I         ;LOAD DECIMAL POINT VALUE.
5B                  LR      R11,A       ;STORE FOR DECSEG USE.
4D                  LR      A,I         ;LOAD FIRST DATA ITEM.
07                  LR      QL,A        ;STORE FOR DECSEG USE.
4D                  LR      A,I         ;LOAD LAST DATA ITEM.
5A                  LR      R10,A       ;STORE FOR DECSEG USE.
0C                  PK                  ;RETURN.
74        FIPT6     LIS     04H         ;LOAD DECIMAL POINT COUNTER VALUE.
5B        FIPT3     LR      R11,A       ;DECIMAL POINT COUNTER STORED.
3B        FIPT4     DS      R11         ;DECREMENT DECIMAL PONT COUNTER.
840C                BZ      FIPT5       ;DECIMAL POINT LIMIT REACHED.
6A                  LISL    TWO         ;POINTER POINTS TO THE FIRST DATA ITEM.
4C                  LR      A,S         ;LOAD FIRST DATA ITEM.
21F0                NI      0F0H        ;CHECK FOR LEADING ZERO.
9406                BNZ     FIPT5       ;NO LEADING ZEROES. DECIMAL POINT IN
2806F4              PI      SHFTLT      ;SHIFT DATA GROUP ONE DIGIT LEFT.
90F3                BR      FIPT4       ;NEXT ITERATION.
69        FIPT5     LISL    ONE         ;POINTER POINTS TO DECIMAL POINT
4B                  LR      A,R11       ;LOAD CALCULATED DECIMAL POINT.
5C                  LR      S,A         ;STORE IN BUFFER.
90E2                BR      FIPT2       ;PREPARE RETURN DATA.
;
;
    NAME    FLASH
    SECTION FLASH
;
;
;       THIS ROUTINE WILL FLASH A VALUE ON THE DISPLAY FOR SIX ON TIMES
;AT APPROXIMATELY A 2 HERTZ RATE.  THE VALUE TO BE FLASHED IS
;PASSED IN REGISTER 0B.
;
;
08                  LR      K,P         ;SAVE RETURN ADDRESS.
7D                  LIS     0DH         ;LOAD FLASH COUNTER.
5A                  LR      R10,A       ;COUNTER LOADED.
203B                LI      03BH        ;LOAD BUFFER POINTER.
52                  LR      R2,A        ;FOR INTRPT USE.
0B                  LR      IS,A        ;FOR FLASH USE.
4B                  LR      A,R11       ;LOAD VALUE TO BE FLASHED.
5D        FSH2      LR      I,A         ;FIRST DIGIT.
8FFE                BR7     FSH2        ;ALL DIGITS LOADED.
20CF                LI      0CFH        ;LOAD ON/OFF CONTROL BIT.
53                  LR      R3,A        ;SET FOR ON.
2010                LI      10H         ;LOAD RATE COUNTER.
55                  LR      R5,A        ;STORE.
1B                  EI                  ;ENABLE INTERRUPTS.
45        FSH1      LR      A,R5        ;CHECK RATE COUNTER.
12                  SR      1           ;ZERO?
94FD                BNZ     FSH1        ;NOT YET.
2010                LI      10H         ;RELOAD RATE COUNTER.
55                  LR      R5,A        ;STORE.
13                  SL      1           ;CHANGE VALUE FOR DISPLAY CONTROL WORD
E3                  XS      R3          ;TOGGLE DISPLAY ON/OFF CONTROL.
53                  LR      R3,A        ;STORE DISPLAY CONTROL WORD.
3A                  DS      R10         ;DECREMENT FLASH COUNTER.
94F4                BNZ     FSH1        ;KEEP FLASHING.
1A                  DI                  ;DISABLE INTERRUPTS.
0C                  PK                  ;RETURN.
;
;
    NAME    GREAT
    SECTION GREAT
    GLOBAL  START,READ,DECODE,ENCODE,WRITE,SUBTCT
;
;       THIS ROUTINE SUBTRACTS ONE DATA GROUP ELEMENT FROM A SECOND
;GROUP ELEMENT OF ANOTHER SET AND USE THE RESULTING PRELOAD TO
;DETERMINE WHICH DATA GROUP SET WAS GREATEST AND THEN CORRECT
```

;THE ERRING DATA GROUP POINTER FLAG TO POINT TO THE LARGEST VALUE
;DATA GROUP. THIS ROUTINE IS ONLY CALLED FOR DEMAND AND CUMULATIVE
;DATA GROUP POINTER ERRORS.
;

```
1A                 DI                    ;DISABLE INTERRUPTS DUE TO HEAVY
68                 LISL    ZERO          ;POINTER POINTS TO ADDRESS OF ERRING
75                 LIS     05H           ;LOAD NUMBER OF BYTES FROM EAROM TO
59                 LR      R9,A          ;STORE IN COUNTER.
4C                 LR      A,S           ;LOAD ADDRESS OF ERRING FLAG.
56                 LR      R6,A          ;STORE FOR FUTURE USE.
1F                 INC                   ;CHANGE ADDRESS TO POINT TO DATA GROUP
55                 LR      R5,A          ;STORE IN REGISTER.
2405               AI      05H           ;CHANGE ADDRESS TO POINT TO DATA GROUP
54                 LR      R4,A          ;STORE IN REGISTER.
72         GRT1    LIS     02H           ;LOAD NUMBER OF BYTES TO READ BEFORE
57                 LR      R7,A          ;STORE IN COUNTER.
209A               LI      9AH           ;LOAD SUBTRACT PRELOAD.
5D                 LR      I,A           ;STORE IN BUFFER FOR SUBTCT USE.
203C               LI      3CH           ;LOAD ADDRESS OF SECOND OPERAND, DATA
5D                 LR      I,A           ;STORE IN BUFFER.
1F                 INC                   ;CHANGE POINTER TO POINT TO FIRST
5D                 LR      I,A           ;STORE IN BUFFER.
1F                 INC                   ;CHANGE POINTER TO POINT TO RESULT
5D                 LR      I,A           ;STORE IN BUFFER.
6C                 LISL    FOUR          ;POINTER POINTS TO SECOND OPERAND
45                 LR      A,R5          ;LOAD EAROM ADDRESS TO DATA GROUP A.
5A                 LR      R10,A         ;STORE FOR READ USE.
1F                 INC                   ;CHANGE ADDRESS FOR NEXT ITERATION.
55                 LR      R5,A          ;STORE FOR NEXT ITERATION.
2806B5     GRT2    PI      READ          ;READ DATA FROM EAROM.
280280             PI      DECODE        ;DECODE DATA READ.
4B                 LR      A,R11         ;LOAD DECODED DATA.
5D                 LR      I,A           ;STORE IN BUFFER.
37                 DS      R7            ;DECREMENT READ COUNTER.
8407               BZ      GRT3          ;IF ZERO, BOTH PIECES OF DATA PRESENT
44                 LR      A,R4          ;LOAD EAROM ADDRESS TO DATA GROUP B.
5A                 LR      R10,A         ;STORE FOR READ USE.
1F                 INC                   ;CHANGE ADDRESS FOR NEXT ITERATION.
54                 LR      R4,A          ;STORE FOR NEXT ITERATION.
90F0               BR      GRT2          ;READ DATA GROUP B DATA.
28070B     GRT3    PI      SUBTCT        ;COMPARE DATA ITEMS.
68                 LISL    ZERO          ;POINTER POINTS TO PRELOAD VALUE.
71                 LIS     01H           ;SET UP LESS THAN TEST BIT MASK.
FC                 NS      S             ;TEST BIT.
9404               BNZ     GRT4          ;IF NOT ZERO, THEN DATA B IS LESS THAN
39                 DS      R9            ;DECREMENT NUMBER OF COMPARISONS
94D4               BNZ     GRT1          ;IF ZERO, THEN DATA A IS GREATER THAN OR
5B         GRT4    LR      R11,A         ;LOAD FLAG VALUE INTO DATA REGISTER FOR
2803AC             PI      ENCODE        ;ENCODE DATA.
46                 LR      A,R6          ;LOAD ADDRESS OF ERRING FLAG.
5A                 LR      R10,A         ;STORE FOR WRITE USE.
280752             PI      WRITE         ;CORRECT ERRING FLAG.
290000             JMP     START         ;START OPERATION FROM THE BEGINNING.
```

;
NAME    LOADVL
SECTION LOADVL
;
;
;       THIS ROUTINE FORMATS AND LOADS DEMAND AND CUMULATIVE VALUES
;THEY HAVE BEEN READ FROM THE EAROM. DATA IS ASSUMED TO BE IN THE
;LAST RAM BUFFER WITH THE DESTINATION ADDRESS STORED IN REGISTER 0B.
;
;

```
67                 LISU    BUFF6         ;LOAD POINTER TO GENERAL PURPOSE BUFFER
69                 LISL    ONE           ;POINTER POINTS TO FIRST VALUE.
71                 LIS     01H           ;LOAD MASK VALUE.
FD                 NS      I             ;MASK IN DATA.
```

```
840D            BZ      LDVL1   ;DECIMAL POSITION ZERO OR ONE SPECIFIED.
4D              LR      A,I     ;LOAD FIRST DATA ITEM.
15              SL      4       ;LEFT JUSTIFY.
ED              XS      I       ;APPEND SECOND DATA ITEM.
5A              LR      R10,A   ;STORE TEMPORARILY.
4D              LR      A,I     ;LOAD THIRD DATA ITEM.
15              SL      4       ;LEFT JUSTIFY.
ED              XS      I       ;APPEND FOURTH ITEM.
5B              LR      R11,A   ;STORE TEMPORARILY.
70              CLR             ;LOAD ZERO.
06              LR      QU,A    ;STORE FIFTH ITEM.
900A            BR      LDVL2   ;COMPLETE LOAD SEQUENCE.
4D      LDVL1   LR      A,I     ;LOAD FIRST ITEM.
5A              LR      R10,A   ;STORE TEMPORARILY.
4D              LR      A,I     ;LOAD SECOND DATA ITEM.
15              SL      4       ;LEFT JUSTIFY.
ED              XS      I       ;APPEND THIRD DATA ITEM.
5B              LR      R11,A   ;STORE TEMPORARILY.
4D              LR      A,I     ;LOAD FOURTH DATA ITEM.
15              SL      4       ;LEFT JUSTIFY.
06              LR      QU,A    ;STORE TEMPORARILY.
69      LDVL2   LISL    ONE     ;POINTER POINTS TO DECIMAL POINT VALUE.
72              LIS     02H     ;LOAD MASK VALUE.
FC              NS      S       ;MASK IN SECOND BIT AND SET CPU FLAGS.
03              LR      A,QL    ;LOAD POINTER TO DATA STORAGE POSITION.
0B              LR      IS,A    ;LOAD ISAR WITH DATA STORAGE POINTER.
9403            BNZ     LDVL3   ;IF NOT ZERO, THEN MSW IS NOT ZERO.
70              CLR             ;LOAD ZERO.
5E              LR      D,A     ;STORE IN BUFFER.
4A      LDVL3   LR      A,R10   ;LOAD FIRST DATA ITEM.
5E              LR      D,A     ;STORE IN BUFFER.
4B              LR      A,R11   ;LOAD SECOND DATA ITEM.
5E              LR      D,A     ;STORE IN BUFFER.
02              LR      A,QU    ;LOAD LAST DATA ITEM.
5E              LR      D,A     ;STORE IN BUFFER.
70              CLR             ;LOAD ZERO TO LOAD INTO LAST DATA
5E              LR      D,A     ;STORE IN BUFFER.
1C              POP             ;RETURN.
        ;
        ;
        NAME    METER
        SECTION METER
        GLOBAL  POLL,ADD
        ;
        ;
        ;       THIS ROUTINE SUMS UP THE FRACTIONAL VALUE OF THE CURRENT DEMAND
        ;USAGE BEING MEASURED. A CARRY OUT TO THE INTEGER VALUE, AND
        ;SUBSEQUENT ADDITION OF THAT CARRY, IS PERFORMED BY ACTIVATION OF
        ;THE  * REGIS *  ROUTINE.
        ;
        ;
67              LISU    BUFF6   ;LOAD POINTER TO GENERAL PURPOSE BUFFER
6B              LISL    THREE   ;POINTER POINTS TO FIRST OPERAND POINTER
2018            LI      18H     ;LOAD FIRST OPERAND POINTER VALUE.
5E              LR      D,A     ;STORE IN BUFFER.
1F              INC             ;CHANGE POINTER.
5E              LR      D,A     ;STORE IN BUFFER.
70              CLR             ;CLEAR CARRY IN.
5D              LR      I,A     ;STORE IN BUFFER.
1A              DI              ;DISABLE INTERRUPTS.
74              LIS     04H     ;LOAD ITERATION COUNTER.
54              LR      R4,A    ;STORE COUNTER VALUE.
28004A  MET1    PI      ADD     ;ADD BYTES TOGETHER.
72              LIS     02H     ;LOAD INCREMENT VALUE.
CC              AS      S       ;CHANGE POINTER.
5D              LR      I,A     ;STORE IN BUFFER.
72              LIS     02H     ;LOAD INCREMENT VALUE.
CC              AS      S       ;CHANGE POINTER.
```

```
5E                      LR      D,A         ;STORE IN BUFFER.
34                      DS      R4          ;DECREMENT ITERATION COUNTER.
94F5                    BNZ     MET1        ;NEXT ITERATION.
69                      LISL    ONE         ;POINTER POINTS TO CARRY IN STORAGE.
4C                      LR      A,S         ;LOAD CARRY IN REGISTER.
13                      SL      1           ;SET CPU FLAGS.
840F                    BZ      MET2        ;NO CARRY OUT.
        INCLUDE "REGIS;S/1"
        ;
        ;
        ;       THIS ROUTINE SUMS UP THE INTEGER VALUE OF THE CURRENT DEMAND
        ;BEING MEASURED.
        ;
        ;
6C                      LISL    FOUR        ;LOAD ISAR WITH METER 2 BUFFER AREA
64                      LISU    BUFF3       ;POINTER POINTS TO LOWER TWO DIGITS
71                      LIS     01H         ;LOAD CARRY IN VALUE.
2466                    AI      66H         ;DECIMAL ADDITION PREPARATION.
DC                      ASD     S           ;ADD TO LOWER DIGIT OF ACCUMULATOR.
5D                      LR      I,A         ;STORE RESULT IN LOWER TWO DIGITS OF
9206                    BNC     MET2        ;NO CARRY OUT. DONE.
71                      LIS     01H         ;LOAD CARRY IN.
2466                    AI      66H         ;PREPARE FOR DECIMAL ADDITION.
DC                      ASD     S           ;ADD IN UPPER DIGITS OF DEMAND.
5E                      LR      D,A         ;STORE IN BUFFER.
        ;
        ;       END OF "REGIS".
        ;
2904E1          MET2    JMP     POLL        ;RETURN TO SEQUENCING ROUTINE.
        ;
        NAME    POLL
        SECTION POLL
        GLOBAL  PROG,METER,DEMND,BILL,FLASH,EOM4,ENCODE,WRITE
        ;
        ;
        ;       THIS ROUTINE SERVES AS THE SEQUENCER FOR ALL OPERATIONS OF
        ;
        ;
1B                      EI                  ;ENABLE INTERRUPTS.
64                      LISU    BUFF3       ;LOAD ISAR WITH METER 2 BUFFER AREA
6F                      LISL    SEVEN       ;POINTER POINTS TO CONTROL WORD.
7F                      LIS     0FH         ;LOAD MASK FOR CONTROL WORD.
FC                      NS      S           ;MASK IN CONTROL WORD.
1F                      INC                 ;STORE FOR NEXT TIME.
5C                      LR      S,A         ;MASK IN POLLING CONTROL WORD.
73                      LIS     03H         ;LOAD PRIMARY SEQUENCER MASK.
FC                      NS      S           ;MASK IN SEQUENCER CONTROL BITS.
841A                    BZ      DISK        ;DISK SELECTED.
12                      SR      1           ;IS TIME SELECTED?
842E                    BZ      TIME        ;YES.
4C                      LR      A,S         ;RESET CONTROL WORD.
1F                      INC                 ;CONTROL WORD RESET.
5C                      LR      S,A         ;CONTROL WORD SAVED.
12                      SR      1           ;SET CPU FLAGS.
12                      SR      1           ;SET CPU FLAGS.
846A                    BZ      DISCR       ;DISPLAY CONTROL SELECTED.
12                      SR      1           ;IS EOM SELECTED?
8435                    BZ      EOM         ;YES.
7F                      LIS     0FH         ;RESET CONTROL WORD.
5C                      LR      S,A         ;SAVE FOR FUTURE USE.
40              BOX     LR      A,R0        ;LOAD CURRENT VALUE OF PORT 0.
B0                      OUTS    0           ;CLEAR PORT FOR INPUT OPERATION.
A0                      INS     0           ;INPUT DATA.
2110                    NI      10H         ;MASK IN SERIAL INPUT DATA.
84E0                    BZ      POLL        ;PROGRAMMING BOX IS PRESENT.
2905AA                  JMP     PROG        ;TRANSFER CONTROL TO PROGRAMMING ROUTINE.
1A              DISK    DI                  ;DISABLE INTERRUPTS.
```

```
48              LR      A,R8        ;CHECK LEVEL DETECTOR.
2180            NI      80H         ;MASK IN BIT.
48              LR      A,R8        ;CHECK PULSE LEVEL.
840C            BZ      DISK1       ;NO PUSE YET.
2140            NI      40H         ;MASK IN BIT.
940B            BNZ     DISK2       ;NO PULSE YET.
48              LR      A,R8        ;LOAD LEVEL DETECTOR.
2240            OI      40H         ;SET LEVEL.
58              LR      R8,A        ;STORE LEVEL DETECTOR.
2904B3          JMP     METER       ;PROCESS ONE PULSE INPUT.
21BF    DISK1   NI      0BFH        ;RESET LEVEL.
58              LR      R8,A        ;STORE LEVEL.
90C6    DISK2   BR      POLL        ;RETURN TO SEQUENCING ROUTINE.
E7      TIME    XS      R7          ;COMPARE TO ZERO TO SET FLAGS.
94C3            BNZ     POLL        ;ZERO MINUTES REMAINING IN DEMAND
1A              DI                  ;DISABLE INTERRUPTS.
74              LIS     04H         ;LOAD BIT POSITION OF END OF INTERVAL
E0              XS      R0          ;APPEND CURRENT VALUE OF PORT 0.
B0              OUTS    0           ;START NEGATIVE EDGE.
20D0            LI      0D0H        ;LOAD PULSE LENGTH CONSTANT.
1F      T1      INC                 ;START PULSE WIDTH COUNTER.
92FE            BNC     T1          ;PULSE WIDTH TIMING LOOP.
40              LR      A,R0        ;LOAD CURRENT VALUE OF PORT 0.
B0              OUTS    0           ;START POSITIVE EDGE.
2902C3          JMP     DEMND       ;EXECUTE DEMAND INTERVAL ROUTINE.
48      EOM     LR      A,R8        ;CHECK BILLING PERIOD INDICATOR.
2120            NI      20H         ;MASK IN INDICATOR BIT.
940C            BNZ     EOM3        ;INDICATOR SET.
A0              INS     0           ;READ BILLING PERIOD SWITCH.
2102            NI      02H         ;MASK OUT UNWANTED BITS.
8405            BZ      EOM2        ;SWITCH NOT DEPRESSED.
48              LR      A,R8        ;PREPARE TO DECREMENT DEBOUNCE COUNTER.
2220            OI      20H         ;MASK OUT DEBOUNCE COUNTER AND
58              LR      R8,A        ;STORE VALUE.
90A5    EOM2    BR      POLL        ;RETURN TO SEQUENCING ROUTINE.
1A      EOM3    DI                  ;DISABLE INTERRUPTS.
66              LISU    BUFF5       ;LOAD POINTER TO CONDITION BUFFER AREA.
6A              LISL    TWO         ;POINTER POINTS TO ERROR FLAG.
4C              LR      A,S         ;LOAD ERROR FLAG.
1F              INC                 ;HAS AN ERROR OCCURRED?
9214            BNC     EOM5        ;NO. KEEP GOING.
202F            LI      ERRFLG      ;LOAD ADDRESS OF EAROM ERROR FLAG.
5A              LR      R10,A       ;STORE IN PARAMETERS AREA.
7F              LIS     0FH         ;LOAD ERROR FLAG VALUE.
5B              LR      R11,A       ;STORE DATA FOR ENCODE AND WRITE USE.
2803AC          PI      ENCODE      ;ENCODE DATA TO BE WRITTEN.
280752          PI      WRITE       ;WRITE ERROR INTO EAROM.
20F0    EOM4    LI      0F0H        ;LOAD BLANKING COMMAND PLUS LIGHT DP
5B              LR      R11,A       ;STORE IN PARAMETERS AREA.
280421          PI      FLASH       ;FLASH DISPLAY.
90F9            BR      EOM4        ;FASH DISPLAY FOREVER.
78      EOM5    LIS     08H         ;LOAD ZERO FOR DISPLAY PURPOSES.
5B              LR      R11,A       ;STORE IN PARAMETERS AREA.
280421          PI      FLASH       ;FLASH DISPLAY TO INDICATE EOM SWITCH
29010D          JMP     BILL        ;PROCESS END OF BILLING PERIOD
43      DISCR   LR      A,R3        ;LOAD DISPLAY TIMER VALUE.
211F            NI      1FH         ;MASK IN SECONDS.
940A            BNZ     DIS1        ;TIME INTERVAL NOT UP. DO NOTHING WITH
43              LR      A,R3        ;CHECK STATUS OF DISPLAY ON/OFF BIT.
2120            NI      20H         ;MASK IN DISPLAY ON/OFF BIT.
8407            BZ      DIS2        ;DISPLAY CURRENTLY OFF. TURN ON.
E3              XS      R3          ;RESET DISPLAY ON/OFF BIT.
2202            OI      02H         ;SET TIMER FOR 2 SECONDS.
53              LR      R3,A        ;TIMER LOADED.
90CD    DIS1    BR      EOM2        ;RETURN TO SEQUENCING ROUTINE.
77      DIS2    LIS     07H         ;LOAD VALUE OF METERTYPE.
F8              NS      R8          ;MASK IN METERTYPE.
5A              LR      R10,A       ;STORE METERTYPE IN PARAMETERS AREA.
```

```
43              LR      A,R3        ;LOAD DISPLAY TIMER VALUE.
3A              DS      R10         ;SET CPU FLAGS.
8416            BZ      DIS6        ;YES.
3A              DS      R10         ;SET CPU FLAGS.
8425            BZ      DIS7        ;YES.
3A              DS      R10         ;SET CPU FLAGS.
8422            BZ      DIS7        ;YES.
12              SR      1           ;MASK IN BUFFER SELECT CODES.
8424            BZ      DIS4        ;DISPLAY DEMAND VALUES.
2520            CI      20H         ;NEXT CODE COMPARISON.
840C            BZ      DIS5        ;DISPLAY CUMULATIVE VALUES.
2050    DIS3    LI      50H         ;LOAD ISAR AND LED VALUES.
52              LR      R2,A        ;STORE VALUES SPECIFIED.
2066            LI      66H         ;LOAD NEXT BUFFER DISPLAY CODE, TIME.
53              LR      R3,A        ;STORE VALUES SPECIFIED.
90E3            BR      DIS1        ;DONE.
12      DIS6    SR      1           ;SET CPU FLAGS.
84F6            BZ      DIS3        ;CUMULATIVE VALUE DISPLAY.
203C    DIS5    LI      3CH         ;LOAD ISAR AND LED VALUE.
52              LR      R2,A        ;SAVE SPECIFIED BUFFER VALUE.
0B              LR      IS,A        ;LOAD LAMP TEST DATA.
2086            LI      86H         ;FIGURE 8 AND BOTH DISCRETE LEDS.
5D              LR      I,A         ;STORE IN BUFFER.
5D              LR      I,A         ;STORE IN BUFFER.
5D              LR      I,A         ;STORE IN BUFFER.
5D              LR      I,A         ;STORE IN BUFFER.
2026            LI      26H         ;LOAD NEXT BUFFER CODE, DISPLAY TIME,
53              LR      R3,A        ;STORE VALUES.
90D1            BR      DIS1        ;DONE.
2080    DIS7    LI      80H         ;SET CPU FLAGS.
F3              NS      R3          ;CHECK NEXT DISPLAY CODE.
94ED            BNZ     DIS5        ;LAMP TEST.
2094    DIS4    LI      94H         ;LOAD ISAR AND LED VALUE.
52              LR      R2,A        ;SAVE SPECIFIED BUFFER AND LED VALUES.
20A6            LI      0A6H        ;LOAD NEXT BUFFER CODE, DISPLAY TIME.
53              LR      R3,A        ;STORE VALUES.
90C4            BR      DIS1        ;DONE.
        ;
        ;
        ;
        NAME    PROG.1
        SECTION PROG
            GLOBAL  ADDR1,WRVAL,RDVAL,START
        ;
        ;
        ;       THIS ROUTINE PROGRAMS THE CONSTANTS REQUIRED FOR OPERATION INTO
        ;THE EAROM.  HUMAN INTERFACE IS THROUGH THE HARDWARE PROGRAMMING BOX.
        ;
        ;
20FF            LI      0FFH        ;LOAD MAXIMUM COUNT VALUE.
56              LR      R6,A        ;STORE IN SECONDS COUNTER.
2A0272          DCI     ADDR1       ;LOAD POINTER TO ADDRESS TABLE.
2011            LI      11H         ;LOAD FIRST CONSTANT NUMBER.
57      PRG1    LR      R7,A        ;STORE IN REGISTER.
16      PRG14   LM                  ;LOAD ADDRESS TO READ FROM.
5A              LR      R10,A       ;STORE FOR RDVAL USE.
16              LM                  ;LOAD NUMBER OF BYTES TO READ.
5B              LR      R11,A       ;STORE FOR RDVAL USE.
28067B          PI      RDVAL       ;READ DATA.
        INCLUDE "DISFQR:S/1"
        ;
        ;
        ;       THIS ROUTINE FORMATS THE DATA READ FROM THE PROGRAMMING BOX
        ;INTO THE APPROIATE VALUE FOR THE CONSTANT SELECTED FOR PROGRAMMING.
        ;THE FORMATTED DATA IS THEN MADE AVAILABLE TO THE DISPLAY DRIVER
        ;THROUGH THE USE OF A POINTER.
        ;
        ;
4D      DSF1    LR      A,I         ;DETERMINE LAST DATA ENTRY ISAR VALUE.
1F              INC                 ;IS VAUE END OF DATA INDICATOR.
```

```
92FD                BNC     DSF1        ;END NOT FOUND YET.
4E                  LR      A,D         ;DUMMY LOAD FOR ISAR DECREMENT.
4E                  LR      A,D         ;DUMMY LOAD FOR ISAR DECREMENT.
4E                  LR      A,D         ;LOAD LAST PIECE OF DATA.
15                  SL      4           ;LEFT JUSTIFY.
1F                  INC                 ;MASK OUT DECIMAL POINT.
5B                  LR      R11,A       ;STORE TEMPORARILY.
0A                  LR      A,IS        ;CHECK ISAR FOR END OF BUFFER.
2107                NI      07H         ;MASK IN BITS INTERESTED IN.
9405                BNZ     DSF4        ;NOT ZERO YET.
20F1                LI      0F1H        ;LOAD BLANKING COMMAND.
9004                BR      DSF5        ;CONTINUE.
4E       DSF4       LR      A,D         ;LOAD NEXT DATA ITEM.
15                  SL      4           ;LEFT JUSTIFY.
1F                  INC                 ;MASK OUT DECIMAL POINT.
5A       DSF5       LR      R10,A       ;STORE TEMPORARILY.
0A                  LR      A,IS        ;CHECK ISAR FOR END OF BUFFER.
2107                NI      07H         ;MASK IN BITS INTERESTED IN.
9405                BNZ     DSF2        ;NOT ZERO YET.
20F1                LI      0F1H        ;LOAD BLANKING COMMAND.
9004                BR      DSF3        ;FINISH LOADING PROCESS.
4E       DSF2       LR      A,D         ;LOAD LAST DATA ITEM.
15                  SL      4           ;LEFT JUSTIFY.
1F                  INC                 ;MASK OUT DECIMAL POINT.
59       DSF3       LR      R9,A        ;STORE TEMPORARILY.
2010                LI      10H         ;LOAD DISPLAY AREA POINTER.
0B                  LR      IS,A        ;LOAD ISAR.
52                  LR      R2,A        ;LOAD DISPLAY CONTROL REGISTER.
203F                LI      03FH        ;LOAD DISPLAY TIMER REGISTER.
53                  LR      R3,A        ;REGISTER LOADED.
47                  LR      A,R7        ;LOAD CONSTANT NUMBER.
5D                  LR      I,A         ;STORE IN BUFFER.
49                  LR      A,R9        ;LOAD FIRST DIGIT.
5D                  LR      I,A         ;STORE IN BUFFER.
4A                  LR      A,R10       ;LOAD SECOND DIGIT.
5D                  LR      I,A         ;STORE IN BUFFER.
4B                  LR      A,R11       ;LOAD LAST DIGIT.
5D                  LR      I,A         ;STORE IN BUFFER.
         ;
         ;          END OF  * DISFOR *
         ;
1B       PRG2       EI                  ;ENABLE INTERRUPTS.
45                  LR      A,R5        ;CHECK PROGRAMING BOX DEBOUNCING TIMER.
2501                CI      01H         ;EQUAL TO ZERO?
94FB                BNZ     PRG2        ;NOT YET. KEEP DISPLAYING.
1A                  DI                  ;DISABLE INTERRUPTS.
         INCLUDE "REPRBX.S/1"
         ;
         ;
         ;          THIS ROUTINE READ PROGRAMMING DATA FROM THE HARDWARE
         ;BOX.  THIS DATA HAS THREE FORMATS: 1) ALL ZEROES WHICH INDICATES
         ;THAT THE DISPLAY IS TO BE UNCHANGED, 2) ALL ONES WHICH INDICATES
         ;THAT THE DISPLAY IS TO DISPLAY THE NEXT CONSTANT TO BE PROGRAMMED
         ;AND SHOW THE CURRENT VALUE OF THAT CONSTANT, AND 3) FOUR HEX NUMBERS
         ;OF WHICH THE FIRST HAS THE DECIMAL VALUE 10, AND THE REMAINING
         ;THREE NUMBERS HAVE THE DECIMAL VALUE 0-10 EACH.  THE DATA IS INPUT
         ;SERIALLY FROM THE PROGRAMMING BOX THROUGH CONTROL OF THE TRANSMIT
         ;CLOCK.
         ;
         ;
7F                  LIS     0FH         ;SET BIT COUNTER.
5A                  LR      R10,A       ;COUNTER LOADED.
70                  LIS     0H          ;LOAD ZERO.
59                  LR      R9,A        ;UPPER DIGITS ZEROED.
5B       REP3       LR      R11,A       ;LOWER DIGITS ZEROED.
13       REP1       SL      1           ;NEXT BIT POSITION READY.
5B                  LR      R11,A       ;STORE CURRENT DATA.
40                  LR      A,R0        ;LOAD CURRENT VALUE OF PORT 0.
B0                  OUTS    0           ;PORT 0 CLEARED.
```

| | | | |
|---|---|---|---|
| A0 | INS | 0 | ;INPUT DATA BIT. |
| 18 | COM | | ;ALLOW FOR PORT INVERSION. |
| 2110 | NI | 10H | ;MASK OUT ALL BITS EXCEPT DATA BIT. |
| 14 | SR | 4 | ;ALIGN BIT. |
| EB | XS | R11 | ;APPEND TO OTHER DATA BITS. |
| 5B | LR | R11,A | ;STORE DATA. |
| 40 | LR | A,R0 | ;LOAD CURRENT VALUE OF PORT 0. |
| B0 | OUTS | 0 | ;OUTPUT DATA. |
| 2340 | XI | 40H | ;NEGATIVE GOING EDGE. |
| B0 | OUTS | 0 | ;OUTPUT DATA. |
| 2340 | XI | 40H | ;POSITIVE GOING EDGE. |
| B0 | OUTS | 0 | ;OUTPUT DATA. |
| 3A | DS | R10 | ;DECREMENT BIT COUNTER. |
| 910B | BM | PRG13 | ;FINISHED. |
| 4A | LR | A,R10 | ;CHECK BIT COUNTER. |
| 2507 | CI | 07H | ;HAVE 8 BITS BEEN CLOCKED IN? |
| 4B | LR | A,R11 | ;YES. TRANSFER DATA. |
| 94E5 | BNZ | REP1 | ;NO. NEXT BIT. |
| 59 | LR | R9,A | ;STORE DATA. |
| 70 | LIS | 0H | ;REINITIALIZE DATA REGISTER. |
| 90E0 | BR | REP3 | ;KEEP GOING. |

;
; END OF * REPRBX *
;

| | | | | |
|---|---|---|---|---|
| 203C | PRG13 | LI | 3CH | ;LOAD DEBOUNCING TIMER. |
| 55 | | LR | R5,A | ;TIMER LOADED. |
| 49 | | LR | A,R9 | ;LOAD MSB FROM PROGRAMMING BOX. |
| 25FF | | CI | 0FFH | ;A COMMAND DISPLAY COMMAND? |
| 8435 | | BZ | PRG7 | ;YES. NEXT PROGRAMMING VALUE. |
| 14 | | SR | 4 | ;MASK IN PREAMBLE. |
| 250A | | CI | 0AH | ;IS PREAMBLE CORRECT?? |
| 94C8 | | BNZ | PRG2 | ;YES. FORMAT NEW DATA FOR WRVAL. |
| 67 | PRG3 | LISU | BUFF6 | ;LOAD POINTER TO GENERAL PURPOSE BUFFER |
| 69 | | LISL | ONE | ;POINTER POINTS TO SECOND LOCATION. |
| 47 | | LR | A,R7 | ;LOAD CURRENT CONSTANT NUMBER. |
| 2531 | | CI | 031H | ;IS CURRENT CONSTANT 2? |
| 8407 | | BZ | PRG4 | ;YES. LOAD 3 DIGITS INTO WRVAL BUFFER. |
| 2541 | | CI | 041H | ;IS CURRENT CONSTANT NUMBER 3? |
| 8409 | | BZ | PRG6 | ;YES. LOAD 1 DIGIT INTO WRVAL BUFFER. |
| 9004 | | BR | PRG5 | ;LOAD 2 DIGITS INTO WRVAL BUFFER. |
| 7F | PRG4 | LIS | 0FH | ;LOAD FIRST DIGIT. |
| F9 | | NS | R9 | ;MASK IN FIRST DIGIT. |
| 5D | | LR | I,A | ;STORE IN BUFFER. |
| 4B | PRG5 | LR | A,R11 | ;LOAD REMAINING DIGITS. |
| 14 | | SR | 4 | ;MASK IN SECOND DIGIT. |
| 5D | | LR | I,A | ;STORE IN BUFFER. |
| 7F | PRG6 | LIS | 0FH | ;LOAD REMAINING DIGITS. |
| FB | | NS | R11 | ;MASK IN FINAL DIGIT. |
| 5D | | LR | I,A | ;STORE IN BUFFER. |
| 20FF | | LI | 0FFH | ;LOAD END OF DATA INDICATOR. |
| 5D | | LR | I,A | ;STORE IN BUFFER. |
| 280795 | | PI | WRVAL | ;WRITE DATA TO EAROM. |
| 47 | | LR | A,R7 | ;LOAD CURRENT CONSTANT NUMBER. |
| 2511 | | CI | 11H | ;IS CONSTANT NUMBER 1 SELECTED. |
| 840F | | BZ | PRG7 | ;YES. DO NOT ZERO CUMULATIVE. |
| 68 | | LISL | ZERO | ;SET POINTER TO SECOND LOCATION. |
| 7B | | LIS | 0BH | ;LOAD ADDRESS OF CUMULATIVE FLAG. |
| 5D | | LR | I,A | ;STORE IN BUFFER. |
| 70 | | CLR | | ;LOAD ZERO. |
| 5D | | LR | I,A | ;STORE IN BUFFER. |
| 5D | | LR | I,A | ;STORE IN BUFFER. |
| 5D | | LR | I,A | ;STORE IN BUFFER. |
| 5D | | LR | I,A | ;STORE IN BUFFER. |
| 5D | | LR | I,A | ;STORE IN BUFFER. |
| 18 | | COM | | ;LOAD END OF DATA INDICATOR. |
| 5D | | LR | I,A | ;STORE IN BUFFER. |
| 280795 | | PI | WRVAL | ;ZERO CUMULATIVE EAROM LOCATION. |
| 47 | PRG7 | LR | A,R7 | ;LOAD CURRENT CONSTANT NUMBER. |
| 2511 | | CI | 11H | ;CURRENT CONSTANT NUMBER 1? |

```
8410                BZ      PRG8        ;YES.  CHANGE TO 2.
2521                CI      21H         ;CURRNET CONSTANT NUMBER 2?
8410                BZ      PRG9        ;YES.  CHANGE TO 3.
2531                CI      31H         ;CURRENT CONSTANT NUMBER 3?
8410                BZ      PRG10       ;YES.  CHANGE TO 4.
2541                CI      41H         ;CURRENT CONSTANT NUMBER 4?
8410                BZ      PRG11       ;YES.  CHANGE TO 5.
290000              JMP     START       ;ALL DONE.  RESET AS IF A POWER UP.
2021      PRG8      LI      21H         ;LOAD CONSTANT NUMBER 2.
900B                BR      PRG12       ;PROCESS NEXT CONSTANT.
2031      PRG9      LI      31H         ;LOAD CONSTANT NUMBER 3.
9007                BR      PRG12       ;PROCESS NEXT CONSTANT.
2041      PRG10     LI      41H         ;LOAD CONSTANT NUMBER 4.
9003                BR      PRG12       ;PROCESS NEXT CONSTANT NUMBER.
2051      PRG11     LI      51H         ;LOAD CONSTANT NUMBER 5.
57        PRG12     LR      R7,A        ;STORE VALUE PRIOR TO JUMP INSTRUCTION.
2905B3              JMP     PRG14       ;PROCESS NEXT CONSTANT.
          ;
          ;
          NAME    RDVAL
          SECTION RDVAL
          GLOBAL  ENCODE,DECODE,READ,ERROR,GREAT,STACK,UNSTAK
          ;
          ;
          ;     THIS ROUTINE READS A SPECIFIED NUMBER OF BYTES FROM A SPECIFIED
          ;ADDRESS IN THE EAROM AND PUTS THE DATA READ INTO THE LAST RAM BUFFER.
          ;THE NUMBER OF BYTES TO READ IS PASSED IN REGISTER QU, AND THE
          ;ADDRESS TO READ FROM IS PASSED IN REGISTER OA.
          ;
          ;
08                  LR      K,P         ;SAVE RETURN ADDRESS.
280702              PI      STACK       ;STORE RETURN ADDRESS ON STACK.
2C                  XDC                 ;SAVE CURRENT VALUE OF DATA COUNTER.
4A                  LR      A,R10       ;LOAD FLAG ADDRESS.
5D                  LR      I,A         ;STORE ADDRESS IN BUFFER FOR WRVAL USE.
4B                  LR      A,R11       ;TRANSFER DATA.
06                  LR      QU,A        ;DATA TRANSFERED.
70                  CLR                 ;LOAD ZERO.
54                  LR      R4,A        ;STORE BRANCH CONTROL VALUE.
2806B5    RDV1      PI      READ        ;READ FLAG VALUE FROM EAROM.
280280              PI      DECODE      ;CHECK DATA READ.
44                  LR      A,R4        ;LOAD BRANCH CONTROL VALUE.
13                  SL      1           ;CHECK FOR ZERO.
9414                BNZ     RDV4        ;NOT ZERO.
48                  LR      A,R8        ;LOAD INITIALIZATION FLAG BIT.
2108                NI      08H         ;MASK IN INITIALIZATION AND ERROR BIT.
8404                BZ      RDV2        ;NO.  NO ERROR.
280442              PI      GREAT       ;YES.  FIND GREATEST VALUE.
4B        RDV2      LR      A,R11       ;CHECK VALUE OF FLAG.
13                  SL      1           ;ZERO?
8402                BZ      RDV3        ;YES.  ADDRESS IS CORRECT.
02                  LR      A,QU        ;FETCH ADDRESS OFFSET.
1F        RDV3      INC                 ;CHANGE ADDRESS.
CA                  AS      R10         ;ADD TO ADDRESS.
5A                  LR      R10,A       ;STORE ADDRESS.
54                  LR      R4,A        ;LOAD BRANCH CONTROL VALUE.
90E4                BR      RDV1        ;REPEAT READ/DECODE LOOP.
4B        RDV4      LR      A,R11       ;RETRIEVE DECODED DATA.
5D                  LR      I,A         ;STORE DATA IN BUFFER.
4A                  LR      A,R10       ;FETCH ADDRESS.
1F                  INC                 ;CHANGE ADDRESS.
5A                  LR      R10,A       ;STORE ADDRESS.
02                  LR      A,QU        ;CHECK NUMBER OF WORDS TO READ COUNTER.
24FF                AI      0FFH        ;DECREMENT.
06                  LR      QU,A        ;STORE COUNTER.
94D9                BNZ     RDV1        ;NOT DONE YET.
20FF                LI      0FFH        ;LOAD END OF DATA INDICATOR FOR USE
5D                  LR      I,A         ;STORE IN BUFFER.
```

```
2C                XDC                ;RESTORE PREVIOUS DATA COUNTER.
280739            PI      UNSTAK     ;RESTORE RETURN ADDRESS AND RETURN.
         ;
         ;
         NAME    READ
         SECTION READ
         ;
         ;
         ;       THIS ROUTINE READS ONE BYTE FROM THE EAROM AND RETURNS
         ;READ IN REGISTER 0B.  THE ADRESS TO READ FROM IS PASSED IN REGISTER
         ;
         ;
76                LIS     06H        ;TURN OFF DIGITS.
B4                OUTS    4          ;DIGITS OFF.
20BF              LI      0BFH       ;SET C1 & C2 TO READ MODE.
B5                OUTS    5          ;OUTPUT DATA.
EA                XS      R10        ;APPEND ADDRESS.
51                LR      R1,A       ;LOAD BUFFER.
B5                OUTS    5          ;OUTPUT DATA.
70                CLR                ;CLEAR DATA PORT.
B1                OUTS    1          ;PORT CLEARED.
41                LR      A,R1       ;LOAD CURRENT VALUE OF PORT 5.
2380              XI      80H        ;PULSE CLOCK LINE.
B5                OUTS    5          ;POSITIVE GOING EDGE.
2380              XI      80H        ;NEGATIVE GOING EDGE.
B5                OUTS    5          ;CLOCK PULSE COMPLETE.
A1                INS     1          ;READ DATA FROM INPUT PORT.
18                COM                ;ALLOW FOR PORT INVERSION.
5B                LR      R11,A      ;SAVE VALUE READ FROM EAROM.
1C                POP                ;RETURN.
         ;
         ;
         NAME    RFDIS
         SECTION RFDIS
         GLOBAL  RF2
         ;
         ;
         ;       THIS ROUTINE TRANSFERS DATA FROM A RAM LOCATION SPECIFIED TO
         ;LAST RAM BUFFER FOR USE IN THE  * FIDPT *  ROUTINE.  THE DATA
         ;POINTER IS PASSED IN REGISTER 0A.
         ;
         ;
1A                DI                 ;DISABLE INTERRUPTS DUE TO EXTREME
66                LISU    BUFF5      ;LOAD POINTER TO METER 3 BUFFER AREA.
69                LISL    ONE        ;POINTER POINTS TO FIXORNOT STORAGE.
4C                LR      A,S        ;LOAD VALUE.
5B                LR      R11,A      ;STORE TEMPORARILY.
4A                LR      A,R10      ;LOAD ISAR VALUE POINTING TO DATA GROUP
0B                LR      IS,A       ;LOAD ISAR VALUE.
78                LIS     08H        ;LOAD MASK VALUE.
FA                NS      R10        ;MASK IN ISAR VALUE.
4B                LR      A,R11      ;LOAD SPECIFIED DECIMAL POINT.
9402              BNZ     RF1        ;CUMULATIVE VALUES?
14                SR      4          ;RIGHT JUSTIFY.
210F      RF1     NI      0FH        ;MASK IN DECIMAL POINT VALUE.
5B                LR      R11,A      ;STORE FOR LATER USE.
4D                LR      A,I        ;LOAD SEECTED LSW.
06                LR      QU,A       ;STORE TEMPORARILY.
4D                LR      A,I        ;LOAD SELECTED NLSW.
04                LR      KU,A       ;STORE TEMPORARILY.
4D                LR      A,I        ;LOAD SELECTED NMSW.
05                LR      KL,A       ;STORE TEMPORARILY.
4D                LR      A,I        ;LOAD SELECTED MSW.
59                LR      R9,A       ;STORE TEMPORARILY.
67        RF2     LISU    BUFF6      ;LOAD POINTER TO GENERAL PURPOSE BUFFER
68                LISL    ZERO       ;POINTER POINTS TO FIRST LOCCATION.
03                LR      A,QL       ;RETRIEVE DISPLAY BUFFER POINTER.
5D                LR      I,A        ;STORE IN BUFFER.
```

```
4B              LR      A,R11   ;RETRIEVE FIXORNOT VALUE.
5D              LR      I,A     ;STORE IN BUFFER.
49              LR      A,R9    ;RETRIEVE MSW.
5D              LR      I,A     ;STORE IN BUFFER.
01              LR      A,KL    ;RETRIEVE NMSW.
5D              LR      I,A     ;STORE IN BUFFER.
00              LR      A,KU    ;RETRIEVE NLSW.
5D              LR      I,A     ;STORE IN BUFFER.
02              LR      A,QU    ;RETRIEVE LSW.
5D              LR      I,A     ;STORE IN BUFFER.
20FF            LI      0FFH    ;LOAD END OF DATA INDICATOR.
5D              LR      I,A     ;STORE IN BUFFER.
1C              POP             ;RETURN.
        ;
        ;
        NAME    SHFTLT
        SECTION SHFTLT
        ;
        ;
        ;       THIS ROUTINE IS USED BY THE  * FIDPT * ROUTINE TO SHIFT A
        ;SIZE DECIMALLY FORMATTED BUFFER ONE DIGIT TO THE LEFT.
        ;
        ;
4D      SHF1    LR      A,I     ;LOAD FIRST DATA ITEM.
25FF            CI      0FFH    ;IS ITEM THE END OF DATA INDICATOR.
8409            BZ      SHF2    ;YES. ALL DONE.
15              SL      4       ;NO. SHIFT BUFFER LEFT ONE DIGIT.
5A              LR      R10,A   ;STORE TEMPORARILY.
4E              LR      A,D     ;LOAD NEXT DATA ITEM.
14              SR      4       ;RIGHT JUSTIFY.
EA              XS      R10     ;FORM NEW DATA ITEM.
5D              LR      I,A     ;STORE IN BUFFER.
90F4            BR      SHF1    ;NEXT DATA ITEM.
1C      SHF2    POP             ;RETURN.
        ;
        ;
        NAME    STACK
        SECTION STACK
        ;
        ;
        ;       THIS ROUTINE IS USED TO OVERCOME THE LIMITED STACK DEPTH OF THE
        ;PROCESSOR. THIS ROUTINE IS USED ONLY WHEN THE STACK DEPTH MUST
        ;EXCEED 3. THE RETURN ADDRESS IS STORED IN THE SECOND TO LAST RAM
        ;BUFFER. ONLY ONE RETURN ADDRESS MAY BE STORED THROUGH THIS ROUTINE.
        ;IE. ONLY A STACK DEPTH OF 4 IS PERMITTED.
        ;
        ;
66              LISU    BUFF5   ;LOAD POINTER TO CONDITION BUFFER AREA.
6C              LISL    FOUR    ;POINTER POINTS TO STACK STORAGE.
00              LR      A,KU    ;TRANSFER UPPER BYTE.
5D              LR      I,A     ;STORE IN BUFFER.
01              LR      A,KL    ;TRANSFER OWER BYTE.
5D              LR      I,A     ;STORE IN BUFFER.
67              LISU    BUFF6   ;LOAD POINTER TO GENERAL PURPOSE BUFFER
68              LISL    ZERO    ;POINTER POINTS TO FIRST LOCATION.
1C              POP             ;RETURN.
        ;
        ;
        NAME    SUBTCT
        SECTION SUBTCT
        GLOBAL  ONED
        ;
        ;
        ;       THIS ROUTINE SUBTRACTS ONE DECIMAL WORD FROM ANOTHER, GENERATES
        ;PRELOAD FOR THE NEXT POSITION, AND STORE THE RESULT OF THE
        ;REGISTER ASSIGNMENTS:
        ;       70 : PRELOAD,
        ;       71 : SECOND OPERAND POINTER,
```

```
;       72 : FIRST OPERAND POINTER.
;       73 : RESULT POINTER.
;
08                LR      K,P         ;SAVE RETURN ADDRESS.
2A0736            DCI     ONED        ;LOAD POINTER TO DECIMAL VALUE ONE.
68                LISL    ZERO        ;POINTER POINTS TO FIRST OPERAND POINTER.
4D                LR      A,I         ;LOAD PRELOAD VALUE.
5A                LR      R10,A       ;STORE FOR FUTURE USE.
4D                LR      A,I         ;LOAD POINTER TO SECOND OPERAND VALUE.
5B                LR      R11,A       ;STORE FOR FUTURE USE.
4D                LR      A,I         ;LOAD POINTER TO FIRST OPERAND.
0B                LR      IS,A        ;LOAD POINTER INTO ISAR.
4C                LR      A,S         ;LOAD FIRST OPERAND.
18                COM                 ;START SUBTRACT OPERATION.
DA                ASD     R10         ;ADD IN PRELOAD VALUE.
5A                LR      R10,A       ;STORE TEMPORARILY.
4B                LR      A,R11       ;LOAD POINTER TO SECOND OPERAND.
0B                LR      IS,A        ;LOAD ISAR WITH POINTER.
4A                LR      A,R10       ;RETRIEVE DATA STORED TEMPORARILY.
88                AM                  ;PREPARE FOR DECIMAL ADDITION.
89                AMD                 ;ADD IN ONE FOR CORRECT NOTATION.
5A                LR      R10,A       ;STORE TEMPORARILY.
2099              LI      99H         ;LOAD PRELOAD VALUE.
19                LNK                 ;ADD IN CARRY, IF ANY.
5B                LR      R11,A       ;STORE PRELOAD VALUE.
4A                LR      A,R10       ;RETRIEVE DATA STORED TEMPORARILY.
88                AM                  ;PREPARE FOR DECIMAL ADDITION.
DC                ASD     S           ;ADD IN STORED VALUE.
5A                LR      R10,A       ;STORE RESULT TEMPORARILY.
4B                LR      A,R11       ;RETRIEVE PRELOAD VALUE.
19                LNK                 ;ADD IN CARRY, IF ANY.
67         SUB1   LISU    BUFF6       ;LOAD POINTER TO GENERAL PURPOSE BUFFER
68                LISL    ZERO        ;POINTER POINTS TO PRELOAD VALUE.
5D                LR      I,A         ;STORE PRELOAD VALUE IN BUFFER.
6B                LISL    THREE       ;POINTER POINTS TO RESULT POINTER.
4C                LR      A,S         ;LOAD POINTER TO RESULT STORAGE.
0B                LR      IS,A        ;LOAD POINTER INTO ISAR.
4A                LR      A,R10       ;RETRIEVE RESULT.
5D                LR      I,A         ;STORE IN BUFFER.
0A                LR      A,IS        ;LOAD VALUE OF POINTER TO RESULT STORAGE.
6B                LISL    THREE       ;POINTER POINTS TO RESULT POINTER
5E                LR      D,A         ;STORE IN BUFFER.
0C                PK                  ;RETURN.
;
;       THIS TABLE IS USED TO MAKE DECIMAL OPERATIONS, SUBTRACTION AND
;ADDITION, EASIER AND LESS REGISTER INTENSIVE.
;
660166     ONED   BYTE    66H,01H,66H
;
;
NAME       UNSTAK
SECTION UNSTAK
;
;
;       THIS ROUTINE IS USED TO OVERCOME THE LIMITATIONS OF THE 3870
;THE RETURN ADDRESS, STORED BY * STACK * , IS RECOVERED AND PROPERLY
;POSITIONED FOR USE BY THIS ROUTINE.  DATA IS RECOVERED FROM THE
;TO LAST RAM BUFFER.  ONLY ONE DISTINCT RETURN ADDRESS MAY BE
;
66                LISU    BUFF5       ;LOAD POINTER TO CONDITION BUFFER AREA.
6D                LISL    FIVE        ;POINTER POINTS TO STACK STORAGE.
4E                LR      A,D         ;LOAD LOWER BYTE.
05                LR      KL,A        ;STORE IN K REGISTER.
4E                LR      A,D         ;LOAD UPPER BYTE.
04                LR      KU,A        ;STORE IN K REGISTER.
67                LISU    BUFF6       ;LOAD POINTER TO GENERAL PURPOSE BUFFER
69                LISL    ONE         ;POINTER POINTS TO FIRST LOCATION.
0C                PK                  ;DOUBLE RETURN.
```

```
         NAME    UPDIS;
         SECTION UPDIS
         GLOBAL  RFDIS,FIDPT,DECSEG,STACK,UNSTAK
         ;
         ;        THIS ROUTINE SERVES, PRIMARILY, AS A CALL TABLE USED TO UPDATE
         ;INFORMATION IN THE DISPLAY BUFFERS.  DATA IS NOT PASSED INTO THIS
         ;ROUTINE DIRECTLY, BUT IS PASSED INTO CALLED ROUTINES. THEREFORE
         ;SOME INITIAL SETUP IS REQUIRED BEFORE CALLING THIS ROUTINE.
         ;
08                       LR      K,P             ;SAVE RETURN ADDRESS.
280702                   PI      STACK           ;PUT RETURN ADDRESS ONTO STACK.
2806CA                   PI      RFDIS           ;PREPARE DATA FOR FIDPT USE.
2803EA                   PI      FIDPT           ;LOCATE DECIMA POINT.
28006B                   PI      DECSEG          ;CONVERT DATA TO DISPLAY FORMAT.
280739                   PI      UNSTAK          ;RETRIEVE RETURN ADDRESS AND RETURN.
         ;
         NAME    WRITE;
         SECTION WRITE
         ;
         ;        THIS ROUTINE WRITES ONE BYTE OF DATA INTO A SPECIFIED EAROM
         ;THE DATA IS PASSED IN REGISTER 0B, AND THE ADDRESS TO WRITE TOO IS
         ;PASSED IN REGISTER 0A.
         ;
08                       LR      K,P             ;SAVE RETURN ADDRESS.
76                       LIS     06H             ;TURN OFF DIGITS.
B4                       OUTS    4               ;DIGITS OFF.
20BF                     LI      0BFH            ;LOAD READ MODE AND ZERO ADDRESS.
EA                       XS      R10             ;APPEND ADDRESS.
51                       LR      R1,A            ;LOAD BUFFER.
B5                       OUTS    5               ;OUTPUT ADDRESS.
23C0                     XI      0C0H            ;SET C2.
51                       LR      R1,A            ;LOAD BUFFER.
B5                       OUTS    5               ;OUTPUT MODE SELECT.
73                       LIS     03H             ;LOAD ERASE CYCLE TIMER (116.9 MSEC).
54                       LR      R4,A            ;TIMER LOADED.
1B                       EI                      ;ENABLE TIMER.
44              WRT1     LR      A,R4            ;CHECK TIMER.
2500                     CI      00H             ;ZERO?
94FC                     BNZ     WRT1            ;NOT YET.
1A                       DI                      ;DISABLE INTERRUPTS.
4B                       LR      A,R11           ;LOAD DATA TO BE WRITTEN INTO EAROM.
18                       COM                     ;ALLOW FOR PORT INVERSION.
B1                       OUTS    1               ;DATA ON DATA BUS.
41                       LR      A,R1            ;LOAD CURRENT VALUE OF PORT 5.
2380                     XI      80H             ;SET C1 & C2 TO WRITE MODE.
51                       LR      R1,A            ;LOAD BUFFER.
B5                       OUTS    5               ;WRITE MODE STARTED.
73                       LIS     03H             ;LOAD WRITE CYCLE TIMER (116.9 MSEC).
54                       LR      R4,A            ;TIMER LOADED.
1B                       EI                      ;ENABLE INTERRUPTS.
44              WRT2     LR      A,R4            ;CHECK TIMER.
2500                     CI      00H             ;ZERO?
94FC                     BNZ     WRT2            ;NOT YET.
1A                       DI                      ;DISABLE TIMER.
41                       LR      A,R1            ;LOAD CURRENT VALUE OF PORT 5.
21BF                     NI      0BFH            ;SET C1 & C2 TO READ MODE.
51                       LR      R1,A            ;LOAD BUFFER.
B5                       OUTS    5               ;OUTPUT MODE DATA.
0C                       PK                      ;RETURN.
         ;
         NAME    WRLOAD
         SECTION WRLOAD
         ;
         ;        THIS ROUTINE TAKES DATA OUTPUTTED FROM THE   * FIDPT *  ROUTINE
         ;FORMATS IT FOR USE IN THE  * WRVAL *  ROUTINE.
         ;
67                       LISU    BUFF6           ;LOAD GENERAL PURPOSE BUFFER POINTER.
68                       LISL    ZERO            ;POINTER POINTS TO ADDRESS TO READ/WRITE.
```

```
02              LR      A,QU        ;LOAD FLAG ADDRESS.
5D              LR      I,A         ;STORE IN BUFFER.
4B              LR      A,R11       ;LOAD DECIMAL POINT.
5D              LR      I,A         ;STORE IN BUFFER.
03              LR      A,QL        ;LOAD UPPER TWO DIGITS.
14              SR      4           ;POSITION UPPER DIGIT.
5D              LR      I,A         ;STORE IN BUFFER.
03              LR      A,QL        ;LOAD UPPER TWO DIGITS.
210F            NI      0FH         ;MASK IN LOWER DIGIT.
5D              LR      I,A         ;STORE IN BUFFER.
4A              LR      A,R10       ;LOAD LOWER TWO DIGITS.
14              SR      4           ;POSITION UPPER DIGIT.
5D              LR      I,A         ;STORE IN BUFFER.
7F              LIS     0FH         ;LOAD LOWER TWO DIGITS.
FA              NS      R10         ;MASK IN LOWER DIGIT.
5D              LR      I,A         ;STORE IN BUFFER.
20FF            LI      0FFH        ;LOAD END-OF-DATA INDICATOR.
5D              LR      I,A         ;STORE IN BUFFER.
1C              POP                 ;RETURN.
        ;
        NAME    WRVAL
        SECTION WRVAL
        GLOBAL  READ,WRITE,ENCODE,DECODE,ERROR,STACK,UNSTAK
90E8            BR      DM14        ;NEXT DATA ITEM.
280088  DM15    PI      ERROR       ;INDICATE ERROR.
90F7            BR      DM25        ;NEXT DATA ITEM.
68      DM16    LISL    ZERO        ;POINTER POINTS TO FIRST LOCATION.
4D              LR      A,I         ;LOAD ADDRESS OF FLAG.
5A              LR      R10,A       ;STORE ADDRESS.
72              LIS     02H         ;LOAD LOOP CONTROL VALUE.
06              LR      QU,A        ;STORE LOOP CONTROL VALUE.
90BB            BR      WRV1        ;LOOP.
4B      WRV6    LR      A,R11       ;LOAD VALUE OF FLAG.
18              COM                 ;CHANGE FLAG.
2101            NI      01H         ;MASK OUT USELESS DATA.
5B              LR      R11,A       ;STORE FLAG VALUE.
5C              LR      S,A         ;SAVE VALUE FOR COMPARISON.
2803AC          PI      ENCODE      ;ENCODE FLAG VALUE.
280752          PI      WRITE       ;WRITE FLAG VALUE.
70              CLR                 ;LOAD LOOP CONTROL VALUE.
06              LR      QU,A        ;STORE LOOP CONTROL VALUE.
90AB            BR      WRV1        ;LOOP.
4C      WRV7    LR      A,S         ;LOAD VALUE WRITTEN.
EB              XS      R11         ;COMPARE WITH VALUE READ.
8404            BZ      WRV3        ;NO ERROR.  CONTINUE.
280088          PI      ERROR       ;INDICATE ERROR.
2C      WRV3    XDC                 ;RESTORE PREVIOUS DATA COUNTER VALUE.
280739          PI      UNSTAK      ;RETRIEVE RETURN ADDRESS AND RETURN.
```

What is claimed is:

1. A register for monitoring electrical-power demand made upon alternating current mains, comprising:
   (a) means, responsive to power consumed from said mains, for computing values of electrical-power demand over a succession of demand-monitoring intervals, said computing means including:
      (i) sensing means for providing pulses at a rate substantially proportional to consumption of electrical energy in said mains, said pulse rate being electrically programmable;
      (ii) means for defining said succession of demand-monitoring intervals;
      (iii) means, responsive to said sensing means and said defining means, for accumulating said pulses generated during each said demand-monitoring interval; and
      (iv) means, responsive to said accumulating means, for generating said demand-monitoring interval values of electrical-power demand;
   (b) means, responsive to said computing means, for determining a maximum demand-monitoring interval value of the electrical-power demand; and
   (c) nonvolatile read/write memory means, responsive to said determining means, for storing said maximum demand-monitoring interval value even when said memory means is deenergized.

2. A register for monitoring electrical-power demand made upon alternating current mains, comprising:
   (a) means, responsive to power consumed from said mains, for computing values of electrical-power demand over a succession of demand-monitoring intervals, said computing means including:
      (i) sensing means for providing pulses at a rate substantially proportional to consumption of electrical energy in said mains;
      (ii) means for defining said succession of demand-monitoring intervals;
      (iii) means, responsive to said sensing means and said defining means, for accumulating said pulses generated during each said demand-monitoring interval; and (iv) means, responsive to said accumulating means, for generating said demand-monitoring interval values of electrical-power demand;

(b) means, responsive to said computing means, for determining a maximum demand-monitoring interval value of the electrical-power demand;

(c) pulse initiator means, responsive to said generating means, for providing energy output pulses at a rate related to said computed values of electrical-power demand; and (d) nonvolatile read/write memory means, responsive to said determining means, for storing said maximum demand-monitoring interval value even when said memory means is deenergized.

3. The register as recited in claim 2, further comprising means, responsive to said pulse-initiator means, for electrically programming said rate of energy output pulses.

4. A register for monitoring electrical-power demand made upon alternating current mains, comprising:

(a) means, responsive to power consumed from said mains, for computing values of electrical-power demand over a succession of demand-monitoring intervals;

(b) means, responsive to said computing means, for determining a maximum demand-monitoring interval value of the electrical-power demand;

(c) means, responsive to said demand interval determining means, for encoding said maximum demand-monitoring interval value in accordance with an error-detecting and error-correcting code;

(d) nonvolatile read/write memory means, responsive to said encoding means, for storing said encoded maximum demand-monitoring interval value even when said memory means is deenergized;

(e) means, coupled to said storing means, for decoding said encoded maximum demand-monitoring interval value;

(f) means, responsive to said decoding means, for producing an error indication when said encoded maximum demand-monitoring interval value contains a particular error; and (g) means, responsive to said error indicating means, for disabling said computing means in response to said error indication.

5. The register as recited in claim 4, further comprising means, responsive to said error indicating means, for visually displaying said error indication.

6. A register for monitoring electrical-power demand made upon alternating current mains, comprising:

(a) means, responsive to power consumed from said mains, for computing values of electrical-power demand over a succession of demand-monitoring intervals;

(b) means, responsive to said computing means, for determining a maximum demand-monitoring interval value of the electrical-power demand, said maximum demand-monitoring interval value being encoded as a set of digital data bits;

(c) means, responsive to said demand interval determining means, for encoding said maximum demand-monitoring interval value in accordance with an error-detecting and error-correcting code;

(d) nonvolatile read/write memory means, responsive to said encoding means, for storing said encoded maximum demand-monitoring interval value even when said memory means is deenergized; and (e) means, coupled to said storing means, for decoding said encoded maximum demand-monitoring interval value in accordance with said error-detecting and error-correcting code and for detecting any double-bit error contained in said encoded set of digital data bits.

7. The register as recited in claim 4 or 6, wherein said error-detecting and error-correcting code comprises a Hamming code.

8. The register as recited in claim 7, wherein said Hamming code comprises an eight-bit Hamming code.

9. The register as recited in claim 6, wherein said decoding means detects any single-bit error contained in said encoded set of digital data bits.

10. The register as recited in claim 6, wherein said decoding means corrects any single-bit error contained in said stored set of digital data bits.

11. The register as recited in claim 6, wherein said decoding means detects a particular multiple-bit error contained in said stored set of digital data bits.

12. The register as recited in claim 6, further comprising means, responsive to said decoding means, for generating an error indication when said stored set of digital data bits contain said double-bit error or said particular multiple-bit error.

13. The register as recited in claim 12, further comprising disabling means, responsive to said error indicating means, for disabling said computing means in response to said error indication.

14. The register as recited in claim 12, further comprising display means, responsive to said error indicating means, for visually displaying said error indication.

15. A register for monitoring electrical-power demand made upon alternating current mains, comprising:

(a) means, responsive to power consumed from said mains, for computing values of electrical-power demand over a succession of demand-monitoring intervals, said computing means including:

(i) sensing means for providing pulses at a rate substantially proportional to consumption of electrical energy in said mains;

(ii) means for defining said succession of demand-monitoring intervals in accordance with the frequency of the alternating-current mains;

(iii) means, responsive to said sensing means and said defining means, for accumulating said pulses generated during each said demand-monitoring interval; and (iv) means, responsive to said accumulating means, for generating said demand-monitoring interval values of electrical-power demand;

(b) means, responsive to said computing means, for determining a maximum demand-monitoring interval value of the electrical-power demand; and (c) nonvolatile read/write memory means, responsive to said determining means, for storing said maximum demand-monitoring interval value even when said memory means is deenergized.

16. The register as recited in anyone of claims 1, 2 or 15, further including display means, responsive to said generating means, for visually displaying said maximum demand-monitoring interval value.

17. The register as recited in claim 16, wherein said display means further comprises threshold means for causing said maximum demand-monitoring interval value to be displayed only when the level of ambient light adjacent to said threshold means exceeds a preselected threshold value.

18. The register as recited in anyone of claims 1, 2 or 15, further comprising keyer means, responsive to said interval defining means, for generating and end-of-interval pulse after each demand-monitoring interval.

19. The register as recited in anyone of claims 1, 2 or 15, further including means, responsive to said defining means, for electrically programming the time duration of said demand-monitoring intervals.

20. A register for monitoring electrical-power demand made upon alternating current mains, comprising:
(a) means, responsive to power consumed from said mains, for computing values of electrical-power demand over a succession of demand-monitoring intervals;
(b) means, responsive to said computing means, for determining a maximum demand-monitoring interval value of the electrical-power demand;
(c) reset means for generating successive reset indications;
(d) first means, responsive to said determining means and said reset means, for determining a current maximum demand-monitoring interval value of the electrical-power demand occurring subsequent to the most recent of said successive reset indications;
(e) means, responsive to said first means, for encoding each said current maximum demand-monitoring interval value in accordance with an error-detecting and error-correcting code;
(f) nonvolatile read/write memory means, responsive to said encoding means, for storing said encoded maximum demand-monitoring interval value even when said memory means is deenergized; and
(g) addressing means, responsive to said encoding means, for causing said storing means to store only said encoded current maximum demand-monitoring interval value determined since said most recent of said successive reset indications.

21. The register as recited in claim 20, further comprising decoding means, coupled to said storing means, for decoding said most recent value of said encoded current maximum demand-monitoring interval value.

22. The register as recited in claim 21, further comprising means, responsive to said decoding means, for producing an error indication when the most recent value of said encoded current maximum demand-monitoring interval value contains a particular error.

23. The register as recited in claim 22, further comprising disabling means, responsive to said error indicating means, for disabling said computing means in response to said error indication.

24. The register as recited in claim 22, further comprising display means, responsive to said error indicating means, for displaying visually said error indication.

25. A register for monitoring electrical-power demand made upon alternating current mains, comprising:
(a) means, responsive to power consumed from said mains, for computing values of electrical-power demand over a succession of demand-monitoring intervals;
(b) means, responsive to said computing means, for determining a maximum demand-monitoring interval value of the electrical-power demand;
(c) reset means for generating successive reset indications;
(d) first means, responsive to said determining means and said reset means, for determining a maximum billing period value of the electrical-power demand occurring between each pair of successive reset indications;
(e) means, responsive to said first means, for calculating a running sum equal to the summation of the maximum billing period values;
(f) encoding means, responsive to said running sum means, for encoding said running sum in accordance with an error-detecting and error-correcting code;
(g) nonvolatile read/write memory means, responsive to said encoding means, for storing said encoded running sum even when said memory means is deenergized; and
(h) addressing means, responsive to said encoding means, for causing said storing means to store only the most recent value of said encoded running sum.

26. The register as recited in claim 25, further comprising decoding menas, coupled to said storing means, for decoding the most recent value of said encoded running sum.

27. The register as recited in claim 26, further comprising means, responsive to said decoding means, for producing an error indication when the most recent value of said encoded running sum contains a particular error.

28. The register as recited in claim 27, further comprising disabling means, responsive to said error indicating means, for disabling said computing means in response to said error indication.

29. The register as recited in claim 27, further comprising display means, responsive to said error indicating means, for displaying visually said error indication.

30. The register as recited in claim 25, further comprising a display means, responsive to said running sum means, for displaying the most recent value of said running sum.

31. A register for monitoring electrical-power demand made upon alternating current mains, comprising:
(a) means, responsive to power consumed from said mains, for computing values of electrical-power demand over a succession of demand-monitoring intervals;
(b) means, responsive to said computing means, for determining a maximum demand-monitoring interval value of the electrical-power demand;
(c) reset means for generating successive reset indications;
(d) first means, responsive to said determining means and said reset means, for determining a maximum billing period value of the electrical-power demand occurring between each pair of successive reset indications;
(e) second means, responsive to said determining means and said reset means, for determining a current maximum demand-monitoring interval value of the electrical-power demandd occurring subsequent to the most recent of said successive reset indications;
(f) means, responsive to said first and second means, for calculating a running sum equal to the summation of each said maximum billing period values and said current maximum demand-monitoring interval value;
(g) means, responsive to said running sum means, for encoding said running sum in accordance with an error-detecting and error-correcting code;
(h) nonvolatile read/write memory means, responsive to said encoding means, for storing said encoded running sum even when said memory means is deenergized; and (i) addressing means, responsive to said encoding means, for causing said storing means to store only the most recent value of said encoded running sum.

32. The register as recited in claim 31, further comprising means, coupled to said storing means, for decoding the most recent value of said encoded running sum.

33. The register as recited in claim 32, further comprising means, responsive to said decoding means, for producing an error indication when the most recent value of said encoded running sum contains a particular error.

34. The register as recited in claim 33, further comprising means, responsive to said error indicating means, for disabling said computing means in response to said error indication.

35. The register as recited in claim 33, further comprising means, responsive to said error indicating means, for visually displaying said error indication.

36. The register as recited in claim 31, further comprising means, responsive to said running sum means, for displaying the most recent value of said running sum.

37. The register as recited in claim 20, 25 or 31 further comprising means, coupled to said first means, for electrically programming a mode constant for enabling said first means.

38. The register as recited in claim 37, further comprising first encoding means, responsive to said programming means, for encoding said mode constant in accordance with said error-detecting and error-correcting code, and first addressing means, responsive to said first encoding means, for causing said storage means to store said encoded mode constant.

39. The register as recited in claim 38, further comprising first decoding means, coupled to said storing means, for decoding said encoded mode constant.

40. The register as recited in claim 39, further comprising means, responsive to said decoding means, for producing an error indication when said encoded mode constant contains a particular error.

41. The register as recited in claim 40, further comprising means, responsive to said error indicating means, for disabling said computing means in response to said error indication.

42. The register as recited in claim 40, further comprising means, responsive to said error indicating means, for visually displaying said error indication.

43. A register for monitoring power demand made upon alternating current mains, comprising:
(a) first pulse generating means, responsive to power consumed from said mains, for generating first pulses at a rate substantially proportional to consumption of electrical energy from said mains;
(b) second pulse generating means for generating second pulses at a rate in accordance with the frequency of the alternating-current mains;
(c) microprocessor means, coupled to said first and second pulse-generating means, for defining successive demand-monitoring intervals, for calculating a numerical value indicative of the power demand made during each successive demand-monitoring interval, and for determining a maximum numerical value indicative of the power demand;
(d) pulse-initiator means, coupled to said microprocessor means, for providing energy pulses at a rate proportional to each of said numerical values; and
(e) nonvolatile read/write memory means, coupled to said microprocessor means, for storing, even when deenergized, said maximum numerical value.

44. The register as recited in claim 43, further comprising programming means, coupled to said microprocessor means, for programming the time duration of said demand-monitoring intervals and for programming said rate at which said pulse-initiator means provides said energy pulses.

45. A register for monitoring power demand made upon alternating current mains, comprising:
(a) first pulse generating means, responsive to power consumed from said mains, for generating first pulses at a rate substantially proportional to consumption of electrical energy from said mains;
(b) second pulse generating means for generating second pulses at a rate in accordance with the frequency of the alternating-current mains;
(c) microprocessor means, coupled to said first and second pulse-generating means, for defining successive demand-monitoring intervals, for calculating a numerical value indicative of the power demand made during each successive demand-monitoring interval, for determining a maximum numerical value indicative of the power demand and for encoding said maximum numerical value in accordance with an error-detecting and error-correcting code; and
(d) nonvolatile read/write memory means, coupled to said microprocessor means, for storing, even when deenergized, said encoded maximum numerical value.

46. The register as recited in claim 43 or 45, wherein said nonvolatile memory means comprises an electrically alterable, read-only memory.

47. The register as recited in claim 43 or 45, further comprising means, coupled to said microprocessor means, for visually displaying said maximum numerical value.

48. The register as recited in claim 47, wherein said display means further comprises threshold means for causing said maximum numerical value to be displayed only when the level of ambient light adjacent to said threshold means exceeds a preselected threshold value.

49. The register as recited in claim 43 or 45, wherein said maximum numerical value is stored in said nonvolatile read/write memory means as a set of binary data bits.

50. The register as recited in claim 43 or 45, further comprising keyer means, coupled to said microprocessor means, for generating an end-of-interval pulse after each demand-monitoring interval.

51. The register as recited in claim 45, wherein said error-detecting and error-correcting code comprises a Hamming code.

52. The register as recited in claim 51, wherein said Hamming code comprises an eight-bit Hamming code.

53. The register as recited in claim 45 wherein said microprocessor means further comprises means, responsive to said retrieving means, for decoding in accordance with said error-detecting and error-correcting code said stored encoded maximum numerical value retrieved from said nonvolatile read/write memory means.

54. The register as recited in claim 53, wherein said microprocessor means further comprises means, responsive to said decoding means, for detecting a particular error contained in said decoded maximum numerical value.

55. The register as recited in claim 54, wherein said detecting means detects any single-bit error contained in said decoded maximum numerical value.

56. The register as recited in claim 54, wherein said microprocessor means further comprises means, responsive to said detecting means, for correcting any single-bit error contained in said decoded maximum numerical value.

57. The register as recited in claim 54, wherein said detecting means detects any double-bit error contained in said decoded maximum numerical value.

58. The register as recited in claim 54, wherein said detecting means detects a particular multiple-bit error contained in said decoded maximum numerical value.

59. A method of monitoring electrical-power demand made upon alternating-current mains, comprising the steps of:
   (a) measuring electrical energy consumed from said mains;
   (b) computing values of electrical-power demand from said measured electrical energy over a succession of time intervals;
   (c) determining a maximum value of electrical-power demand from said computed values;
   (d) encoding said maximum value in accordance with an error-detecting and error-correcting code;
   (e) storing said encoded maximum value in a nonvolatile read/write memory means which, even when deenergized, retains said encoded maximum value;
   (f) retrieving said stored encoded maximum value from said nonvolatile read/write memory means;
   (g) decoding in accordance with said error-detecting and error-correcting code said retrieved, stored encoded maximum value to produce a decoded maximum value;
   (h) producing an error indication when said decoded maximum value contains a particular error; and
   (i) preventing the execution of step (b) in response to said error indication of step (h).

60. The method of monitoring as recited in claim 59, wherein step (d) comprises the step of:
   (i) encoding said maximum value in accordance with a Hamming error-detecting and error-correcting code.

61. The method of monitoring as recited in claim 60, wherein step (g) comprises the step of:
   (ii) decoding in accordance with said Hamming error-detecting and error-correcting code said retrieved stored encoded maximum value to produce a decoded maximum value.

62. The method of monitoring as recited in claim 59, further comprising the step of:
   (i) visually displaying said error indication.

63. A method of monitoring electrical-power demand made upon alternating-current mains, comprising the steps of:
   (a) measuring electrical energy consumed from said mains;
   (b) computing values of electrical-power demand from said measured electrical energy over a succession of time intervals;
   (c) determining a maximum value of electrical-power demand from said computed values;
   (d) encoding said maximum value in accordance with an error-detecting and error-correcting code;
   (e) storing said encoded maximum value in a nonvolatile read/write memory means which, even when deenergized, retains said encoded maximum value;
   (f) retrieving from said nonvolatile read/write memory means of step (e) said stored encoded maximum value in the form of a set of data bits;
   (g) decoding said set of data bits in accordance with said error-detecting and error-correcting code;
   (h) detecting whether said decoded set of data bits contains a particular error;
   (i) determining, if a particular error has been detected, whether said particular error is a single-bit error, a double-bit error, or a multiple-bit error;
   (j) correcting, if said particular error is a single-bit error, said single-bit error in accordance with said error-detecting and error-correcting code;
   (k) generating, if said particular error is a double-bit or multiple-bit error, an error indication; and
   (l) visually displaying said error indication of step (k).

64. The method as recited in claim 59 or 63, wherein step (b) comprises the steps of:
   (i) generating pulses at a rate substantially proportional to said measured consumption of electrical energy;
   (ii) defining said successive demand-monitoring intervals;
   (iii) accumulating said pulses generated during each said demand-monitoring interval; and
   (iv) calculating from said accumulated pulses said values of electrical-power demand.

65. The method of monitoring as recited in claim 59 or 63, further comprising the step of:
   (f) visually displaying said maximum value.

66. A method of monitoring electrical-power demand made upon alternating-current mains, comprising the steps of:
   (a) measuring electrical energy consumed from said mains;
   (b) generating first pulses at a rate substantially proportional to said measured consumption of electrical energy;
   (c) generating successive reset pulses;
   (d) establishing, before said generation of each successive reset pulse, successive demand-monitoring intervals;
   (e) accumulating said first pulses generated during each demand-monitoring interval;
   (f) calculating from said accumulated first pulses a value of electrical-power demand made during each of said successive demand-monitoring intervals;
   (g) determining a maximum value of said values of electrical-power demand;
   (h) encoding said maximum value in accordance with an error-detecting and error-correcting code;
   (i) storing said encoded maximum value in a nonvolatile read/write memory means, which, even when deenergized, retains said encoded maximum value;
   (j) resetting to a zero value said stored encoded maximum value upon a generation of the next successive reset pulse; and
   (k) visually displaying said maximum value of electrical power demand.

67. A method of monitoring electrical-power demand made upon alternating current mains, comprising the steps of:

(a) measuring electrical energy consumed from said mains;

(b) generating first pulses at a rate substantially proportional to said measured consumption of electrical energy;

(c) generating a succession of reset pulses;

(d) establishing successive demand-monitoring intervals;

(e) accumulating said first pulses generated during each demand-monitoring interval;

(f) calculating from said accumulated first pulses a value of electrical-power demand made during each of said successive demand-monitoring intervals;

(g) prior to the generation of the first of said reset pulses, determining a maximum value of electrical-power demand;

(h) encoding said maximum value of step (g) in accordance with an error-detecting and error-correcting code;

(i) storing said encoded maximum value of step (h) in a first location of a nonvolatile read/write memory means which, even when deenergized, retains said encoded maximum value;

(j) upon the generation of the first of said reset pulses, transferring said stored maximum value from said first location to a second location of said nonvolatile read/write memory means;

(k) upon the transfer of said stored maximum value from said first location to said second location in accordance with step (j), resetting to zero said value stored in said first location;

(l) upon the generation of each succeeding one of said reset pulses, determining a new maximum value of electrical-power demand;

(m) upon determining said new maximum value, encoding said new maximum value in accordance with said error-detecting and error-correcting code;

(n) storing said encoded new maximum value in said first location of said nonvolatile read/write memory means;

(o) upon the generation of each succeeding reset pulse, generating a sum of values equal to the summation of said maximum value and each said new maximum value for storing in said first and second locations of said nonvolatile read/write memory means;

(p) upon generating each said sum, replacing said value stored in said second location with the most recent value of said sum; and (q) upon replacing said value stored in said second location with the most recent value of said sum, resetting to zero said value stored in said first location.

68. A method of monitoring electrical-power demand made upon alternating-current mains, comprising the steps of:

(a) measuring electrical energy consumed from said mains;

(b) generating first pulses at a rate substantially proportional to said measured consumption of electrical energy;

(c) generating a succession of reset pulses;

(d) establishing successive demand-monitoring intervals;

(e) accumulating said first pulses generated during each demand-monitoring interval;

(f) calculating from said accumulated first pulses a calculated value of electrical-power demand made during each of said successive demand-monitoring intervals;

(g) prior to the generation of the first of said reset pules, and at the end of the first of said successive demand-monitoring intervals, encoding said calculated value of electrical-power demand in accordance with an error-detecting and error-correcting code;

(h) storing said encoded calculated value in a first and second location of a nonvolatile, read/write memory which, even when deenergized, retains said encoded calculated value;

(i) at the end of each successive demand-monitoring interval before the generation of the first of said reset pulses, determining whether the most recent calculated value is greater than said encoded calculated value stored in said first and second locations;

(j) if the most recent calculated value is determined to be greater than said calculated value stored in said first and second locations, determinating a difference between said most recent calculated value and said encoded calculated value stored in said first location;

(k) generating a sum equal to said difference and said encoded calculated value stored in said second location;

(l) replacing said encoded calculated value stored in said second location with said generated sum;

(m) replacing said encoded calculated value stored in said first location with said most recent calculated value determined to be greater in step (j);

(n) upon the generation of the first of said reset pulse, resetting said encoded calculated value stored in said first location to zero;

(o) before the generation of each successive reset pulse, determining whether the most recent value of said value of electrical-power demand calculated is greater than said encoded calculated value stored in said first location;

(p) if said most recent value of electrical-power demand calculated is determined to be greater than said encoded calculated value stored in said first location, generating a difference between said most recent value determined to be greater and said encoded calculated value stored in said first location;

(q) upon generating said difference, generating a sum of said difference and said encoded calculated value stored in said second location;

(r) upon generating said sum, replacing said encoded calculated value stored in said second location with said generated sum;

(s) upon replacing said encoded calculated value stored in said second location with said generated sum, replacing said encoded calculated value stored in said first location with said value determined to be greater; and (t) upon the generation of each successive reset pulse, resetting said encoded calculated value stored in said first location to zero.

69. The method recited in any one of claims 67 or 68, further comprising the step of visually displaying said maximum value of electrical power demand.

* * * * *